(12) United States Patent
Tomura et al.

(10) Patent No.: US 8,615,372 B2
(45) Date of Patent: Dec. 24, 2013

(54) STATE ESTIMATING DEVICE FOR SECONDARY BATTERY

(75) Inventors: Shuji Tomura, Nagoya (JP); Takaji Umeno, Nisshin (JP); Yasushi Amano, Aichi-ken (JP); Yuji Nishi, Nagoya (JP); Takeshi Takemoto, Nagoya (JP); Nobuyasu Haga, Seto (JP); Tetsuya Fuchimoto, Nagoya (JP)

(73) Assignees: Kabushiki Kaisha Toyota Chuo Kenkyusho, Aichi-gun (JP); Toyota Jidosha Kabushiki Kaisha, Toyota (JP)

( * ) Notice: Subject to any disclaimer, the term of this patent is extended or adjusted under 35 U.S.C. 154(b) by 488 days.

(21) Appl. No.: 13/061,008

(22) PCT Filed: Aug. 28, 2009

(86) PCT No.: PCT/JP2009/065086
§ 371 (c)(1),
(2), (4) Date: Mar. 16, 2011

(87) PCT Pub. No.: WO2010/026930
PCT Pub. Date: Mar. 11, 2010

(65) Prior Publication Data
US 2011/0161025 A1      Jun. 30, 2011

(30) Foreign Application Priority Data

Sep. 2, 2008  (JP) .................. 2008-225085

(51) Int. Cl.
*G06F 19/00*     (2011.01)
(52) U.S. Cl.
CPC .................... *G06F 19/00* (2013.01)
USPC ......................................... 702/63

(58) Field of Classification Search
USPC ................. 702/63, 64, 182–185
See application file for complete search history.

(56) References Cited

U.S. PATENT DOCUMENTS

2010/0318252 A1*  12/2010  Izumi ............................ 701/22

FOREIGN PATENT DOCUMENTS

| JP | A-2003-224901 | 8/2003 |
| JP | A-2005-037230 | 2/2005 |
| JP | A-2005-269760 | 9/2005 |
| JP | A-2008-059910 | 3/2008 |

OTHER PUBLICATIONS

International Search Report issued in Application No. PCT/JP2009/065086; Dated Dec. 1, 2009 (With Translation).

* cited by examiner

*Primary Examiner* — Edward Raymond
(74) *Attorney, Agent, or Firm* — Oliff & Berridge, PLC

(57) ABSTRACT

A battery state estimating unit estimates an internal state of a secondary battery in accordance with a battery model equation in every arithmetic cycle, and estimates a charging rate and a battery current based on a result of the estimation. A parameter estimating unit obtains a battery current measured by a sensor as well as the charging rate and the battery current estimated by the battery state estimating unit. The parameter estimating unit estimates a capacity deterioration parameter such that a rate of change in difference (estimation error) between a summed value of an actual current and a summed value of an estimated current with respect to the charging rate is minimized. A result obtained by estimating the capacity deterioration parameter is reflected in the battery model by the battery state estimating unit.

23 Claims, 27 Drawing Sheets

STATE ESTIMATING DEVICE FOR SECONDARY BATTERY

TECHNICAL FIELD

The present invention relates to a state estimating device for a secondary battery, and particularly to a state estimating device for a secondary battery according to a battery model which allows dynamic estimation of an internal state of the secondary battery.

BACKGROUND ART

There has been used a power supply system configured such that a chargeable and dischargeable secondary battery can supply power to a load and the secondary battery can be charged even during an operation of the load when necessary. Typically, this kind of power supply system is mounted on a hybrid vehicle and an electric vehicle that employ an electric motor driven by the secondary battery as a drive power source.

In this power supply system, accumulated electric power of the secondary battery is used as drive electric power for an electric motor that is a drive power source. Also, the secondary battery is charged with electric power generated by regeneration of this electric motor, electric power generated by an electric generator that generates the power according to rotation of an engine, and the like. In this kind of power supply system, a state estimating device for a secondary battery is typically required to obtain correctly a charging rate (i.e., an SOC: State Of Charge) with respect to a full charge state. More specifically, it is necessary to restrict excessive charging and discharging of the secondary battery by successively and correctly estimating the charging rate of the secondary battery even during the charging/discharging and immediately after the charging/discharging. In addition, when the state of the secondary battery gradually changes (i.e., the secondary battery is deteriorated) with the use of the secondary battery, battery parameters (internal resistance, full charge capacity, and the like) of the secondary battery change. Therefore, it is required to accurately estimate the state of the secondary battery corresponding to such change over time.

For example, Japanese Patent Laying-Open No. 2005-37230 (Patent Document 1) discloses deterioration detection device and method for detecting deterioration of a battery by comparing a difference between a measured SOC obtained from a summed value of a measured battery current and an estimated SOC obtained from a summed value of an estimated battery current, with a predetermined amount.

For example, Japanese Patent Laying-Open No. 2003-224901 (Patent Document 2) discloses a method of managing a battery capacity, including the steps of calculating an SOC of a battery from an open-circuit voltage of the battery in a non-load state; calculating a summed discharge current amount of the battery in a load state until the battery reaches the non-load state; and calculating a total real capacity of the battery based on the calculated SOC and the calculated summed discharge current amount.

For example, Japanese Patent Laying-Open No. 2005-269760 (Patent Document 3) discloses a charging battery that can improve accuracy of calculating a remaining capacity. According to this document, the charging battery includes: summed discharge amount calculating means for calculating and storing a summed discharge amount when the charging battery is in a discharge state; element data storing means for storing data of circuit elements in an equivalent circuit of the charging battery; estimated discharge characteristics calculating means for obtaining estimated discharge characteristics in accordance with a charging rate from the data in the element data storing means and a present discharge current value; charging rate calculating means for calculating a present charging rate of the charging battery in accordance with a remaining capacity of the charging battery when discharging starts and the summed amount calculated thereafter by the summed discharge amount calculating means; and discharge characteristics correcting means for calculating a ratio of a difference between a voltage value of the charging battery at the present charging rate and a voltage value thereof in a full charge state, to a difference between a voltage value obtained from the estimated discharge characteristics corresponding to the present charging rate and the voltage value of the charging battery in the full charge state, and correcting the estimated discharge characteristics in accordance with the ratio. The charging battery obtains the remaining capacity of the charging battery when discharging starts as described above, based on the corrected estimated discharge characteristics.

PRIOR ART DOCUMENTS

Patent Documents

Patent Document 1: Japanese Patent Laying-Open No. 2005-37230

Patent Document 2: Japanese Patent Laying-Open No. 2003-224901

Patent Document 3: Japanese Patent Laying-Open No. 2005-269760

SUMMARY OF THE INVENTION

Problems to be Solved by the Invention

Although Japanese Patent Laying-Open No. 2005-37230 (Patent Document 1) describes determining deterioration of the battery based on the measured SOC and the estimated SOC, it does not particularly describe a technique for calculating other types of information related to the deteriorated battery, for example, open-circuit voltage characteristics, full charge capacity, or the like.

According to the method disclosed in Japanese Patent Laying-Open No. 2003-224901 (Patent Document 2), it is necessary to measure the open-circuit voltage in the non-load state. However, in a power supply system configured to have a chargeable and dischargeable secondary battery, there may be fewer opportunities where such a non-load state occurs. Further, even when the non-load state occurs, the non-load state should continue for a long time to accurately measure the open-circuit voltage, because changes in voltage occur due to diffusion of a reaction-participating material inside the battery. For example, in the hybrid vehicle or the electric vehicle described above, it is considered that there are fewer opportunities where such a non-load state occurs, and that the non-load state continues only for a short time. Therefore, it is considered that there are fewer opportunities to estimate the battery capacity by this method in the hybrid vehicle and the electric vehicle. In addition, although the method disclosed in Japanese Patent Laying-Open No. 2003-224901 (Patent Document 2) is based on the premise that a relative capacity value of the battery is uniquely determined by the open-circuit voltage obtained after the battery is discharged, the relationship between the open-circuit voltage and the relative capacity value may change when the battery is deteriorated, and the total real capacity may not be able to be estimated correctly in that case.

The method disclosed in Japanese Patent Laying-Open No. 2005-269760 (Patent Document 3) is based on the premise that the current value during discharging is constant. However, when the load state considerably changes, the current value considerably changes, and thus, it is difficult to apply this method. For example, in the hybrid vehicle and the electric vehicle, the load state considerably changes in accordance with the traveling state of a vehicle, and the current value can also considerably change. Therefore, it is difficult to apply this method to the hybrid vehicle and the electric vehicle.

The present invention has been developed for overcoming the above problems, and an object of the invention is to provide a state estimating device for a secondary battery for estimating a state quantity of the secondary battery according to a battery model, to prevent worsening of estimation accuracy due to an influence of changes in parameter value corresponding to changes in battery state, and thereby to ensure the estimation accuracy of the battery model corresponding to changes of the battery over time.

Means for Solving the Problems

A state estimating device for a secondary battery according to the present invention includes a detecting unit, a battery state estimating unit and a parameter estimating unit. The detecting unit detects a battery voltage, a battery current and a battery temperature of the secondary battery. The battery state estimating unit is configured to successively estimate, based on a detected value of the battery temperature and a detected value of a first state quantity which is one of the battery voltage and the battery current, a charging rate of the secondary battery, an open-circuit voltage of the secondary battery and a second state quantity which is the other of the battery voltage and the battery current, in accordance with a battery model equation. The parameter estimating unit is configured to calculate an estimation error indicating a difference between a detected value and an estimated value of the second state quantity, based on the detected value and the estimated value of the second state quantity, and to estimate a predetermined parameter changing in accordance with a change in a state of the secondary battery, of a parameter group used for the battery model equation, based on the estimation error and one of the charging rate and the open-circuit voltage. The battery state estimating unit corrects a positive electrode open-circuit potential and a negative electrode open-circuit potential by reflecting an estimation result of the predetermined parameter estimated by the parameter estimating unit in the battery model equation, and estimates the open-circuit voltage based on the corrected positive electrode open-circuit potential and the corrected negative electrode open-circuit potential.

According to the above state estimating device for a secondary battery, the difference (estimation error) between the estimated value of the second state quantity estimated by the battery state estimating unit and the detected value of the second state quantity detected by the detecting unit is detected, and based on this estimation error and the charging rate, the predetermined parameter changing in accordance with a change in the state of the secondary battery, of the parameter group used for the battery model equation, is estimated. When open-circuit voltage characteristics change due to deterioration of the battery, a difference arises between an estimated value of the open-circuit voltage calculated by the battery state estimating unit and an actual open-circuit voltage of the battery. In this case, the estimation error also occurs between the estimated value of the second state quantity estimated by the battery state estimating unit and the detected value of the second state quantity detected by the detecting unit. The positive electrode open-circuit potential and the negative electrode open-circuit potential are corrected by correcting the predetermined parameter applied to the battery model based on the estimation error and the charging rate. Therefore, the open-circuit voltage characteristics by the battery model can be corrected. As a result, the open-circuit voltage characteristics that have changed due to deterioration of the secondary battery can be accurately estimated.

Preferably, the parameter estimating unit estimates the predetermined parameter such that a rate of change in the estimation error with respect to the charging rate is minimized.

With such a structure, the open-circuit voltage characteristics estimated by the battery state estimating unit can be corrected to match open-circuit voltage characteristics of the actual battery. The fact that the rate of change in the estimation error with respect to the charging rate is minimum (for example, the rate of change is zero) means that the estimated value of the second state quantity estimated by the battery state estimating unit comes closest to the detected value of the second state quantity detected by the detecting unit. Therefore, by estimating the predetermined parameter such that the rate of change in the estimation error with respect to the charging rate is minimized, the open-circuit voltage characteristics can be accurately estimated.

Preferably, the first state quantity and the second state quantity are the battery voltage and the battery current, respectively. The estimation error is a difference between a summation result of the detected value of the battery current and a summation result of the estimated value of the battery current.

With such a structure, the estimated value of the battery current can be obtained by inputting the detected battery temperature and battery voltage into the battery model. From the estimated value of the battery current and the detected value of the battery current detected by the detecting unit, the difference between the summation result of the detected value of the battery current and the summation result of the estimated value of the battery current can be obtained as the estimation error of the battery state estimating unit. As a result, the open-circuit voltage characteristics that have changed due to deterioration of the secondary battery can be accurately estimated.

Preferably, the first state quantity and the second state quantity are the battery current and the battery voltage, respectively. The estimation error is a difference between the detected value of the battery voltage and the estimated value of the battery voltage.

With such a structure, the estimated value of the battery voltage can be obtained by inputting the detected battery temperature and battery current into the battery model. The difference between the estimated value of the battery voltage and the detected value of the battery voltage detected by the detecting unit can be obtained as the estimation error of the battery state estimating unit. As a result, the open-circuit voltage characteristics that have changed due to deterioration of the secondary battery can be accurately estimated.

Preferably, the parameter estimating unit estimates the predetermined parameter such that the estimation error with respect to a change in the open-circuit voltage is minimized.

With such a structure, the open-circuit voltage characteristics estimated by the battery state estimating unit can be corrected to match the open-circuit voltage characteristics of the actual battery. The fact that the estimation error with respect to the change in the open-circuit voltage is minimum (for example, the estimation error is zero) means that the estimated value of the second state quantity estimated by the battery state estimating unit comes closest to the detected value of the second state quantity detected by the detecting unit. Therefore, by estimating the predetermined parameter such that the estimation error with respect to the open-circuit voltage is minimized, the open-circuit voltage characteristics that have changed due to deterioration can be accurately estimated.

Preferably, the estimation error is a difference between an estimation result of a summed value of the battery current necessary for the open-circuit voltage to change from a first open-circuit voltage to a second open-circuit voltage and a summation result of the detected value of the battery current when the open-circuit voltage changes from the first open-circuit voltage to the second open-circuit voltage.

With such a structure, the open-circuit voltage characteristics that have changed due to deterioration can be accurately estimated. By estimating a summed current value based on the two values of the open-circuit voltage, not by summing an estimated current during changes in charging rate, a possibility of estimating a false battery current, for example, can be reduced. As a result, the battery capacity can be accurately estimated.

Preferably, the parameter estimating unit starts summation of the detected value of the battery current when an estimated value of the charging rate is within a predetermined first range and the secondary battery is in a relaxed state, and ends the summation of the detected value of the battery current when the estimated value of the charging rate is within a predetermined second range and the battery is in the relaxed state.

With such a structure, the open-circuit voltage characteristics that have changed due to deterioration can be accurately estimated. If the secondary battery is relaxed, the summation of the current value can end. Therefore, it is not necessary to continue the summation of the current value until the open-circuit voltage obtained by the battery model, for example, catches up with the actual open-circuit voltage. Thus, the estimation error caused by summation of the detection error of the current sensor does not occur easily, and thus, the estimation accuracy of the open-circuit voltage characteristics can be enhanced.

Preferably, the parameter estimating unit estimates the predetermined parameter using a bisection method.

With such a structure, a range of the predetermined parameter is obtained in advance by an experiment and the like, and an optimum value thereof can be obtained by one estimation.

Preferably, the state estimating device further includes a full charge capacity estimating unit. The full charge capacity estimating unit is configured to estimate a full charge capacity per unit plate area during a period over which the open-circuit voltage estimated by the battery state estimating unit changes from a first voltage corresponding to a complete discharge state of the secondary battery to a second voltage corresponding to a full charge state of the secondary battery. The full charge capacity estimating unit is configured to estimate a full charge capacity of the secondary battery by multiplying the estimated full charge capacity by a plate area of the secondary battery.

With such a structure, the full charge capacity of the battery changing due to deterioration can be estimated. The full charge capacity of the battery is defined by a summed current amount necessary for the open-circuit voltage of the battery to change from a voltage (for example, 3.0 V) defining complete discharge to a voltage (for example, 4.1 V) defining the full charge state. According to the state estimating device for a secondary battery of the present invention, the open-circuit voltage characteristics of the deteriorated battery can be estimated as described above. Therefore, the amount of a reaction-participating material moving from a positive electrode to a negative electrode during the change of the open-circuit voltage of the battery from the voltage defining complete discharge to the voltage defining the full charge state can be calculated using the battery model. A certain relational equation is established between the amount of charge and the amount of the reaction-participating material reacting at each electrode when the battery is charged and discharged. Therefore, by calculating the amount of charge required for full charge using this relational equation, the full charge capacity of the battery can be calculated.

Preferably, the state estimating device further includes a deterioration determining unit. The deterioration determining unit is configured to determine deterioration of a battery capacity of the secondary battery based on a difference between a full charge capacity of the secondary battery when the secondary battery is in an initial state and the estimated full charge capacity of the secondary battery.

With such a structure, the difference between the full charge capacity when the secondary battery is in the initial state (for example, when the secondary battery is new) and the present full charge capacity can be used as a degree of deterioration of the battery. Therefore, deterioration of the battery capacity of the secondary battery can be determined.

Preferably, the state estimating device further includes a deterioration determining unit. The deterioration determining unit is configured to determine deterioration of a battery capacity of the secondary battery based on a ratio between a full charge capacity of the secondary battery when the secondary battery is in an initial state and the estimated full charge capacity of the secondary battery.

With such a structure, the ratio between the full charge capacity when the secondary battery is in the initial state (for example, when the secondary battery is new) and the present full charge capacity can be used as a degree of deterioration of the battery. Therefore, deterioration of the battery capacity of the secondary battery can be determined.

Preferably, the predetermined parameter includes a maintenance rate of a single electrode capacity at a positive electrode, a maintenance rate of a single electrode capacity at a negative electrode, and a variation amount (positive and negative electrode compositions correspondence offset capacity) of a battery capacity of the secondary battery due to a change in a correspondence relationship between an average charging rate in an active material of the positive electrode and an average charging rate in an active material of the negative electrode, from an initial state.

With such a structure, deterioration of the battery capacity can be expressed on the battery model, simply by determining three parameters.

Preferably, the state estimating device further includes a storing unit configured to store open-circuit potential characteristic data that defines a relationship between a local charging rate at a surface of the active material of the positive electrode and the positive electrode open-circuit potential as well as a relationship between a local charging rate at a surface of the active material of the negative electrode and the negative electrode open-circuit potential. The battery state estimating unit corrects the local charging rates of the positive electrode and the negative electrode based on the estimation result of the predetermined parameter estimated by the parameter estimating unit, and corrects the positive electrode open-circuit potential and the negative electrode open-circuit potential based on the corrected local charging rates and the open-circuit potential characteristic data.

With such a structure, the positive electrode open-circuit potential and the negative electrode open-circuit potential can be corrected based on the estimated (corrected) predetermined parameter, that is, the maintenance rate of the single electrode capacity at the positive electrode, the maintenance rate of the single electrode capacity at the negative electrode, and the positive and negative electrode compositions correspondence offset capacity.

Preferably, the average charging rate in the active material of the positive electrode is expressed by a ratio of an average concentration of a reaction-participating material in the active material of the positive electrode to a maximum possible concentration of the reaction-participating material in the active material of the positive electrode. The average charging rate in the active material of the negative electrode is expressed by a ratio of an average concentration of the reaction-participating material in the active material of the negative electrode to a maximum possible concentration of the reaction-participating material in the active material of the negative electrode.

With such a structure, the positive electrode open-circuit potential and the negative electrode open-circuit potential when a reduction in capacity at the positive electrode and the negative electrode as well as a relative offset of the correspondence between the composition of the positive electrode and the composition of the negative electrode occur due to deterioration can be accurately estimated. As a result, changes in open-circuit voltage characteristics and a reduction in full charge capacity due to deterioration of the secondary battery can be accurately estimated.

Preferably, the battery state estimating unit estimates the open-circuit voltage based on a potential difference between the positive electrode open-circuit potential and the negative electrode open-circuit potential.

With such a structure, changes in open-circuit voltage characteristics due to deterioration of the secondary battery can be accurately estimated.

Preferably, the battery model equation is an equation representing a battery model per unit plate area.

With such a structure, the battery model equation can be generalized with respect to a design capacity of the secondary battery.

Preferably, the secondary battery is charged and discharged by a charge/discharge control device controlling an amount of charge/discharge of the secondary battery based on a present value of the charging rate and a target value of the charging rate, such that the charging rate approaches the target value. The state estimating device further includes an estimation execution determining unit and a target charging rate setting unit. The estimation execution determining unit is configured to determine whether or not an estimation execution condition for executing estimation of the state of the secondary battery by the battery state estimating unit is satisfied, and to cause the battery state estimating unit to start the estimation of the state of the secondary battery when the estimation execution determining unit determines that the estimation execution condition is satisfied. The target charging rate setting unit is configured to set the target value when the estimation execution determining unit determines that the estimation execution condition is satisfied.

With such a structure, estimation of the open-circuit voltage characteristics or the full charge capacity can be reliably executed. When the above estimation of the open-circuit voltage characteristics and the above estimation of the full charge capacity are executed, the charging rate must be changed by a sufficient width in order to accurately estimate the open-circuit voltage characteristics and the full charge capacity. Generally, however, when the secondary battery is mounted on an electric vehicle such as a hybrid vehicle and an electric vehicle, for example, the amount of charge/discharge electric power of the battery is controlled such that the charging rate of the battery approaches a predetermined control target value. As a result, it is considered that the amount of change in charging rate does not increase except when a vehicle traveling load increases. According to this structure, the charging rate can be positively changed by controlling the charging rate such that the charging rate approaches the target charging rate. As a result, an opportunity to accurately estimate the open-circuit voltage characteristics and the full charge capacity can be created.

Preferably, the estimation execution determining unit determines that the estimation execution condition is satisfied, if a time that has elapsed since the estimation of the state of the secondary battery by the battery state estimating unit ended is equal to or longer than a predetermined time period.

With such a structure, the full charge capacity can be estimated at regular time intervals, and thus, calculation of the speed of a reduction in full charge capacity due to deterioration of the secondary battery is facilitated. In addition, estimation can be executed at an appropriate frequency in accordance with the speed of deterioration of the battery. In addition, the open-circuit voltage characteristics can be estimated at an appropriate frequency. Therefore, a possibility of causing the difference between the open-circuit voltage characteristics by the battery model and the open-circuit voltage characteristics of the actual battery can be reduced.

Preferably, the charge/discharge control device includes an electric motor for causing a vehicle to travel. The estimation execution determining unit determines that the estimation execution condition is satisfied, if a traveling distance of the vehicle after the estimation of the state of the secondary battery by the battery state estimating unit ended is equal to or longer than a predetermined distance.

With such a structure, the full charge capacity can be estimated in every fixed traveling distance, and thus, calculation of the speed of a reduction in full charge capacity due to deterioration of the secondary battery is facilitated. In addition, estimation can be executed at an appropriate frequency in accordance with the speed of deterioration of the battery. In addition, the open-circuit voltage characteristics can be estimated at an appropriate frequency. Therefore, a possibility of causing the difference between the open-circuit voltage characteristics by the battery model and the open-circuit voltage characteristics of the actual battery can be reduced.

Preferably, the estimation execution determining unit obtains the charging rate and the estimation error from the battery state estimating unit, and determines that the estimation execution condition is satisfied, if the estimation error when the charging rate changes by a predetermined amount is equal to or larger than a predetermined value.

With such a structure, deterioration of the battery capacity can be reliably grasped and estimated. When the battery capacity is reduced and the open-circuit voltage characteristics change due to deterioration, a current summation estimation error during the change in charging rate by the predetermined amount also becomes large. In this case, the open-circuit voltage characteristics and the full charge capacity can be estimated, and thus, deterioration of the battery capacity can be reliably grasped and estimated.

Preferably, the target charging rate setting unit sets the target value such that the secondary battery is discharged by the charge/discharge control device.

With such a structure, when the above charging rate control (control of positively changing the charging rate) is performed over the secondary battery mounted on the electric powered vehicle such as the hybrid vehicle or the electric vehicle, the charging rate control can be performed without worsening ride quality as much as possible (in the case of the hybrid vehicle, worsening of fuel economy must be taken into consideration). When the charging rate is brought close to the target charging rate by charging the secondary battery, there is a problem that it takes time to bring the charging rate close to the target charging rate. This is because the secondary battery tends to be discharged in the vehicle traveling conditions such as the conditions for traveling in which the vehicle accelerates many times or traveling in which large vehicle power is required such as climbing a slope, for example. By bringing the charging rate close to the target value by discharging the battery and decreasing the charging rate, these problems can be avoided.

Preferably, if a full charge capacity maintenance rate, which is a ratio of a present full charge capacity to a full charge capacity when the secondary battery is in an initial state, is equal to or smaller than a predetermined value, the target charging rate setting unit sets the target value such that a change width of the charging rate is greater than that in a case where the full charge capacity maintenance rate is larger than the predetermined value.

With such a structure, the change width of the charging rate can be made sufficiently great even in the battery whose full charge capacity has decreased significantly. Therefore, the predetermined parameter used for the battery model can be accurately estimated.

Preferably, the estimation execution determining unit discontinues the estimation of the state of the secondary battery by the battery state estimating unit when charge/discharge electric power of the secondary battery exceeds a reference value.

With such a structure, the charging rate can be reliably shifted to the target value. If the charging rate control continues when the battery load is large, reliable shift of the charging rate to the target value may become difficult. In such a case, by discontinuing the charging rate control, the above problem can be avoided.

Effects of the Invention

According to the state estimating device for a secondary battery of the present invention, the estimation accuracy of the battery model corresponding to changes of the battery over time can be ensured by estimating (updating) the parameter in the battery model equation, and thus, the full charge capacity or open-circuit voltage characteristics changing with changes of the battery over time can be accurately estimated. In addition, the charging rate can be accurately estimated by using the estimated open-circuit voltage characteristics to estimate the charging rate.

MODES FOR CARRYING OUT THE INVENTION

Figure 1:
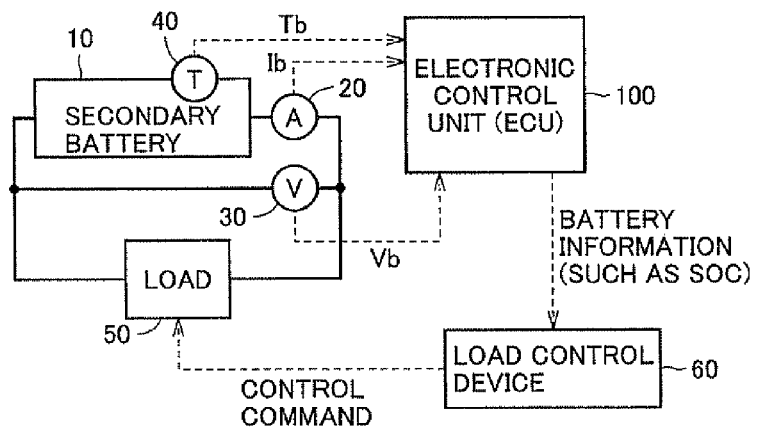
FIG. 1 is a block diagram showing a schematic structure of a power supply system that employs a state estimating device for a secondary battery according to an embodiment of the present invention and uses the secondary battery as a power supply.

Embodiments of the present invention will be described in detail hereinafter with reference to the drawings, in which identical or corresponding parts will be designated by the same reference characters, and a description thereof will not be repeated in principle.

(Whole Structure)

FIG. 1 is a block diagram showing a schematic structure of a power supply system that employs a state estimating device for a secondary battery according to an embodiment of the present invention and uses the secondary battery as a power supply.

Referring to FIG. 1, a secondary battery 10 supplies drive electric power for a load 50. Load 50 is formed of, for example, an electric motor mounted on an electric vehicle, a hybrid vehicle or the like for causing the vehicle to travel. Further, load 50 charges secondary battery 10 by regenerative power of the electric motor. Secondary battery 10 is typically formed of a lithium-ion battery.

Secondary battery 10 is provided with a current sensor 20 for measuring a battery current, a voltage sensor 30 for measuring a battery voltage, and a temperature sensor 40 for measuring a battery temperature. In the following description, values measured by current sensor 20, voltage sensor 30, and temperature sensor 40 are expressed as "battery current Ib," "battery voltage Vb," and "battery temperature Tb," respectively.

Battery current Ib, battery voltage Vb, and battery temperature Tb measured by respective sensors 20, 30 and 40 are provided to an Electronic Control Unit (ECU) 100.

ECU 100 corresponding to the state estimating device for a secondary battery according to the embodiment of the present invention includes a microprocessor, a memory, an A/D converter, a D/A converter, and the like which are not shown, and is configured to execute a predetermined program prestored in the memory, and thereby execute predetermined arithmetic processing using input signals and data provided from sensors and the like, and produce an output signal and data based on a result of the arithmetic processing. In the present embodiment, ECU 100 dynamically estimates an internal state of secondary battery 10 according to a battery model described later, based on battery data detected by current sensor 20, voltage sensor 30, and temperature sensor 40 (i.e., battery data collectively representing Tb, Vb and Tb), and estimates a charging rate (an SOC). Further, ECU 100 estimates and learns a full charge capacity and open-circuit voltage characteristics of secondary battery 10 changing with deterioration of secondary battery 10 over time, by executing estimation processing described later. ECU 100 estimates a battery deterioration degree defined as a reduction rate or a reduction amount of the full charge capacity using the estimated full charge capacity, and estimates the charging rate using the estimated open-circuit voltage characteristics.

Particularly, according to a battery model equation described later, ECU 100 can estimate a parameter in the battery model equation, based on the battery data during an operation of load 50 by secondary battery 10, i.e., during an actual load operation performed when load 50 is driven by power supplied from secondary battery 10 or when secondary battery 10 is charged with regenerative power provided from load 50. Therefore, when it is configured to obtain a deterioration state (a degree of deterioration) of secondary battery 10 based on this parameter estimation result, the battery deterioration degree can be estimated based on the on-line battery data when load 50 is actually driven. In other words, the battery deterioration degree can be estimated without stopping the operation of load 50, charging/discharging secondary battery 10 with a special charge/discharge pattern, or isolating secondary battery 10 from load 50 to estimate the deterioration state of the battery.

According to the present embodiment, the full charge capacity of secondary battery 10 can be estimated even when changes in SOC are relatively small, and thus, the degree of deterioration of secondary battery 10 can be accurately estimated. Since it is difficult to cause the secondary battery to attain a complete discharge state or a complete charge state in the electric vehicle or the hybrid vehicle, this point is important.

Further, in the present embodiment, by successively reflecting the parameter estimation results in the battery model, estimation accuracy of the battery model can be ensured corresponding to changes in parameter value over time. Specifically, not only the full charge capacity but also the open-circuit voltage characteristics of the battery can be accurately estimated. By using the estimated open-circuit voltage characteristics to estimate the charging rate, the charging rate can be accurately estimated even in the deteriorated battery.

ECU 100 provides battery information such as the charging rate (SOC) obtained by ECU 100, to a load control device 60. Load control device 60 generates a control command for controlling a drive state of load 50 based on the battery information. For example, when the charging rate of secondary battery 10 is lower than a predetermined lower limit value, load control device 60 produces a control command to restrict the power used by load 50. Conversely, when the charging rate of secondary battery 10 is higher than a predetermined upper limit value, load control device 60 generates a control command to suppress generation of the regenerative power by load 50. It is to be noted that load 50 and load control device 60 constitute a charge/discharge control device controlling an amount of charge/discharge of secondary battery 10.

(Description of Battery Model Equation)

A description will now be given of an example of the battery model used to estimate the state of secondary battery 10. The battery model to be described below is configured to include a nonlinear model so that internal behaviors can be dynamically estimated in view of an electrochemical reaction inside the secondary battery.

Figure 2:
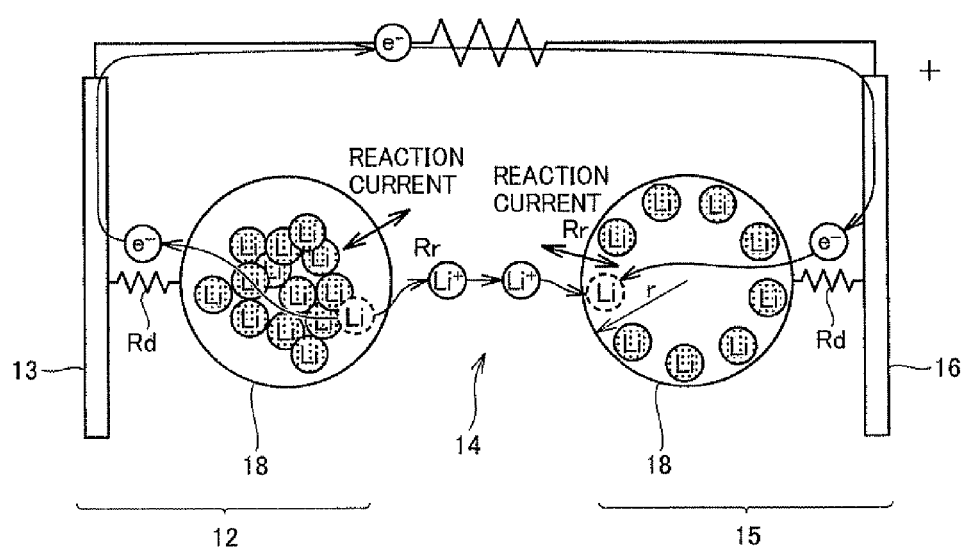
FIG. 2 is a conceptual diagram schematically illustrating an internal structure of a secondary battery 10 expressed by a battery model.

FIG. 2 is a conceptual diagram schematically illustrating an internal structure of secondary battery 10 expressed by the battery model.

Referring to FIG. 2, secondary battery 10 includes a negative electrode 12, a separator 14, and a positive electrode 15. Separator 14 is formed by impregnating a resin arranged between negative electrode 12 and positive electrode 15 with an electrolyte.

Each of negative electrode 12 and positive electrode 15 is formed of an aggregate of a spherical active material 18. When secondary battery 10 is discharged, on an interface of active material 18 of negative electrode 12, a chemical reaction of releasing lithium ions $Li^+$ and electrons $e^-$ occurs. On an interface of active material 18 of positive electrode 15, a chemical reaction of absorbing lithium ions $Li^+$ and electrons $e^-$ occurs. When secondary battery 10 is charged, reactions opposite to the above reactions occur with regard to release and absorption of electrons $e^-$.

Negative electrode 12 is provided with a current collector 13 absorbing electrons $e^-$, and positive electrode 15 is provided with a current collector 16 releasing electrons $e^-$. Current collector 13 of the negative electrode is typically made of copper, and current collector 16 of the positive electrode is typically made of aluminum. Current collector 13 is provided with a negative electrode terminal, and current collector 16 is provided with a positive electrode terminal. By transmission and reception of lithium ions $Li^+$ via separator 14, secondary battery 10 is charged or discharged to produce a charge current or a discharge current.

In other words, a charge/discharge state inside the secondary battery varies depending on a lithium concentration distribution in active material 18 of the electrodes (negative electrode 12 and positive electrode 15). The lithium corresponds to a reaction-participating material in the lithium-ion battery.

A combination of a purely electrical resistance (pure resistance) Rd with respect to movement of electrons $e^-$ in negative electrode 12 and positive electrode 15 and a charge-transfer resistance (reaction resistance) Rr equivalently acting as an electrical resistance when a reaction current occurs at the active material interface corresponds to a direct current (DC) resistance when secondary battery 10 is macroscopically viewed. This macroscopic DC resistance may also be expressed as "DC resistance $R_a$" hereinafter. Diffusion of lithium Li in active material 18 is dominated by a diffusion coefficient $D_s$.

An example of the battery model used in ECU 100 will be further described below. In the battery model equation described below, consideration is given to the fact that an influence by an electric double layer capacitor is small at a room temperature, and therefore, the battery model is configured without considering the above influence. Further, the battery model is defined as a model per unit plate area of the electrode. By using the model per unit plate area of the electrode, the model can be generalized with respect to a design capacity.

First, for a battery voltage V, i.e., an output voltage of secondary battery 10, the following equation (1) using a battery temperature T, a battery current I, an open-circuit voltage OCV, and macroscopic DC resistance $R_a$ of whole secondary battery 10 described above is established. Here, battery current I indicates a current value per unit plate area. In other words, battery current I is defined by $I=Ib/S$, where Ib indicates a battery current flowing through the positive and negative electrode terminals (a current value measurable with an ampere meter), and S indicates an area of a double-sided plate of the battery. In the following description, "current" and "estimated current value" used in connection with the battery model refer to the current per unit plate area described above, unless otherwise specified.

[equation 1]

$$V = OCV(\theta_1, \theta_2) - R_a(\theta_1, \theta_2, T) \times I \quad (1)$$
$$= U_1(\theta_1) - U_2(\theta_2) - R_a(\theta_1, \theta_2, T) \times I$$

Figure 3:
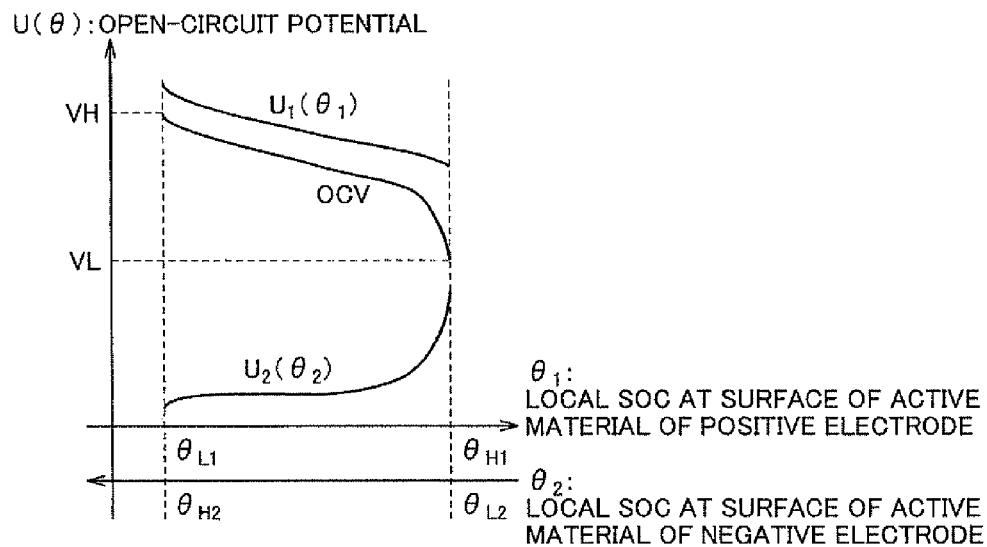
FIG. 3 is a conceptual diagram showing a structural example of a map illustrating change characteristics of an open-circuit voltage with respect to changes in local SOC.

$\theta_1$ and $\theta_2$ represent a local SOC at a surface of the active material of the positive electrode and a local SOC at a surface of the active material of the negative electrode, respectively. Open-circuit voltage OCV is represented as a potential difference between a positive electrode open-circuit potential $U_1$ and a negative electrode open-circuit potential $U_2$. As shown in FIG. 3, positive electrode open-circuit potential $U_1$ and negative electrode open-circuit potential $U_2$ have characteristics of changing depending on local SOC $\theta_1$ and local SOC $\theta_2$, respectively. Therefore, by measuring the relationship between local SOC $\theta_1$ and positive electrode open-circuit potential $U_1$ and the relationship between local SOC $\theta_2$ and negative electrode open-circuit potential $U_2$ in an initial state of secondary battery 10, it is possible to prepare a characteristic map that prestores change characteristics of positive electrode open-circuit potential $U_1$ ($\theta_1$) with respect to changes in local SOC $\theta_1$ and change characteristics of negative electrode open-circuit potential $U_2$ ($\theta_2$) with respect to changes in local SOC $\theta_2$.

In addition, DC resistance R, has characteristics of changing with changes in the local SOC ($\theta_1$), the local SOC ($\theta_2$), and battery temperature T. More specifically, DC resistance $R_a$ is represented as a function of the local SOCs ($\theta_1$, $\theta_2$) and battery temperature T. Therefore, it is possible to prepare a characteristic map (DC resistance map) that determines the value of DC resistance $R_a$ corresponding to the combination of the local SOCs ($\theta_1$, $\theta_2$) and battery temperature T, based on measurement experimental results when secondary battery 10 is in the initial state.

In each of spherical active material models of negative electrode 12 and positive electrode 15 as described above, a local SOC $\theta_i$ (i=1, 2) at the active material surface (an interface with the electrolyte) is defined by the following equation (2). In the following description, it is defined that, as with local SOC $\theta_i$, a subscript indicated by i represents the positive electrode if i is 1, and represents the negative electrode if i is 2.

[equation 2]

$$\theta_i = \frac{c_{se,i}}{c_{s,i,max}} \quad (i = 1, 2) \tag{2}$$

In the equation (2), $c_{se,i}$ indicates an average lithium concentration at the active material interface, and $c_{s,i,max}$ indicates a limit lithium concentration in the active material.

In the active material handled in the spherical model, lithium concentration $c_{s,i}$ has a radial distribution. In other words, the lithium concentration distribution in the active material that is assumed to be spherical is defined by the following equation (3) that is a diffusion equation of a polar coordinate system.

[equation 3]

$$\frac{\partial c_{s,i}}{\partial t} = D_{s,i}(T) \left[ \frac{\partial^2 c_{s,i}}{\partial r^2} + \frac{2}{r} \frac{\partial c_{s,i}}{\partial r} \right] \quad (i = 1, 2) \tag{3}$$

Figure 4:
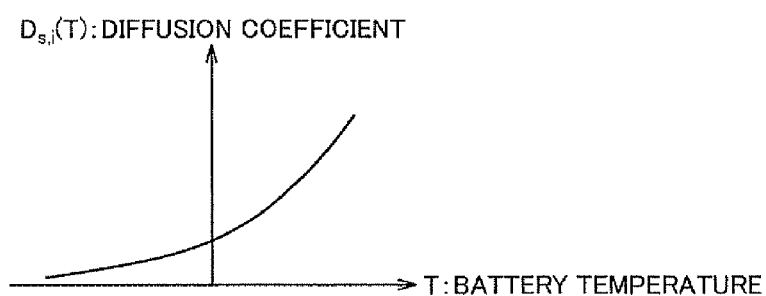
FIG. 4 is a conceptual diagram showing change characteristics of a diffusion coefficient with respect to changes in battery temperature.

In the equation (3), $D_{s,i}$ indicates a diffusion coefficient of the lithium in the active material, and has characteristics of changing depending on the battery temperature as shown in FIG. 4. For diffusion coefficient $D_{s,i}$, therefore, a characteristic map (diffusion coefficient map) that prestores change characteristics of diffusion coefficient $D_{s,i}(T)$ with respect to changes in battery temperature in accordance with the characteristics shown in FIG. 4 can be prepared based on measurement results when secondary battery 10 is in the initial state, similarly to DC resistance $R_a$ described above.

Further, a boundary condition of the diffusion equation of the equation (3) is set as expressed by the following equations (4) and (5):

[equation 4]

$$\frac{\partial c_{s,i}}{\partial r} = 0 \quad (r = 0, i = 1, 2) \tag{4}$$

$$\frac{\partial c_{s,i}}{\partial t} = \frac{\partial c_{se,i}}{\partial t} = -\frac{j_i^{Li}}{\varepsilon_{s,i} a_{s,i} F} \quad (r = r_{s,i}, i = 1, 2) \tag{5}$$

The equation (4) represents that a concentration gradient at the center of the active material is zero. The equation (5) means that changes in lithium concentration at the interface of the active material to the electrolyte are caused by entry and exit of the lithium through the active material surface.

In the equation (5), $r_{s,i}$ indicates a radius of the active material, $\varepsilon_{s,i}$ indicates a volume fraction of the active material, and $a_{s,i}$ indicates an active material surface area per unit electrode volume. These values are determined from results measured by various kinds of electrochemical measurement methods. In addition, F indicates a Faraday constant.

Further, $j_i^{Li}$ in the equation (5) indicates a lithium production quantity per unit volume and unit time. When it is assumed for the sake of simplicity that the reaction occurs uniformly in the thickness direction of the electrode, $j_i^{Li}$ is expressed by the following equation (6) using an electrode thickness $L_i$ and battery current I per unit plate area.

[equation 5]

$$I = j_2^{Li} L_2 = -j_1^{Li} L_1 \tag{6}$$

Using battery current I or battery voltage V as an input, these equations (1) to (6) are solved simultaneously. Thereby, the charging rate can be estimated by estimating the internal state of secondary battery 10 while calculating an estimated voltage value or an estimated current value.

By using this battery model, the charging rate of the secondary battery can be estimated using battery voltage V as the input. When battery voltage V is used as the input, the charging rate is calculated using a map (FIG. 6) illustrating the relationship between the average lithium concentration in the active material model and the charging rate.

Hereinafter, a description will be given first on a technique of calculating an estimated value of the charging rate (SOC) and the estimated current value of the battery, using the battery model described above, and using, as inputs, battery voltage Vb and battery temperature Tb measured by the sensors.

Figure 5:
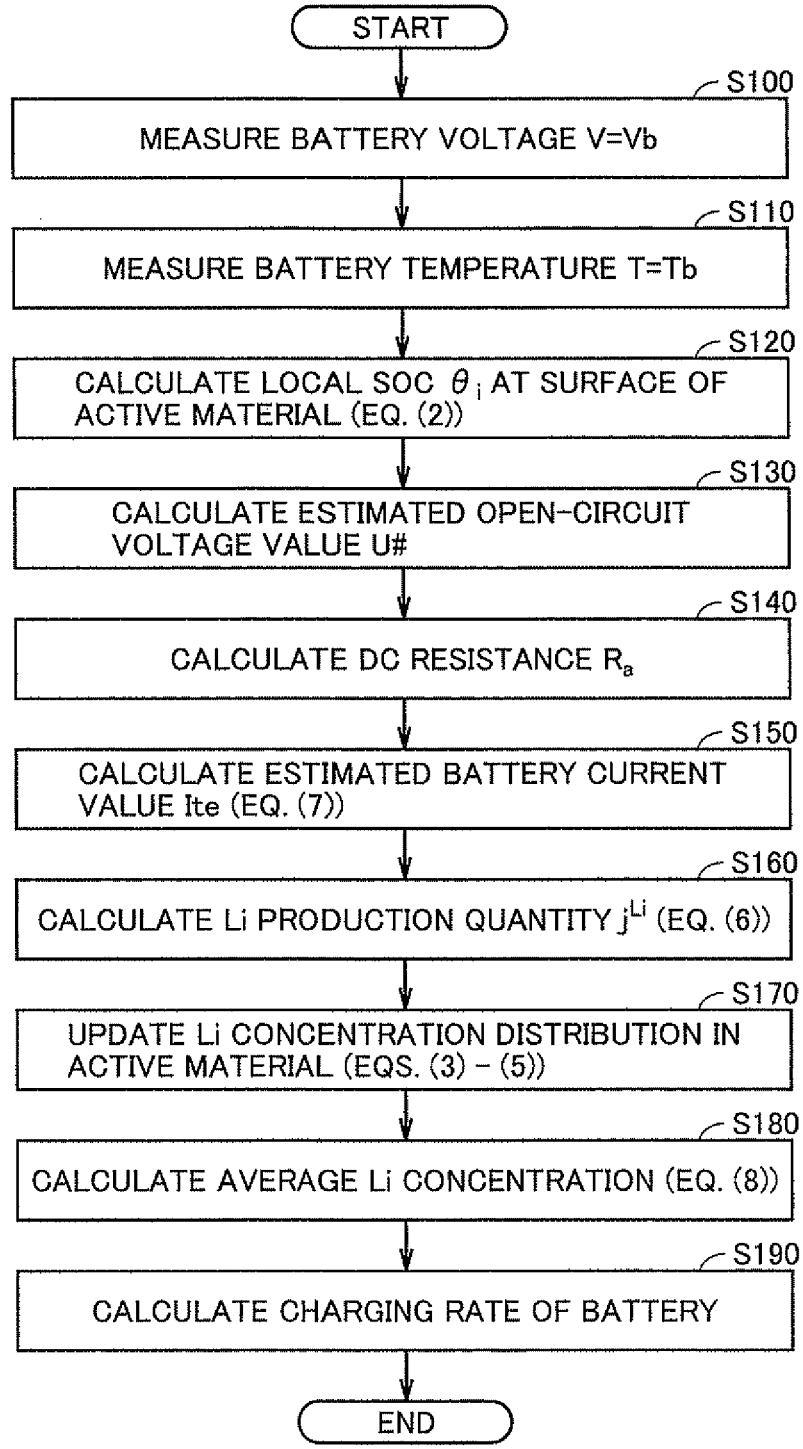
FIG. 5 is a flowchart illustrating a method of estimating a charging rate (SOC) using a battery model equation according to the embodiment of the present invention.

FIG. 5 shows a flowchart illustrating a method of estimating the charging rate (SOC) using the battery model equation according to the embodiment of the present invention. ECU 100 calls and executes the processing shown in FIG. 5 in every predetermined arithmetic cycle. It is to be noted that the flowchart in FIG. 5 illustrates the method of estimating the charging rate of the secondary battery from the battery temperature and the battery voltage without considering the influence of deterioration of the secondary battery, to make the description easy to understand.

Referring to FIG. 5, ECU 100 measures battery voltage Vb by voltage sensor 30 in step S100, and uses measured battery voltage Vb as battery voltage V in the battery model equation. Further, the ECU measures battery temperature Tb by temperature sensor 40 in step S110, and uses measured battery temperature Tb as battery temperature T in the model equation.

In step S120, ECU 100 calculates local SOC $\theta_i$ ($\theta_1$ and $\theta_2$) at the active material surface from the equation (2) based on lithium concentration distribution $c_{se,i}$ obtained in the previous arithmetic processing. Then, in step S130, ECU 100 calculates an open-circuit potential $U_i$ ($U_1$ and $U_2$) from the characteristic map of open-circuit potential $U_i$ ($\theta_i$) with respect to local SOC $\theta_i$ as shown in FIG. 3, and calculates an estimated open-circuit voltage value U# as a potential difference between calculated open-circuit potentials $U_1$ and $U_2$.

Further, in step S140, ECU 100 calculates DC resistance $R_a$ according to the prestored DC resistance map, based on calculated local SOC $\theta_i$ and measured battery temperature T. Then, in step S150, ECU 100 calculates an estimated battery current value $I_{te}$ based on the following equation (7), using measured battery voltage Vb, estimated open-circuit voltage value U# thus calculated, and DC resistance $R_a$.

[equation 6]

$$I_{te} = \frac{U\# - Vb}{R_a} \quad (7)$$

Next, in step S160, ECU 100 calculates lithium production quantity $j^{Li}$ per unit volume and unit time by substituting estimated battery current value $I_{te}$ into battery current I in the equation (6). By using this lithium production quantity $j^{Li}$ per unit volume and unit time in the boundary condition of the equation (5), the diffusion equation (3) is solved to determine the lithium concentration distribution in the active material of each of the positive and negative electrodes. Diffusion coefficient $D_{s,i}$ in the equation (3) can also be calculated based on measured battery temperature Tb, according to the diffusion coefficient map with respect to the battery temperature as shown in FIG. 4.

For solving the diffusion equation (3), ECU 100 updates a lithium concentration distribution $c_{s,i,k}(t+\Delta t)$ (where $\Delta t$ indicates a discrete time step (corresponding to an arithmetic cycle), and k indicates the number of discrete positions discretized in a radial direction) in the active material, using the diffusion equation discretized with position and time (step S170). Since the method of discretizing the diffusion equation with position and time is well known, a detailed description thereof will not be repeated here.

Next, in step S180, ECU 100 calculates an average lithium concentration $c_{save}$ in the active material according to the following equation (8):

[equation 7]

$$c_{save} = \frac{1}{N} \sum_{k=1}^{N} c_{s,k} \quad (8)$$

In the equation (8), N indicates the number of partitions when the spherical active material is radially discretized.

Figure 6:
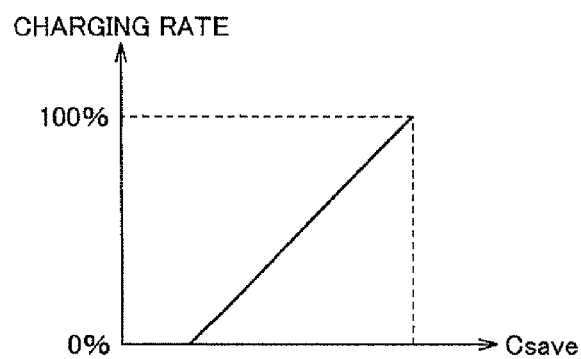
FIG. 6 is a conceptual diagram showing a structural example of a map illustrating the relationship between an average lithium concentration in an active material model and the charging rate.

In step S190, ECU 100 calculates the charging rate using the prestored map indicating the relationship between average lithium concentration $c_{save}$ in the active material and the charging rate (SOC) of secondary battery 10, as shown in FIG. 6.

As described above, ECU 100 can calculate the charging rate (SOC) of secondary battery 10, estimated open-circuit voltage value U#, and the estimated battery current value per unit plate area, from battery voltage Vb and battery temperature Tb measured by the sensors. Further, from the above definition equation of battery current I, an estimated value of a current flowing throughout the battery can be calculated by multiplying the estimated current value per unit plate area by the area of both sides of the plate of the battery.

First Embodiment

From the viewpoint of battery management, it is important to grasp the full charge capacity of the secondary battery. Further, in estimation of the SOC of the secondary battery based on the open-circuit voltage characteristics, if there arises a difference between open-circuit voltage characteristics obtained from the battery model and actual open-circuit voltage characteristics due to deterioration of the secondary battery, the SOC has an estimation error. Therefore, it is important for estimation of the state of the secondary battery to estimate changes in open-circuit voltage characteristics due to deterioration of the secondary battery, and to correct the battery model based on a result of the estimation.

The first embodiment will describe a structure in which the charging rate can be accurately estimated even when the secondary battery is deteriorated, by estimating deterioration of the capacity of the secondary battery, specifically, changes in open-circuit voltage characteristics and changes in full charge capacity of the secondary battery, and reflecting the estimated open-circuit voltage characteristics in the battery model for estimating the charging rate.

Firstly, changes in full charge capacity and changes in open-circuit voltage due to deterioration of the secondary battery will be described. It is generally known that the secondary battery deteriorates over time depending on conditions of use and a use time, and the open-circuit voltage and full charge capacity of the secondary battery change.

Figure 7:
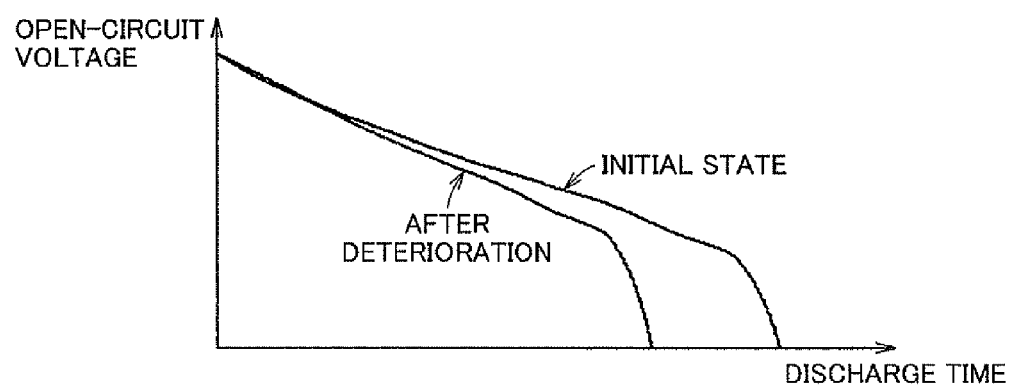
FIG. 7 is a diagram showing an example of change characteristics of the open-circuit voltage with respect to discharge time from a full charge state, when the secondary battery is in an initial state and after the secondary battery is deteriorated.

FIG. 7 is a diagram showing an example of change characteristics of the open-circuit voltage with respect to discharge time from a full charge state, when the secondary battery is in the initial state and after the secondary battery is deteriorated. Although the initial state shown in FIG. 7 typically refers to a state where the secondary battery is new, the initial state is not limited thereto, and may be defined as, for example, an intermediate state between the state where the secondary battery is new and a state where the secondary battery is maximally deteriorated.

As shown in FIG. 7, the open-circuit voltage has characteristics of decreasing as discharging proceeds. However, in the deteriorated battery, the amount of voltage drop with respect to the same discharge time is greater than that in the battery in the initial state. This indicates that deterioration of the secondary battery causes a reduction in full charge capacity and changes in open-circuit voltage characteristics. In the first embodiment, such changes in full charge capacity and open-circuit voltage characteristics associated with deterioration of the secondary battery are modeled as two phenomena considered to occur inside the deteriorated battery.

Of the two phenomena described above, one is a reduction in single electrode capacity at the positive electrode and the negative electrode, and the other is an offset of a correspondence between the composition of the positive electrode and the composition of the negative electrode. Here, the offset of the correspondence between the compositions means that there is an offset of the correspondence between average lithium concentrations $C_{save}$ in the active materials of the positive electrode and the negative electrode, or that there is an offset of the correspondence between the average charging rate of the positive electrode and the average charging rate of the negative electrode, the average charging rate being expressed as a ratio of average lithium concentration $c_{save}$ in the active material to the limit lithium concentration ($c_{s,i,max}$) in the active material.

In addition, it is defined that the relationship of a single electrode open-circuit potential with respect to each of the composition of the positive electrode and the composition of the negative electrode does not change even when the secondary battery is deteriorated. Specifically, it is defined that, in this model, the relationship between local SOC $\theta_i$ and open-circuit potential $U_i$ as shown in FIG. 3 is maintained even when the secondary battery is deteriorated.

Figure 8:
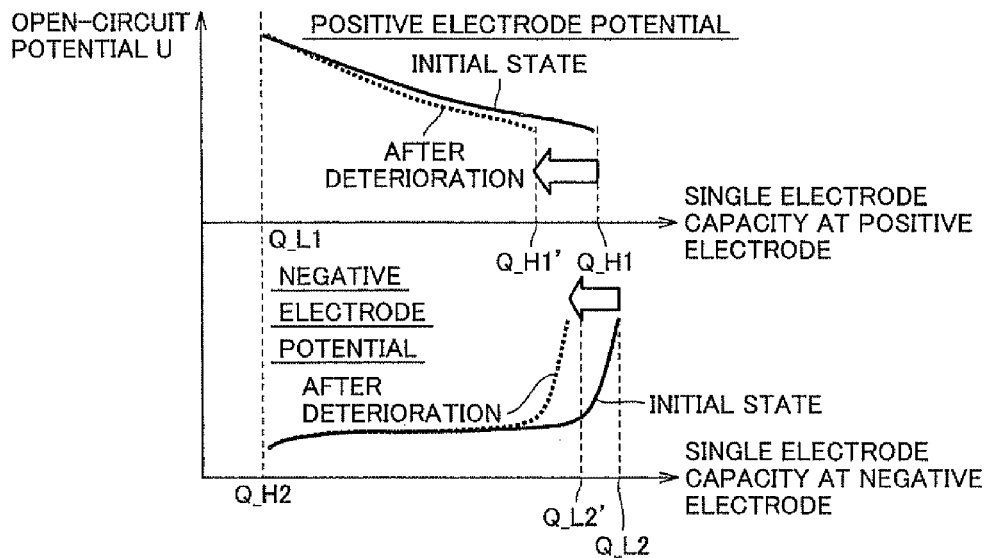
FIG. 8 is a schematic diagram showing changes in single electrode open-circuit potential associated with a reduction in single electrode capacity.

FIG. 8 is a schematic diagram showing changes in single electrode open-circuit potential associated with a reduction in single electrode capacity. Referring to FIG. 8, Q_L1 and Q_H1 on an axis of the single electrode capacity at the positive electrode indicate capacities corresponding to local SOCs $\theta_{L1}$ and $\theta_{H1}$ in FIG. 3, respectively, when the secondary battery is in the initial state. Similarly, Q_L2 and Q_H2 on an axis of the single electrode capacity at the negative electrode indicate capacities corresponding to local SOCs $\theta_{L2}$ and $\theta_{H2}$ in FIG. 3, respectively, when the secondary battery is in the initial state.

"Reduction in single electrode capacity" refers to a reduction in ability to receive lithium at each of the positive electrode and the negative electrode. This indicates a phenomenon such as a reduction and the like of the active material effectively serving for charging/discharging in each electrode. In the positive electrode, the capacity corresponding to local SOC $\theta_{H1}$ decreases from Q_H1 to Q_H1' due to the reduction in ability to receive lithium. Similarly, in the negative electrode as well, the capacity corresponding to local SOC $\theta_{L2}$ decreases from Q_L2 to Q_L2' due to the reduction in ability to receive lithium.

On the other hand, even when the secondary battery is deteriorated, the relationship between local SOC $\theta_1$ and positive electrode open-circuit potential $U_1$ does not change. Therefore, when the relationship between local SOC $\theta_1$ and positive electrode open-circuit potential $U_1$ is converted into the relationship between the single electrode capacity at the positive electrode and the positive electrode open-circuit potential, a curve indicating the relationship between the single electrode capacity at the positive electrode and the positive electrode open-circuit potential is in a so-called shrinking state in association with deterioration of the secondary battery, as shown in FIG. 8. Similarly, when the relationship between local SOC $\theta_2$ and negative electrode open-circuit potential $U_2$ is converted into the relationship between the single electrode capacity at the negative electrode and the open-circuit potential, a curve indicating the relationship between the single electrode capacity and the open-circuit potential is also in a so-called shrinking state in association with deterioration of the secondary battery.

Figure 9:
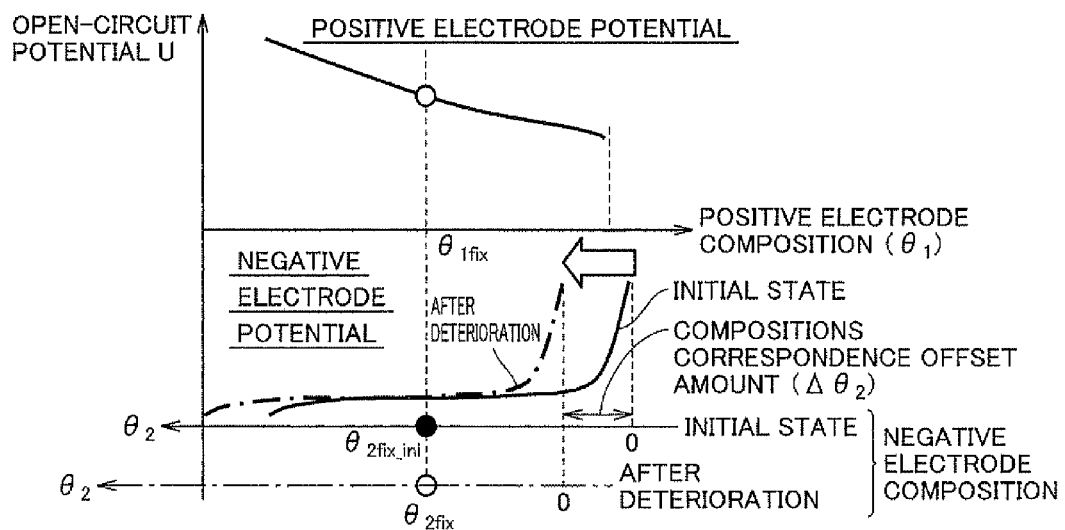
FIG. 9 is a schematic diagram showing an offset of a correspondence between a composition of a positive electrode and a composition of a negative electrode.

FIG. 9 is a schematic diagram showing an offset of the correspondence between the composition of the positive electrode and the composition of the negative electrode. Referring to FIG. 9, "offset of the correspondence between the compositions" means that, when a set of a positive electrode and a negative electrode is used as a battery, there is an offset of a combination of a composition of the positive electrode (an average charging rate in an active material of the positive electrode) and a composition of the negative electrode (an average charging rate in an active material of the negative electrode) from the combination when the secondary battery is in the initial state.

A curve indicating the relationship between composition (average charging rate in the active material) $\theta_i$ and open-circuit potential $U_i$ is similar to the curve shown in FIG. 3. However, as the secondary battery is deteriorated, a negative electrode composition axis shifts by $\Delta\theta_2$ in a direction in which the positive electrode composition decreases. Thereby, a curve indicating the relationship between negative electrode composition $\theta_2$ and open-circuit potential $U_2$ also shifts by $\Delta\theta_2$ in the direction in which positive electrode composition $\theta_1$ decreases. Although the negative electrode composition corresponding to a positive electrode composition $\theta_{1fix}$ is $\theta_{2fix\_ini}$ when the secondary battery is in the initial state, it becomes $\theta_{2fix}$ after the secondary battery is deteriorated. Factors causing such offset of the correspondence between the compositions include, as one example, a case where lithium ions released from the positive electrode during charging become a by-product and the like and thus are not absorbed by the negative electrode, for example. In FIG. 9, negative electrode composition $\theta_{L2}$ is set to zero, and $\theta_{L2}=0$ means that lithium at the negative electrode is all released.

In the present embodiment, the above two phenomena can be modeled by introducing three parameters, that is, "positive electrode capacity maintenance rate," "negative electrode capacity maintenance rate" and "positive and negative electrode compositions correspondence offset capacity," as parameters related to capacity deterioration. Specifically, in the present embodiment, by estimating these three parameters and correcting the battery model using the estimated parameters, the open-circuit voltage characteristics of the battery model can be adapted to the open-circuit voltage characteristics of a deteriorated actual battery, and the full charge capacity of the deteriorated actual battery can be estimated.

First, a method of modeling the above two phenomena of capacity deterioration (the reduction in single electrode capacity, and the offset of the correspondence between the compositions) will be specifically described hereinafter.

The single electrode capacity maintenance rate on each of the positive electrode side and the negative electrode side is expressed as the single electrode capacity (after deterioration)/the single electrode capacity (initial state). It is defined that, after the secondary battery is deteriorated, the single electrode capacity decreases from a value in the initial state, by a certain amount. A positive electrode capacity maintenance rate $k_1$ is determined according to the following equation (9):

[equation 8]

$$k_1 = \frac{Q_{1\_ini} - \Delta Q_1}{Q_{1\_ini}} \qquad (9)$$

Similarly, a negative electrode capacity maintenance rate $k_2$ is determined according to the following equation (10):

[equation 9]

$$k_2 = \frac{Q_{2\_ini} - \Delta Q_2}{Q_{2\_ini}} \qquad (10)$$

Here, and $Q_{1\_ini}$ and $Q_{2\_ini}$ represent the single electrode capacities at the positive and negative electrodes in the initial state, respectively, and $\Delta Q_1$ and $\Delta Q_2$ refer to the amounts of reduction in single electrode capacities at the positive and negative electrodes, respectively. Here, single electrode capacities $Q_{1\_ini}$ and $Q_{2\_ini}$ are constants obtained in advance by, for example, an experiment and the like.

In addition, $\Delta Q_s$ represents the positive and negative electrode compositions correspondence offset capacity corresponding to a relative offset amount ($\Delta\theta_2$ shown in FIG. 9) between the positive electrode composition axis and the negative electrode composition axis.

Figure 10:
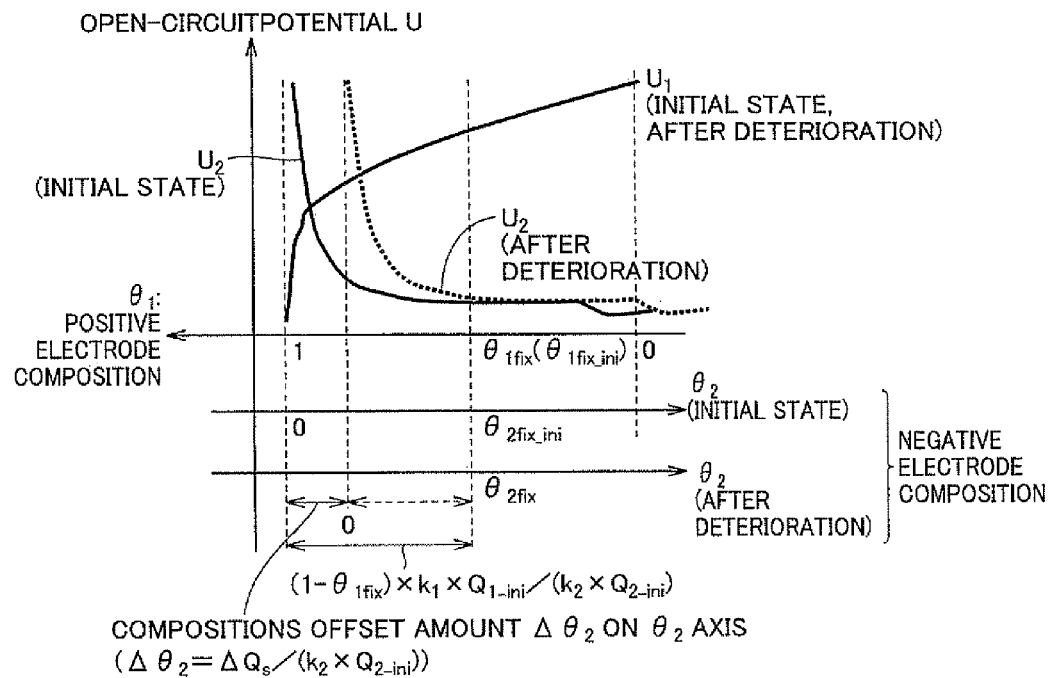
FIG. 10 is a schematic diagram illustrating an offset of the correspondence between the composition of the positive electrode and the composition of the negative electrode due to deterioration.

FIG. 10 is a schematic diagram illustrating an offset of the correspondence between the composition of the positive electrode and the composition of the negative electrode due to deterioration, Referring to FIG. 10, after the secondary battery is deteriorated, the capacity when negative electrode composition $\theta_2$ is 1 is ($Q_{2\_ini}-\Delta Q_2$). In addition, positive and negative electrode compositions correspondence offset capacity $\Delta Q_s$ is the capacity corresponding to offset amount $\Delta\theta_2$ of the negative electrode composition axis with respect to the positive electrode composition axis. Based on these, the relationship of 1: $\Delta\theta_2 = (Q_{2\_ini} - \Delta Q_2)$: $\Delta Q_s$ is established. Therefore, positive and negative electrode compositions correspondence offset capacity $\Delta Q_s$ after the secondary battery is deteriorated is calculated according to the following equation (11):

[equation 10]

$$\Delta Q_s = (Q_{2\_ini} - \Delta Q_2) \times \Delta\theta_2 \qquad (11)$$
$$= k_2 \times Q_{2\_ini} \times \Delta\theta_2$$

$\theta_{2fix\_ini}$ represents the negative electrode composition in the initial state corresponding to a positive electrode composition $\theta_{1fix\_ini}$ in the initial state, and $\theta_{2fix}$ represents the negative electrode composition corresponding to positive electrode composition $\theta_{1fix}$ after the offset of the composition occurs due to deterioration of the secondary battery. Further, positive electrode composition $\theta_{1fix\_ini}$ in the initial state is a criterion of the offset. In other words, $\theta_{1fix\_ini}$ is equal to $\theta_{1fix}$.

When the relative offset of the correspondence between the composition of the positive electrode and the composition of the negative electrode occurs due to deterioration of the secondary battery, positive electrode composition $\theta_{1fix}$ and negative electrode composition $\theta_{2fix}$ are calculated according to the following equations (12) and (13):

[equation 11]

$$\theta_{1fix} = \theta_{1fix\_ini} \qquad (12)$$

$$\theta_{2fix} = \frac{(1 - \theta_{1fix}) \times k_1 \times Q_{1ini} - \Delta Q_s}{k_2 \times Q_{2\_ini}} \qquad (13)$$

The meaning of the equation (13) will be further described. The amount of lithium released from the positive electrode when positive electrode composition $\theta_1$ changes (decreases) from 1 to $\theta_{1fix}$ after the secondary battery is deteriorated is expressed as a value obtained by multiplying the amount of change in positive electrode composition, that is, $(1-\theta_{1fix})$ by the single electrode capacity at the positive electrode (i.e., $k_1 \times Q_{1\_ini}$). Assuming that lithium released from the positive electrode is all absorbed by the negative electrode, negative electrode composition $\theta_{2fix}$ is given by $(1\theta_{-1fix}) \times (k_1 \times Q_{1\_ini}) / (k_2 \times Q_{2\_ini})$ because the single electrode capacity at the negative electrode (after deterioration) is given by $k_2 \times Q_{2\_ini}$. As shown in the equation (11), however, the relative offset $(\Delta\theta_2)$ of the correspondence between the composition of the positive electrode and the composition of the negative electrode exists, and thus, negative electrode composition $\theta_{2fix}$ after deterioration is given by a value obtained by subtracting offset amount $\Delta\theta_2$ from the above value. Based on the equation (11), offset amount $\Delta\theta_2$ can be expressed using positive and negative electrode compositions correspondence offset capacity $\Delta Q_s$. Therefore, negative electrode composition $\theta_{2fix}$ after deterioration can be expressed according to the equation (13).

In the battery model in the present embodiment, a reduction in single electrode capacities at the positive electrode and the negative electrode is reflected in the electrode thickness and the volume fraction of the active material, as shown in the equations (14) to (17).

[equation 12]

$$L_1 = L_{10} \times \sqrt{k_1} \qquad (14)$$

$$L_2 = L_{20} \times \sqrt{k_2} \qquad (15)$$

$$\epsilon_{s,1} = \epsilon_{s0,1} \times \sqrt{k_1} \qquad (16)$$

$$\epsilon_{s,2} = \epsilon_{s0,2} \times \sqrt{k_2} \qquad (17)$$

Here, $L_{10}$ and $L_{20}$ represent the positive electrode thickness and the negative electrode thickness in the initial state, respectively, and $\epsilon_{s0,1}$ and $\epsilon_{s0,2}$ represent the volume fraction of the active material of the positive electrode and the volume fraction of the active material of the negative electrode in the initial state, respectively.

Based on the above description, open-circuit voltage OCV when the reduction in single electrode capacity at the positive electrode and the negative electrode as well as the relative offset of the correspondence between the composition of the positive electrode and the composition of the negative electrode occur due to deterioration is calculated by the following equation (18). When a current is flowing through the secondary battery or immediately after the current is discontinued, the lithium concentration distribution exists in the active material, and thus, the lithium concentration at the active material surface does not match the average lithium concentration in the active material. However, when open-circuit voltage OCV is obtained, the secondary battery is in a sufficiently relaxed state, and thus, the lithium concentration distribution does not exist in the active material and the lithium concentration at the active material surface is equal to the average lithium concentration in the active material.

[equation 13]

$$OCV(\theta_{1ave}, \theta_{2ave}) = U(\theta_{1ave}) - U(\theta_{2ave}) \qquad (18)$$

In the equation (18), $\theta_{1ave}$ and $\theta_{2ave}$ represent the average charging rates in the active materials of the positive electrode and the negative electrode, respectively, and are defined by the following equation (19). Here, in the equation (19), $c_{save,i}$ represents the average lithium concentration in the active material.

[equation 14]

$$\theta_{iave} = \frac{c_{save,i}}{c_{s,i,max}}, (i = 1, 2) \qquad (19)$$

The relationship according to the following equation (20) is established between $\theta_{1ave}$ and $\theta_{2ave}$.

[equation 15]

$$\theta_{2ave} = \theta_{2fix} + (\theta_{1fix} - \theta_{1ave}) \times \lambda \qquad (20)$$

In addition, $\lambda$ shown in the equation (20) is defined by the following equation (21):

[equation 16]

$$\lambda = \frac{c_{s,1,max} L_1 \epsilon_{s,1}}{c_{s,2,max} L_2 \epsilon_{s,2}} \qquad (21)$$

Figure 11:
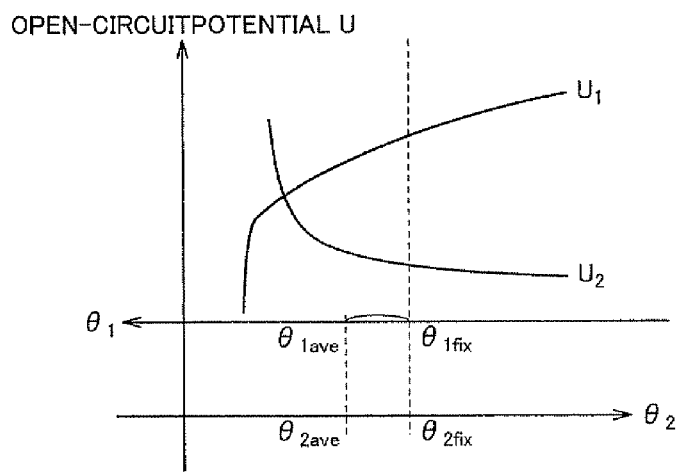
FIG. 11 is a diagram for illustrating a relational equation established between an average charging rate $\theta_{1ave}$ in an active material of the positive electrode and an average charging rate $\theta_{2ave}$ in an active material of the negative electrode.

FIG. 11 is a diagram for illustrating a relational equation established between average charging rate $\theta_{1ave}$ in the active material of the positive electrode and average charging rate $\theta_{2ave}$ in the active material of the negative electrode. Referring to FIG. 11, positive electrode composition $\theta_{1fix}$ corresponds to negative electrode composition $\theta_{2fix}$. Further, as a result of absorption by the positive electrode of all lithium released from the negative electrode, the negative electrode composition changes from $\theta_{2fix}$ to $\theta_{2ave}$ and the positive electrode composition changes from $\theta_{1fix}$ to $\theta_{1ave}$.

Since the amount of change in lithium in the positive electrode is equal to the amount of change in lithium in the negative electrode, the following relationship is established based on equations (14) to (17) and (19), where S represents the plate area of each of the positive and negative electrodes.

$$(\theta_{1fix}-\theta_{1ave}) \times c_{s,1,max} \times L_1 \times \epsilon_{s,1} \times S = (\theta_{2ave}-\theta_{2fix}) \times c_{s,2,max} \times L_2 \times \epsilon_{s,2} \times S$$

By solving this equation, the above equations (20) and (21) are established.

As described above, by calculating average charging rate $\theta_{1ave}$ in the active material of the positive electrode and average charging rate $\theta_{2ave}$ in the active material of the negative electrode, the open-circuit voltage characteristics when the reduction in single electrode capacities at the positive and negative electrodes as well as the offset of the correspondence between the composition of the positive electrode and the composition of the negative electrode occur due to deterioration can be calculated based on the equation (18). As shown in the equation (20), $\theta_{1ave}$ and $\theta_{2ave}$ are associated with positive electrode composition $\theta_{1fix}$ and negative electrode composition $\theta_{2fix}$. As shown in the equation (13), negative electrode composition $\theta_{2fix}$ includes positive electrode capacity maintenance rate $k_1$, negative electrode capacity maintenance rate $k_2$, and positive and negative electrode compositions correspondence offset capacity $\Delta Q_s$, which are the parameters related to capacity deterioration. Therefore, by estimating positive electrode capacity maintenance rate $k_1$, negative electrode capacity maintenance rate $k_2$, and positive and negative electrode compositions correspondence offset capacity $\Delta Q_s$, $\theta_{1ave}$ and $\theta_{2ave}$ after the secondary battery is deteriorated can be estimated. As a result, the open-circuit voltage characteristics of the secondary battery changing with deterioration of the secondary battery over time can be estimated in the present embodiment.

A description will now be given of a method of calculating the full charge capacity of the battery when the reduction in single electrode capacities at the positive and negative electrodes as well as the offset of the correspondence between the composition of the positive electrode and the composition of the negative electrode occur due to deterioration.

First, a positive electrode composition $\theta_{1\_100}$ when the SOC is 100% and a positive electrode composition $\theta_{1\_0}$ when the SOC is 0% are calculated according to the equation for calculating open-circuit voltage OCV of the deteriorated battery in accordance with the equation (18). Specifically, assuming that $V_{100}$ represents the open-circuit voltage defining SOC=100% and $V_0$ represents the open-circuit voltage defining SOC=0%, positive electrode composition $\theta_1$ (positive electrode composition $\theta_{1\_100}$) satisfying OCV($\theta_1$, $\theta_2$)=$V_{100}$ and positive electrode composition $\theta_1$ (positive electrode composition $\theta_{1\_0}$) satisfying OCV($\theta_1$, $\theta_2$)=$V_0$ are calculated. In the battery used in the present embodiment, $V_{100}$=4.1V when it is defined that SOC=100%, and $V_0$=3.0V when it is defined that SOC=0%, for example.

A full charge capacity $Q_d$ per unit plate area after deterioration is calculated by the following equation (22):

[equation 17]

$$Q_d = \frac{(\theta_{1\_0} - \theta_{1\_100}) c_{s,1,max} L_1 \varepsilon_{s,1} F}{3600} \quad (22)$$

The equation (22) includes electrode thickness $L_1$ and a volume fraction $\epsilon_{s,i}$. Each of these depends on positive electrode capacity maintenance rate $k_1$. Therefore, full charge capacity $Q_d$ changes dependently of positive electrode capacity maintenance rate $k_1$. In other words, as positive electrode capacity maintenance rate $k_1$ decreases due to deterioration of the secondary battery, full charge capacity $Q_d$ decreases. It is to be noted that positive electrode compositions $\theta_{1\_100}$ and $\theta_{1\_0}$ also change depending on positive electrode capacity maintenance rate $k_1$, negative electrode capacity maintenance rate $k_2$, and positive and negative electrode compositions correspondence offset capacity $\Delta Q_s$.

Assuming that S represents the plate area, a full charge capacity $Q_{d\_all}$ after deterioration is calculated by the following equation (23):

[equation 18]

$$Q_{d\_all} = Q_d \times S \quad (23)$$

In addition, assuming that $Q_{ini}$ represents the battery capacity per unit plate area in the initial state, a full charge capacity maintenance rate $dQ_{rate}$ after deterioration is calculated by the following equation (24):

[equation 19]

$$dQ_{rate} = \frac{Q_d}{Q_{ini}} \quad (24)$$

Therefore, how much the full charge capacity decreases with respect to that in the initial state can be found by using full charge capacity maintenance rate $dQ_{rate}$, and thus, $dQ_{rate}$ can be used to determine the degree of deterioration of the battery.

As described above, in the present embodiment, by modeling the reduction in single electrode capacities at the positive electrode and the negative electrode as well as the offset of the correspondence between the composition of the positive electrode and the composition of the negative electrode, the open-circuit voltage characteristics and the full charge capacity when these occur can be obtained. A description will be given hereinafter of a specific structure for estimating the reduction in single electrode capacities at the positive electrode and the negative electrode as well as the offset of the correspondence between the composition of the positive electrode and the composition of the negative electrode due to deterioration, and reflecting these in the battery model for estimating the battery state such as the SOC or current.

Figure 12:
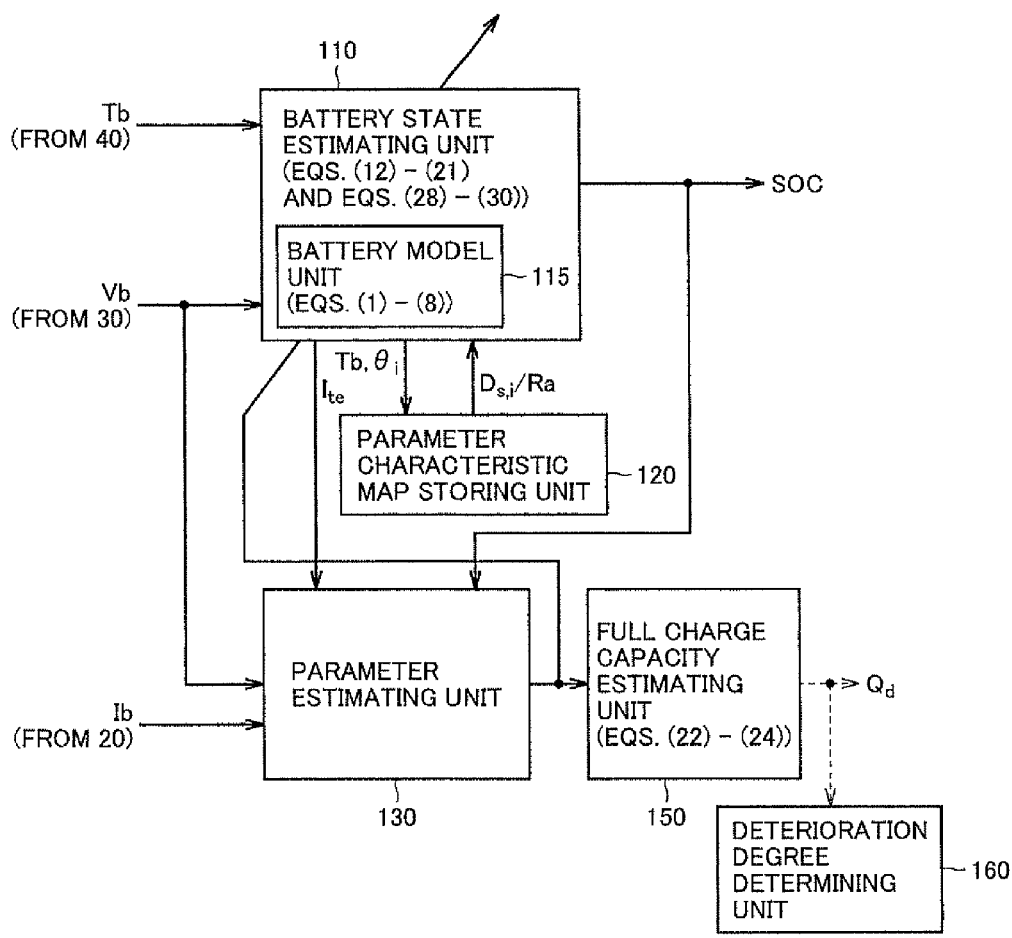
FIG. 12 is a block diagram illustrating a structure for estimating deterioration of a battery capacity according to a first embodiment.

FIG. 12 is a block diagram illustrating a structure for estimating deterioration of the battery capacity according to the first embodiment. Processing for estimating capacity deterioration according to the block diagram shown in FIG. 12 is implemented by ECU 100.

Referring to FIG. 12, a battery state estimating unit 110 includes a battery model unit 115 formed according to the above equations (1) to (8). According to the flowchart in FIG. 5, the equations (12) to (21), and the equations (28) to (30) described below, battery state estimating unit 110 estimates the internal state (behaviors) of secondary battery 10 in every arithmetic cycle using battery temperature Tb and battery voltage Vb, and calculates the charging rate (SOC), estimated battery current value $I_{te}$ and the like based on the result of this estimation.

A parameter characteristic map storing unit 120 has stored the characteristic map that relates to diffusion coefficient $D_{s,i}$ and DC resistance $R_a$, which are the parameters in the battery model equation as already described, and is based on the measurement result in the initial state. Thus, parameter characteristic map storing unit 120 allows reading of diffusion coefficient $D_{s,i}$ and DC resistance $R_a$ corresponding to the present battery state according to the battery state such as battery temperature Tb and local SOC θ that change every moment. Further, parameter characteristic map storing unit 120 has stored the characteristic map defining the change characteristics of positive electrode open-circuit potential $U_1$ with respect to changes in local SOC θ, and the change characteristics of negative electrode open-circuit potential $U_2$ with respect to changes in local SOC $θ_2$.

A parameter estimating unit 130 obtains measured battery current value Ib measured by current sensor 20 as well as the charging rate SOC and estimated battery current value $I_{te}$ estimated by battery state estimating unit 110, and estimates positive and negative electrode compositions correspondence offset capacity $\Delta Q_s$, positive electrode capacity maintenance rate $k_1$ and negative electrode capacity maintenance rate $k_2$. As already described, these three parameters are parameters related to capacity deterioration that change due to deterioration of the battery. In the following description, $\Delta Q_s$, $k_1$ and $k_2$ will be collectively referred to as "capacity deterioration parameter."

The capacity deterioration parameter estimated by parameter estimating unit 130 is provided to battery model unit 115. Based on the result of estimation of the capacity deterioration parameter by parameter estimating unit 130, battery state estimating unit 110 calculates average charging rate $θ_{1ave}$ in the active material of the positive electrode and average charging rate $θ_{2ave}$ in the active material of the negative electrode, and calculates estimated value U# of open-circuit voltage OCV based on calculated $θ_{1ave}$ and $θ_{2ave}$ as well as the map defining the relationship between local SOC $θ_i$ and open-circuit potential $U_i$ stored by parameter characteristic map storing unit 120. As a result, in the deteriorated battery as well, the internal state such as the SOC and the current can be accurately estimated.

According to the equation (17), a full charge capacity estimating unit 150 estimates full charge capacity $Q_d$ (or may be $Q_{d\_all}$) of the battery that changes due to deterioration, using the capacity deterioration parameter estimated by parameter estimating unit 130.

A deterioration determining unit 160 calculates $dQ_{rate}$ according to the equation (24), using full charge capacity $Q_d$ estimated by full charge capacity estimating unit 150 and full charge capacity $Q_{ini}$ when the secondary battery is in the initial state. Then, deterioration determining unit 160 determines the degree of deterioration of the battery based on calculated $dQ_{rate}$ (for example, by comparing $dQ_{rate}$ with a reference value). Full charge capacity $Q_{ini}$ when the secondary battery is in the initial state is a constant obtained in advance by the experiment and the like, and is stored in deterioration determining unit 160. It is to be noted that in the first embodiment, deterioration determining unit 160 is configured to determine deterioration of the battery capacity according to the ratio between full charge capacity $Q_d$ and full charge capacity $Q_{ini}$. Deterioration determining unit 160, however, may calculate a difference $(Q_{ini}-Q_d)$ between full charge capacities $Q_d$ and $Q_{ini}$, and determine that deterioration of the capacity of the secondary battery is occurring if the difference is larger than the reference value. Deterioration determining unit 160 can determine the degree of deterioration of the battery using the difference or ratio between the full charge capacity when the secondary battery is in the initial state (for example, when the secondary battery is new) and the present full charge capacity.

Figure 13:
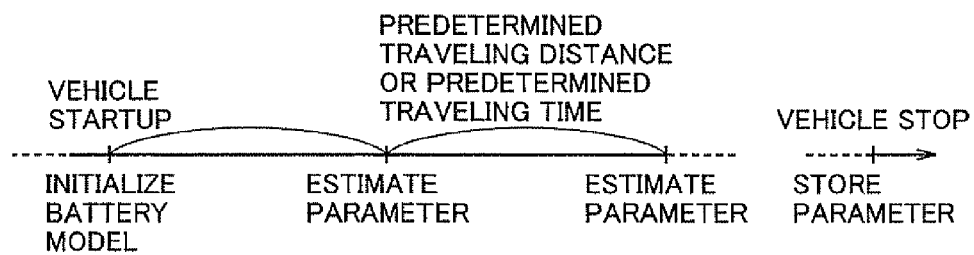
FIG. 13 is a diagram illustrating a timing when the structure shown in FIG. 12 estimates deterioration of the battery capacity.

FIG. 13 is a diagram illustrating a timing when the structure shown in FIG. 12 estimates deterioration of the battery capacity. Here, load 50 shown in FIG. 1 is an electric motor mounted on a vehicle such as a hybrid vehicle or an electric vehicle for causing the vehicle to travel. Referring to FIG. 13, upon startup of the vehicle (for example, at the time of ignition ON), battery state estimating unit 110 initializes the battery model using the capacity deterioration parameter stored in parameter estimating unit 130. When the vehicle starts to travel, parameter estimating unit 130 executes estimation of the capacity deterioration parameter in every predetermined traveling distance or in every predetermined traveling time. Here, "traveling distance" described above refers to a distance traveled by the vehicle by driving of the electric motor for causing the vehicle to travel. Therefore, in the case of the hybrid vehicle on which an engine and an electric motor for causing the vehicle to travel are mounted, the distance traveled by the hybrid vehicle when only the engine operates is not included in "traveling distance" described above, which is a condition for executing estimation of the capacity deterioration parameter.

When the operation of the vehicle ends (for example, at the time of ignition OFF), parameter estimating unit 130 has the latest capacity deterioration parameter stored therein. The capacity deterioration parameter stored in parameter estimating unit 130 is used to initialize the battery model at next startup of the vehicle.

Figure 14:
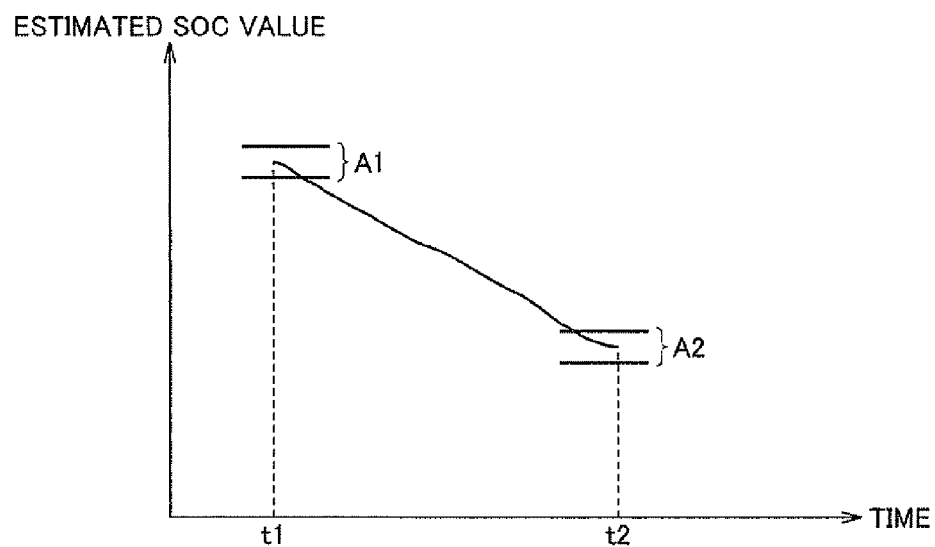
FIG. 14 is a conceptual diagram showing a condition of an estimated SOC value for estimating a capacity deterioration parameter.

A description will now be given of estimation of the capacity deterioration parameter by parameter estimating unit 130. Parameter estimating unit 130 obtains measured battery current value Ib measured by current sensor 20 as well as the charging rate SOC and estimated battery current value $I_{te}$ estimated by battery state estimating unit 110, and calculates a summed value of the measured value (=Ib/S) (a summed actual current value $S_i$) and a summed value of estimated value $I_{te}$ (a summed estimated current value $S_{ie}$). Further, parameter estimating unit 130 obtains the SOC from battery state estimating unit 110. As shown in FIG. 14, at time t1, an estimated SOC value falls within a predetermined SOC range A1. At this time, parameter estimating unit 130 starts summation of the actual current and summation of the estimated current.

The estimated SOC value changes successively with charging/discharging of the secondary battery, and at time t2, the estimated SOC value falls within a predetermined SOC range A2. At this time, parameter estimating unit 130 ends summation of the actual current and summation of the estimated current.

In the present embodiment, SOC range A1 and SOC range A2 are different from each other and the estimated SOC value may change from a value within SOC range A1 to a value within SOC range A2. Therefore, the actual current and the estimated current may be summed during charging of the secondary battery, or charging and discharging of the secondary battery may be switched during summation of the actual current and summation of the estimated current.

When the state of the deteriorated actual battery is accurately reflected in the battery model, summed actual current value $S_i$ substantially matches summed estimated current value $S_{ie}$. However, when the battery model differs from the actual state of the battery, a difference is made between summed actual current value $S_i$ and summed estimated current value $S_{ie}$. This difference corresponds to an estimation error caused by battery state estimating unit 110.

Figure 15:
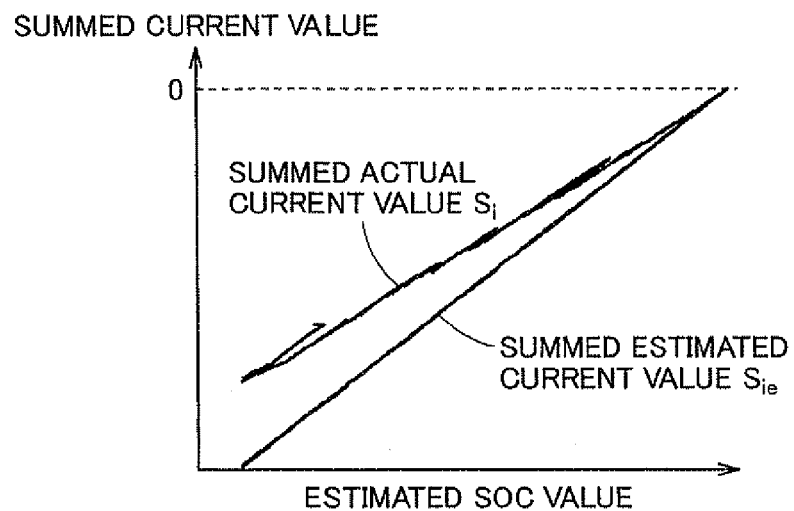
FIG. 15 is a diagram showing the relationship of a summed actual current value $S_i$ and a summed estimated current value $S_{ie}$ with respect to the estimated SOC value when the secondary battery is deteriorated.

FIG. 15 is a diagram showing the relationship of summed actual current value $S_i$ and summed estimated current value $S_{ie}$ with respect to the estimated SOC value when the secondary battery is deteriorated. When the full charge capacity decreases due to deterioration of the secondary battery, the open-circuit voltage characteristics change (see FIG. 8). As shown in FIG. 15, however, when the deterioration state of the secondary battery is not reflected appropriately in the battery model, a difference is caused between summed actual current value $S_i$ and summed estimated current value $S_{ie}$. This difference ($S_{ie}-S_i$) between summed estimated current value $S_{ie}$ and summed actual current value $S_i$ is expressed as "current summation estimation error $\Delta S_i$."

FIG. 15 shows a summed value of battery current Ib when secondary battery 10 is discharged, and battery current Ib is defined as a negative value (Ib<0).

Figure 16:
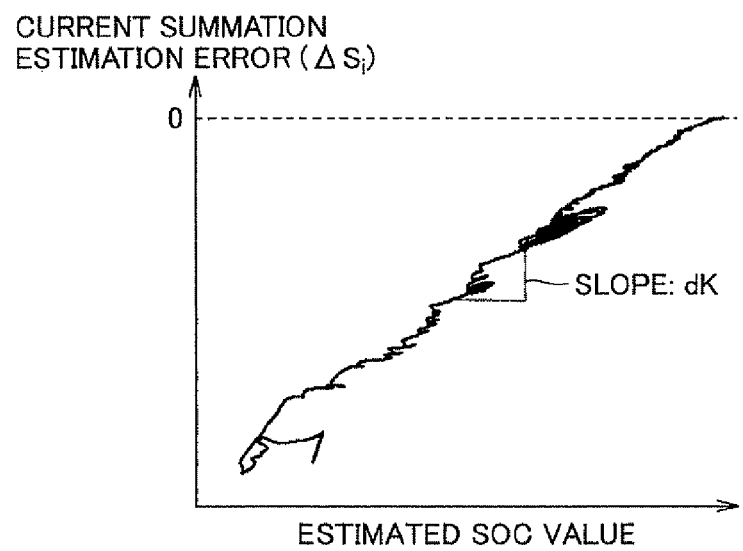
FIG. 16 is a diagram showing the relationship between a current summation estimation error $\Delta S_i$ and the SOC based on FIG. 15.

FIG. 16 is a diagram showing the relationship between current summation estimation error $\Delta S_i$ and the SOC based on FIG. 15. Referring to FIG. 16, a slope dK represents a rate of change in current summation estimation error $\Delta S_i$ with respect to the estimated SOC value. In the first embodiment, processing for estimating the capacity deterioration parameter is executed such that slope dK is minimized. Although a minimum value of slope dK is not limited to a particular value, the minimum value is set to zero as one example. In this example, the processing for estimating the capacity deterioration parameter is executed such that slope dK is set to zero, that is, such that current summation estimation error $\Delta S_i$ is maintained at zero (summed actual current value $S_i$ matches summed estimated current value $S_{ie}$) even when the estimated SOC value changes. The fact that the rate of change in current summation estimation error $\Delta S_i$ with respect to the SOC is zero means that current summation estimation error $\Delta S_i$ is maintained at zero regardless of the SOC. In other words, an estimated value of the battery current estimated by battery state estimating unit 110 matches a detected value of the battery current detected by current sensor 20. That is to say, the state of the actual battery is reflected in the battery model. As a result, the open-circuit voltage characteristics and the full charge capacity can be accurately estimated.

Figure 17:
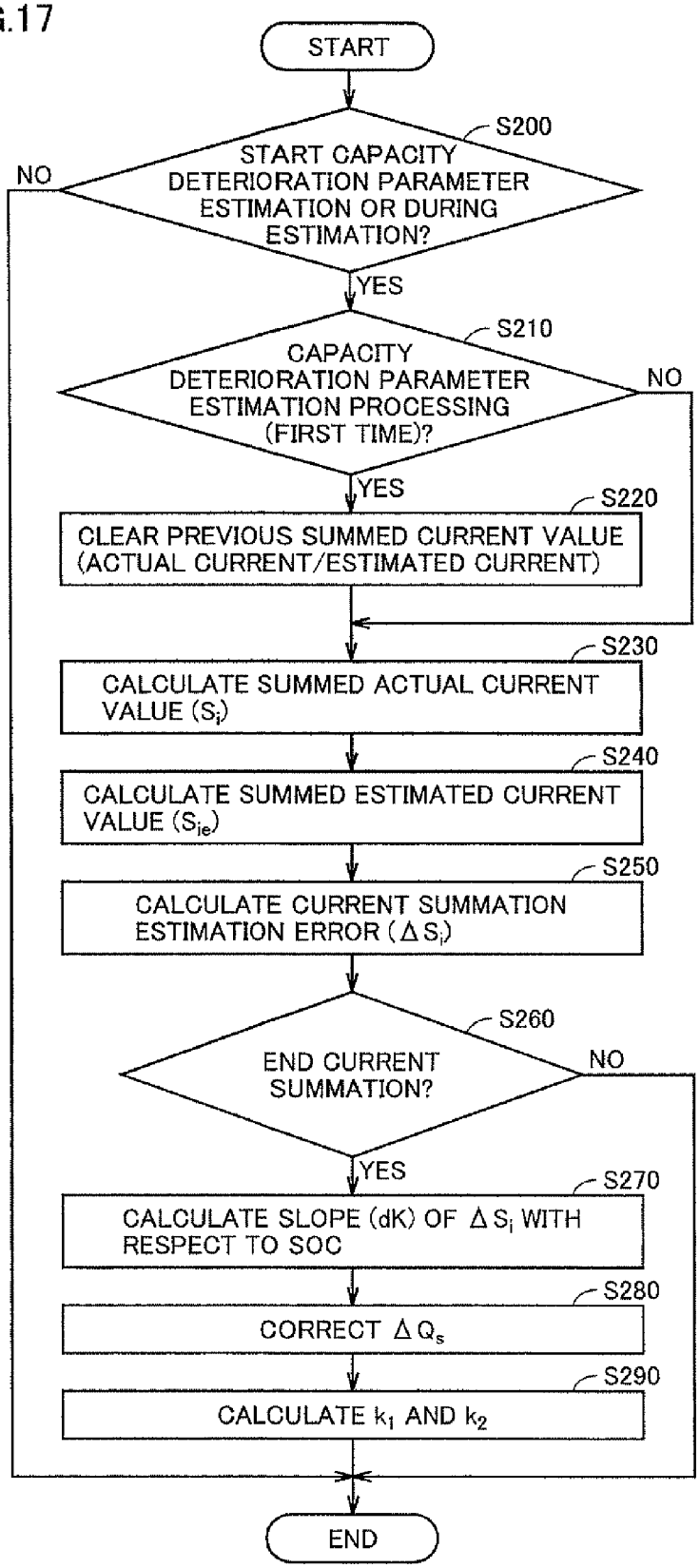
FIG. 17 is a flowchart illustrating processing for estimating the capacity deterioration parameter by a parameter estimating unit 130.

FIG. 17 is a flowchart illustrating the processing for estimating the capacity deterioration parameter by parameter estimating unit 130. It is to be noted that ECU 100 calls and executes the processing shown in this flowchart in every predetermined arithmetic cycle.

Referring to FIG. 17, in step S200, parameter estimating unit 130 determines start of estimation of the capacity deterioration parameter. As shown in FIGS. 13 and 14, if the vehicle has traveled the predetermined distance after the previous estimation processing ended and if the estimated SOC value falls within predetermined SOC range A1, parameter estimating unit 130 determines that a condition for starting estimation of the capacity deterioration parameter is satisfied. Alternatively, if the predetermined time has elapsed since the previous estimation processing ended and if the estimated SOC value falls within SOC range A1 described above, parameter estimating unit 130 determines that the condition for starting estimation of the capacity deterioration parameter is satisfied. If the condition for starting estimation of the capacity deterioration parameter is satisfied or if parameter estimating unit 130 is estimating the capacity deterioration parameter (YES in step S200), the processing proceeds to step S210. On the other hand, if the condition for starting estimation of the capacity deterioration parameter is not satisfied and if parameter estimating unit 130 is not estimating the capacity deterioration parameter (NO in step S200), the overall processing ends.

In step S210, parameter estimating unit 130 determines whether or not the present processing is executed at the start of the processing for estimating the capacity deterioration parameter. If the present processing is executed at the start of the estimation processing (YES in step S210), parameter estimating unit 130 clears a previous summed current value (summed actual current value $S_i$ and summed estimated current value $S_{ie}$) in step S220. If the present processing is not executed at the start of the estimation processing (NO in step S210), the processing proceeds to step S230.

Next, in step S230, parameter estimating unit 130 calculates summed actual current value $S_i$ using battery current Ib measured by current sensor 20. Further, in step S240, parameter estimating unit 130 calculates summed estimated current value $S_{ie}$ using estimated battery current value $I_{te}$ estimated by battery state estimating unit 110. Then, in step S250, parameter estimating unit 130 calculates current summation estimation error $\Delta S_i$ which is a difference between summed estimated current value $S_{ie}$ and summed actual current value $S_i$.

In step S260, parameter estimating unit 130 determines whether or not current summation for estimating the capacity deterioration parameter ends. This end of current summation is determined based on the condition that the estimated SOC value falls within SOC range A2 different from SOC range A1 when current summation starts, as described above.

If current summation for estimating the capacity deterioration parameter does not end (NO in step S260), the overall processing ends and the processing starts from step S200 after the elapse of a predetermined time. As a result, the processing in steps S220 to S250 is repeated until the condition for ending current summation is satisfied. On the other hand, if current summation ends (YES in step S260), parameter estimating unit 130 calculates dK, which is a slope of (rate of change in) current summation estimation error $\Delta S_i$ with respect to the estimated SOC value in step S270. Although a method of calculating slope dK is not particularly limited, the method of least squares can be applied, for example. By using the method of least squares, slope dK can be accurately calculated.

In step S280, parameter estimating unit 130 corrects positive and negative electrode compositions correspondence offset capacity $\Delta Q_s$ according to the following equation (25) such that slope dK becomes small.

[equation 20]

$$\Delta Q_s(\text{after correction}) = \Delta Q_s(\text{previous value}) - \alpha \times dK \quad (25)$$

Here, $\alpha$ is a correction coefficient and a constant. When the secondary battery is in the initial state (the secondary battery is not deteriorated), correction of positive and negative electrode compositions correspondence offset capacity $\Delta Q_s$ starts, assuming that $\Delta Q_s=0$ (that is, there is no offset of the correspondence between the composition of the positive electrode and the composition of the negative electrode).

Next, in step S290, parameter estimating unit 130 calculates positive electrode capacity maintenance rate $k_1$ and negative electrode capacity maintenance rate $k_2$. In the present embodiment, the relationship between positive and negative electrode compositions correspondence offset capacity $\Delta Q_s$ and positive and negative electrode capacity maintenance rates $k_1$, $k_2$ is obtained in advance by an experiment and the like and is stored in parameter estimating unit 130 in the form of a map and the like. As a result, $k_1$ and $k_2$ are calculated from estimated $\Delta Q_s$. Parameter estimating unit 130 may, however, store functions $f_1$ and $f_2$ like the following equations (26) and (27) and calculate $k_1$ and $k_2$ from $\Delta Q_s$ calculated in step S280.

[equation 21]

$$k_1 = f_1(\Delta Q_s) \quad (26)$$

$$k_2 = f_2(\Delta Q_s) \quad (27)$$

By executing the processing shown in the flowchart in FIG. 17 in such a manner, parameter estimating unit 130 estimates the capacity deterioration parameter (the positive and negative electrode compositions correspondence offset capacity, the positive electrode capacity maintenance rate and the negative electrode capacity maintenance rate). As described above, these three capacity deterioration parameters estimated while the vehicle is traveling are stored in, for example, a storage area of parameter estimating unit 130 and reflected in the battery model at the time of the next initialization of the battery model (when the secondary battery is not under load, for example, at the time of ignition ON).

Subsequently, processing for reflecting the capacity deterioration parameter in the battery model, which is executed by battery state estimating unit 110 at the time of initialization of the battery model will be described with reference to FIG. 18. It is to be noted that ECU 100 also calls and executes the processing shown in this flowchart in every predetermined arithmetic cycle.

First, in step S300, battery state estimating unit 110 determines whether or not the present point in time corresponds to the time of initialization of the battery model. For example, when the user of the vehicle turns on an ignition switch, battery state estimating unit 110 determines that the time of initialization of the battery model has come.

Next, in step S310, battery state estimating unit 110 reflects a single electrode capacity maintenance rate $k_i$ at the positive electrode or the negative electrode in electrode thickness $L_i$ and active material volume fraction $\epsilon_{s,i}$, which are the parameters used for the battery model. Specifically, battery state estimating unit 110 obtains single electrode capacity maintenance rate $k_i$ stored in parameter estimating unit 130, and calculates electrode thickness $L_i$ and active material volume fraction $\epsilon_{s,i}$ according to the equations (14) to (17).

Subsequently, in step S320, battery state estimating unit 110 updates positive electrode composition $\theta_{1fix}$ and negative electrode composition $\theta_{2fix}$ after the offset of the correspondence between the compositions occurs due to deterioration. Specifically, based on single electrode capacity maintenance rate $k_i$ and positive and negative electrode compositions correspondence offset capacity $\Delta Q_s$ obtained from parameter estimating unit 130, battery state estimating unit 110 updates positive electrode composition $\theta_{1fix}$ and negative electrode composition $\theta_{2fix}$ according to the equations (12) and (13).

Subsequently, in step S330, battery state estimating unit 110 obtains a value of battery voltage $V_{ini}$ in the non-load state measured by voltage sensor 30. Battery voltage $V_{ini}$ is a battery voltage for initialization.

Subsequently, in step S340, battery state estimating unit 110 calculates a positive electrode initial composition and a negative electrode initial composition $\theta_{2\_ini}$ satisfying the following equation (28) and the equation (20), according to the equation (18), based on battery voltage for initialization $V_{ini}$ as well as updated positive electrode composition $\theta_{1fix}$ and negative electrode composition $\theta_{2fix}$.

[equation 22]

$$OCV(\theta_{1\_ini}, \theta_{2\_ini}) = V_{ini} \quad (28)$$

Then, in step S350, battery state estimating unit 110 initializes the lithium concentration in the active material according to the following equations (29) and (30), using calculated initial compositions $\theta_{1\_ini}$ and $\theta_{2\_ini}$.

[equation 23]

$$c_{s,1,k} = \theta_{1\_ini} \times c_{s,1,max} (k=1, 2, \ldots N) \quad (29)$$

$$c_{s,2,k} = \theta_{2\_ini} \times c_{s,2,max} (k=1, 2, \ldots N) \quad (30)$$

When the processing in step S350 ends, the processing for initializing the battery model ends.

By repeating estimation and update of the three capacity deterioration parameters (the flowchart in FIG. 17) and further reflection of the three capacity deterioration parameters in the battery model (the flowchart in FIG. 18) as described above, the battery model can be adapted to changes in open-circuit voltage associated with deterioration of the capacity of the secondary battery. As a result, the open-circuit voltage characteristics of the battery model gradually approach the open-circuit voltage characteristics of the actual battery. In other words, estimated open-circuit voltage value U# approaches the open-circuit voltage of the actual battery. Therefore, according to the first embodiment, the internal state such as the SOC and the current can be accurately estimated in the secondary battery under capacity deterioration. In addition, slope dK (rate of change in current summation estimation error $\Delta S_i$ with respect to the estimated SOC value) can be gradually decreased when the capacity deterioration parameter is estimated.

Figure 19:
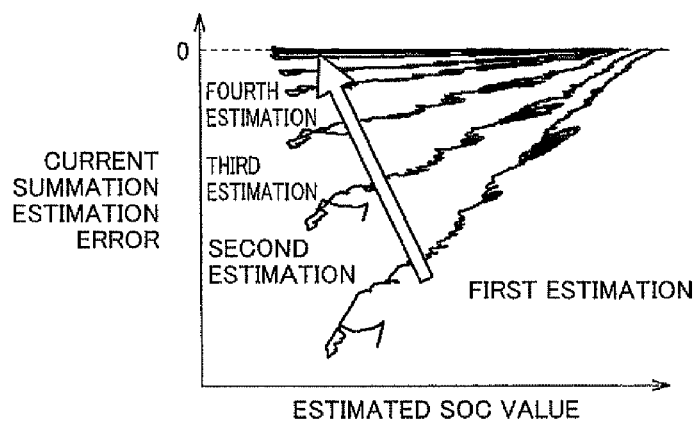
FIG. 19 is a diagram showing changes in current summation estimation error $\Delta S_i$ with respect to the estimated SOC value when estimation of the capacity deterioration parameter and reflection of the capacity deterioration parameter in the battery model are repeated.

FIG. 19 is a diagram showing changes in current summation estimation error $\Delta S_i$ with respect to the estimated SOC value when estimation of the capacity deterioration parameter and reflection of the capacity deterioration parameter in the battery model are repeated. Referring to FIG. 19, it can be seen that as the number of estimation increases, the rate of change in current summation estimation error $\Delta S_i$ with respect to the estimated SOC value (i.e., slope dK) approaches zero.

Figure 20:
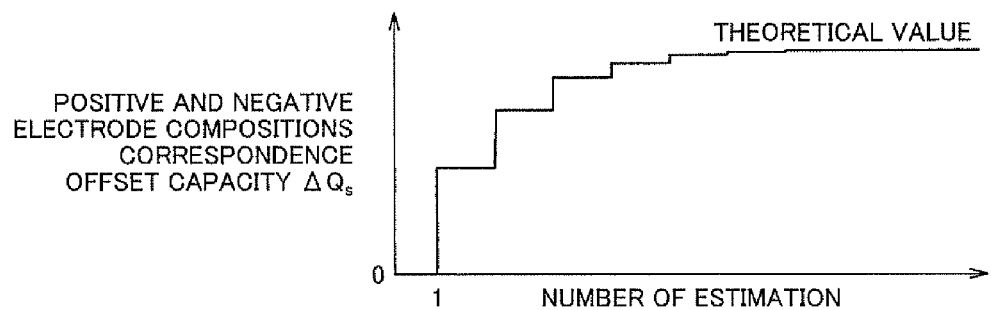
FIG. 20 is a diagram showing a result obtained by repeatedly estimating a positive and negative electrode compositions correspondence offset capacity $\Delta Q_s$.

FIG. 20 is a diagram showing a result obtained by repeatedly estimating positive and negative electrode compositions correspondence offset capacity $\Delta Q_s$. Referring to FIG. 20, as the number of estimation increases, positive and negative electrode compositions correspondence offset capacity $\Delta Q_s$ converges to a true value (theoretical value). A state where positive and negative electrode compositions correspondence offset capacity $\Delta Q_s$ converges to the true value (theoretical value) corresponds to a state where slope dK is zero. In this state, the open-circuit voltage characteristics of the battery model are substantially equal to the open-circuit voltage characteristics of the deteriorated actual battery.

Figure 21:
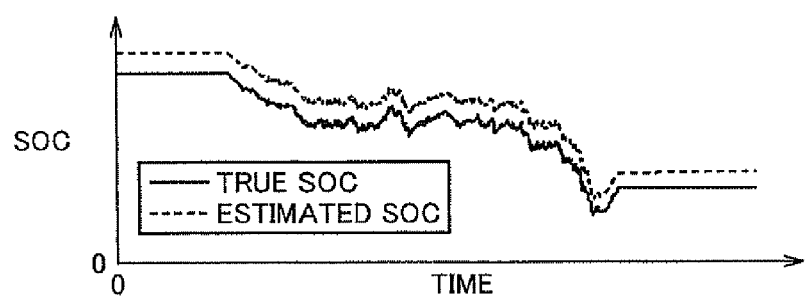
FIG. 21 is a diagram showing temporal transition of the estimated SOC value when learning of the capacity deterioration parameter is not performed.
Figure 22:
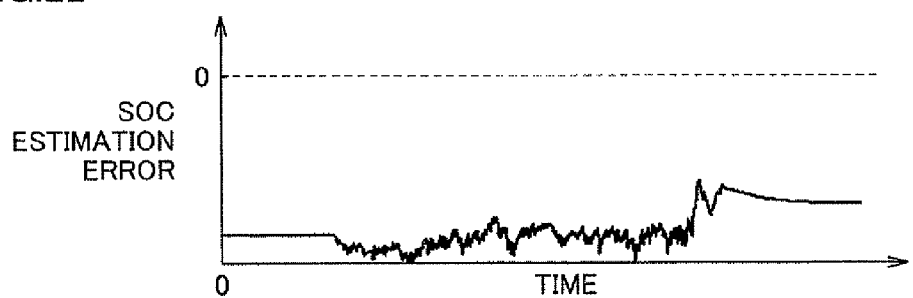
FIG. 22 is a diagram showing an SOC estimation error based on FIG. 21.

FIG. 21 is a diagram showing temporal transition of the estimated SOC value when learning of the capacity deterioration parameter is not performed. FIG. 22 is a diagram showing an SOC estimation error based on FIG. 21. Referring to FIGS. 21 and 22, when learning of the capacity deterioration parameter is not performed, a substantially fixed difference continues to exist between the estimated SOC value and the true value of the SOC. Therefore, the SOC estimation error also continues to have a certain value.

Figure 23:
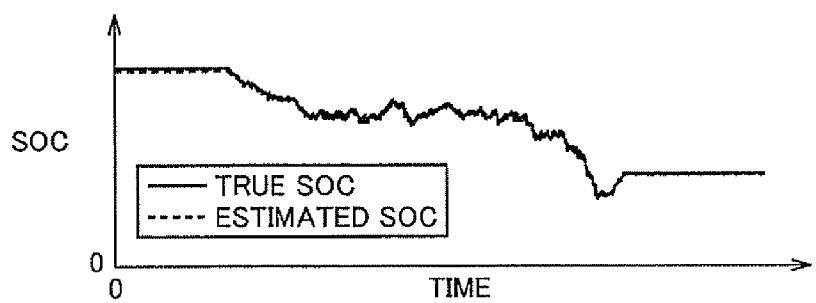
FIG. 23 is a diagram showing temporal transition of the estimated SOC value when learning of the capacity deterioration parameter is performed.
Figure 24:
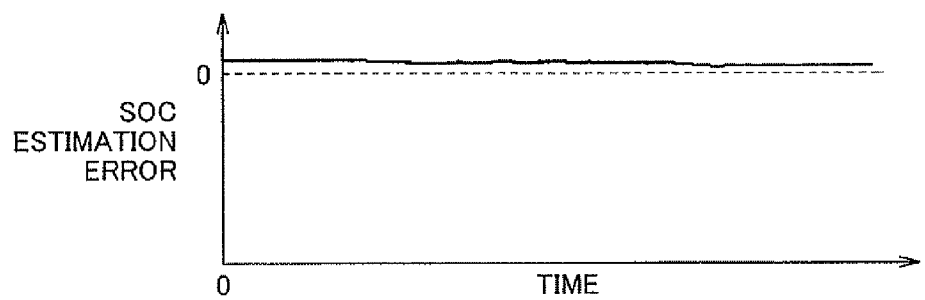
FIG. 24 is a diagram showing the SOC estimation error based on FIG. 23.

FIG. 23 is a diagram showing temporal transition of the estimated SOC value when learning of the capacity deterioration parameter is performed. FIG. 24 is a diagram showing the SOC estimation error based on FIG. 23. Referring to FIGS. 23 and 24, by performing learning of the capacity deterioration parameter, the estimated SOC value closely matches the true value of the SOC from when estimation of the SOC starts. The SOC estimation error continues to have a value close to substantially 0%.

It is to be noted that by repeating update of the capacity deterioration parameter and reflection of the capacity deterioration parameter in the battery model, full charge capacity $Q_d$ per unit plate area calculated by the equation (22) also gradually approaches the actual full charge capacity of the secondary battery. Deterioration determining unit 160 calculates full charge capacity maintenance rate $dQ_{rate}$ according to the equation (24). Deterioration determining unit 160 can correctly determine the deterioration state of the battery based on full charge capacity maintenance rate $dQ_{rate}$.

Figure 25:
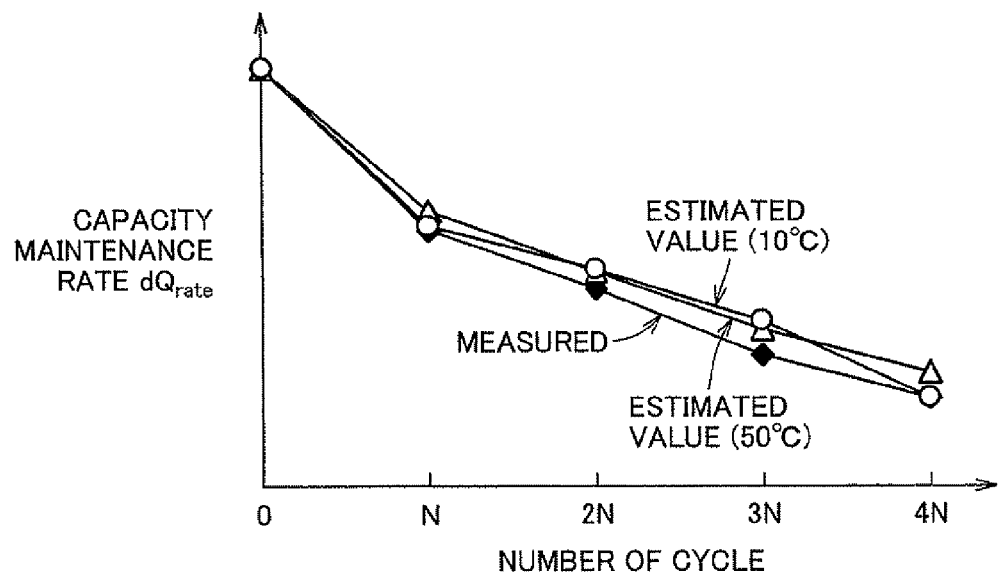
FIG. 25 is a diagram showing a result obtained by estimating a full charge capacity maintenance rate $dQ_{rate}$ when an accelerated deterioration test of the secondary battery is conducted.

FIG. 25 is a diagram showing a result obtained by estimating full charge capacity maintenance rate when an accelerated deterioration test of the secondary battery is conducted. The result shown in FIG. 25 is obtained by charging/discharging the secondary battery in a charge/discharge pattern while the vehicle is traveling to measure data for evaluation, performing estimation and learning of the capacity deterioration parameter using measured current, voltage and temperature values, and estimating full charge capacity maintenance rate $dQ_{rate}$ using the equation (24), in every predetermined number of cycle (N cycle) in the accelerated deterioration test. It can be seen from FIG. 25 that even if the number of cycles in the accelerated deterioration test increases, the measured value of the full charge capacity maintenance rate closely matches the estimated value of the full charge capacity maintenance rate. As described above, according to the first embodiment, it can be seen that the full charge capacity of the deteriorated battery can be accurately estimated using the charge/discharge pattern while the vehicle is traveling.

When the battery is deteriorated, not only a parameter related to the capacity and the open-circuit voltage but also a parameter related to resistance (such as reaction resistance and diffusion resistance) changes generally. In this case, by estimating the rate of change in the parameter related to resistance, that is, a diffusion coefficient and reaction resistance, and reflecting this in the battery model of the battery state estimating unit, the capacity deterioration parameter can be accurately estimated while eliminating an influence of changes in resistance. As a result, the open-circuit voltage characteristics and the full charge capacity can be estimated with higher accuracy. Here, as a method of estimating the parameter related to resistance and a method of reflecting the estimated parameter in the battery model, the invention made by the inventors of the present invention as described in Japanese Patent Laying-Open No. 2008-241246 (Japanese Patent Application No. 2007-077597), for example, can be applied.

In addition, such a structure that one voltage sensor, one current sensor and one temperature sensor are arranged in one battery pack is described in the present embodiment. The structure is not, however, limited to this structure. A sensor may be disposed for each cell or module in order to estimate the deterioration state of each cell or module in the battery pack, and capacity deterioration may be estimated for each cell or module.

Second Embodiment

In a second embodiment, the battery state estimating unit estimates the battery voltage from the battery current and the battery temperature, and estimates the capacity deterioration parameter using a difference between the estimated voltage and the measured battery voltage. Although the second embodiment is different from the first embodiment in this regard, the second embodiment is similar to the first embodiment in terms of the model indicating a reduction in full charge capacity and changes in open-circuit voltage characteristics due to deterioration.

Figure 26:
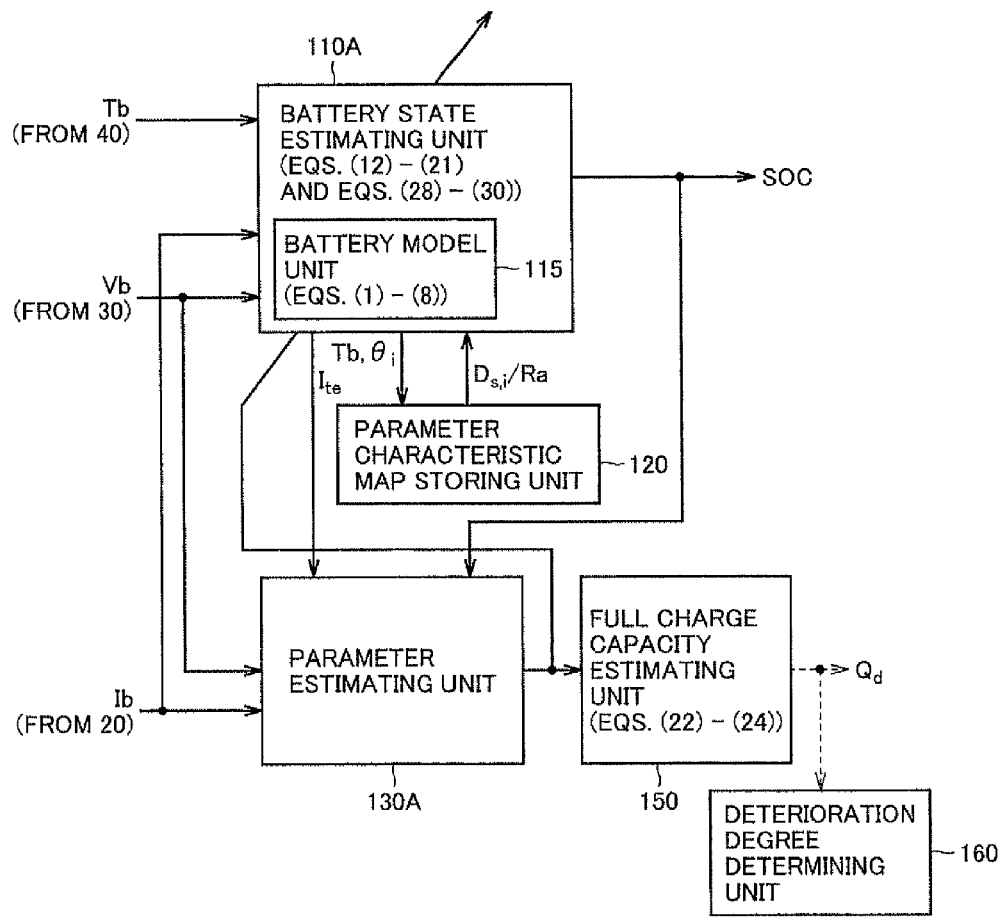
FIG. 26 is a block diagram illustrating a structure for estimating deterioration of the battery capacity according to a second embodiment.

FIG. 26 is a block diagram illustrating a structure for estimating deterioration of the battery capacity according to the second embodiment. Referring to FIG. 26, a battery state estimating unit 110A estimates the internal state (behaviors) of secondary battery 10 in every arithmetic cycle using battery temperature Tb and battery current Ib, and calculates the charging rate (SOC), an estimated battery voltage value $V_e$ and the like based on the result of this estimation. A parameter estimating unit 130A calculates a difference between estimated voltage $V_e$ and battery voltage Vb measured by voltage sensor 30, and estimates the capacity deterioration parameter based on the difference. Since the structure of the remaining portions shown in FIG. 26 is similar to the structure of the corresponding portions in FIG. 12, a description thereof will not be repeated in the following.

Figure 27:
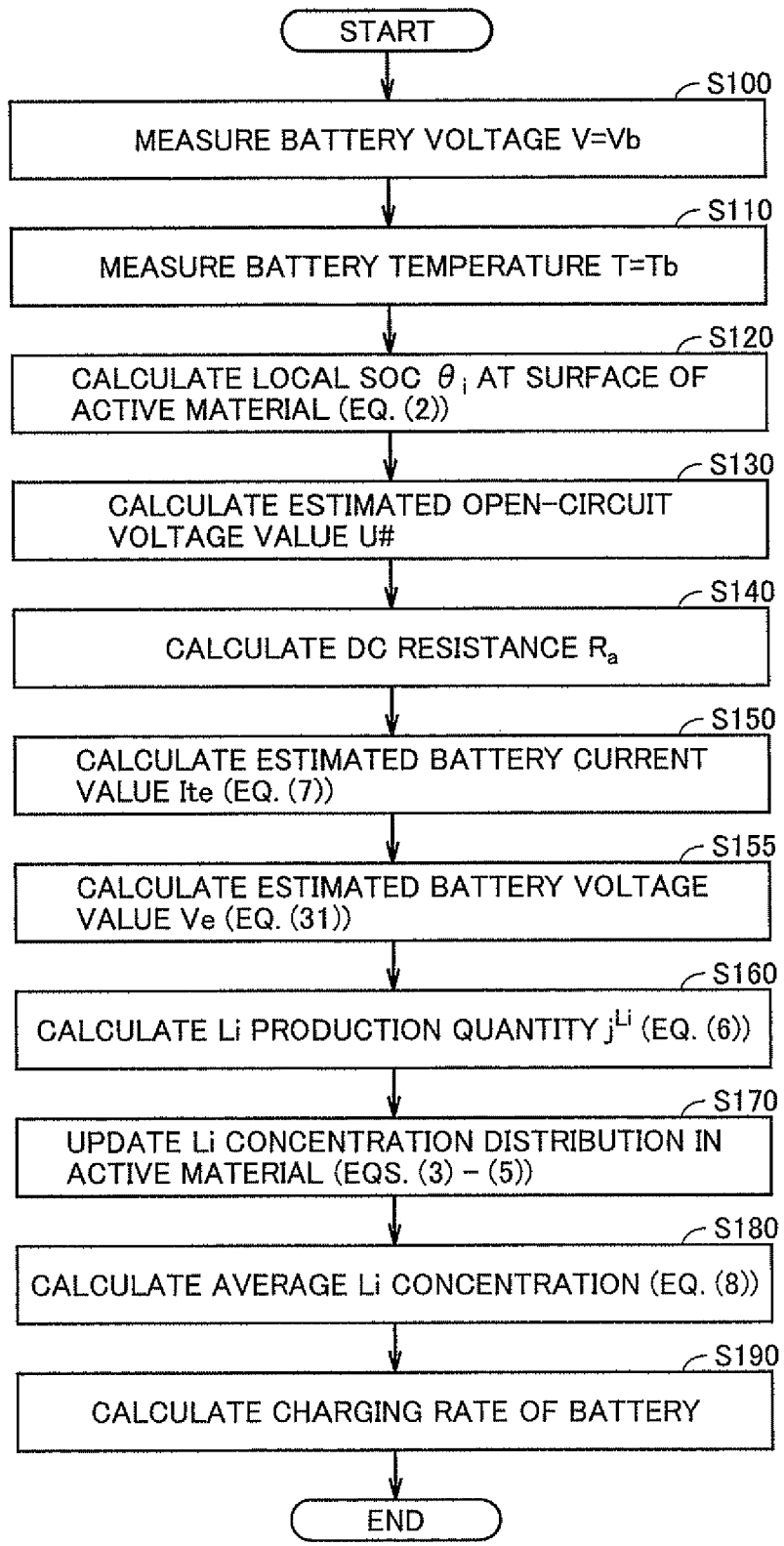
FIG. 27 is a flowchart illustrating a method of calculating an estimated battery charging rate value and an estimated battery voltage value $V_e$ from a battery current Ib and a battery temperature Tb.

A detailed description will now be given of a method of estimating the capacity deterioration parameter according to the second embodiment. First, a method of calculating an estimated battery charging rate value and estimated battery voltage value $V_e$ from battery current Ib and battery temperature Tb will be described with reference to a flowchart in FIG. 27. ECU 100 calls and executes processing shown in FIG. 27 in every predetermined arithmetic cycle. Although the processing in the flowchart in FIG. 27 is different from the processing in the flowchart in FIG. 5 in that processing in step S155 is added, processing in the remaining steps is similar to the processing in the flowchart in FIG. 5.

In step S155, ECU 100 estimates the battery voltage from the measured battery current according to the following equation (31):

[equation 24]

$$V_e = U\# - R_a I \qquad (31)$$

In step S160, ECU 100 calculates lithium production quantity $j^{Li}$ per unit volume and unit time by substituting the measured value of the battery current into battery current I in the equation (6). In steps S170 and S180, by solving the diffusion equation (3) using calculated lithium production quantity $j^{Li}$ per unit volume and unit time as the boundary condition determined by the equations (4) and (5), ECU 100 calculates the average lithium concentration in the active material of each of the positive and negative electrodes. ECU 100 calculates the SOC using the calculated average lithium concentration.

A description will now be given of a method of estimating the capacity deterioration parameter from the estimated battery voltage value and the measured battery voltage. At the time of initialization of the battery model, that is, when the secondary battery is in a relaxed state, the battery model is initialized using measured battery voltage Vb. Here, a method of initializing the battery model is similar to the method shown in the flowchart in FIG. 18. A case is assumed where the secondary battery is charged/discharged from this state and the charging rate changes.

Figure 28:
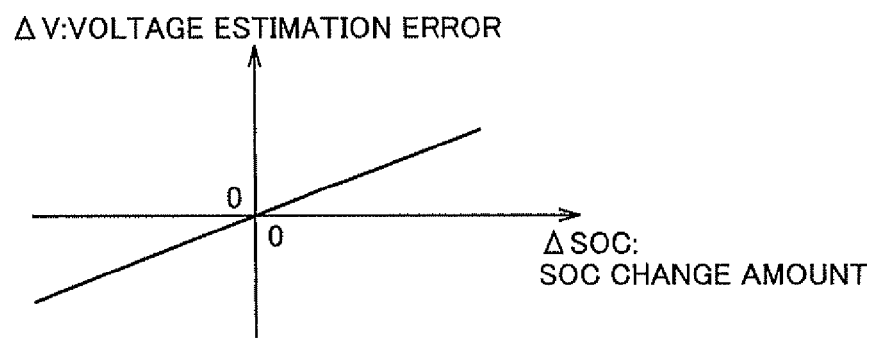
FIG. 28 is a schematic diagram showing the relationship of a difference $\Delta V$ between an estimated battery voltage value and a measured battery voltage value with respect to an SOC change amount $\Delta SOC$.

When capacity deterioration of the secondary battery occurs, the open-circuit voltage characteristics change from the characteristics when the secondary battery is in the initial state, as shown in FIG. 7. Therefore, as shown in FIG. 28, when the SOC of the secondary battery changes from a value at the start of charging/discharging, a difference ΔV (estimation error) between estimated battery voltage value $V_e$ and measured battery voltage value Vb has a slope with respect to an SOC change amount ΔSOC.

In the first embodiment, the capacity deterioration parameter is corrected such that the slope of (rate of change in) current summation estimation error $\Delta S_i$ with respect to SOC change amount ΔSOC decreases. Similarly, in the second embodiment, the capacity deterioration parameter is corrected such that the slope of ΔV with respect to SOC change amount ΔSOC decreases. Therefore, according to the second embodiment, the capacity deterioration parameter is corrected such that the rate of change in estimation error with respect to ΔSOC is minimized (for example, zero), as in the first embodiment. Therefore, the battery model can be corrected such that the open-circuit voltage characteristics of the battery model approach the open-circuit voltage characteristics of the actual battery.

Figure 29:
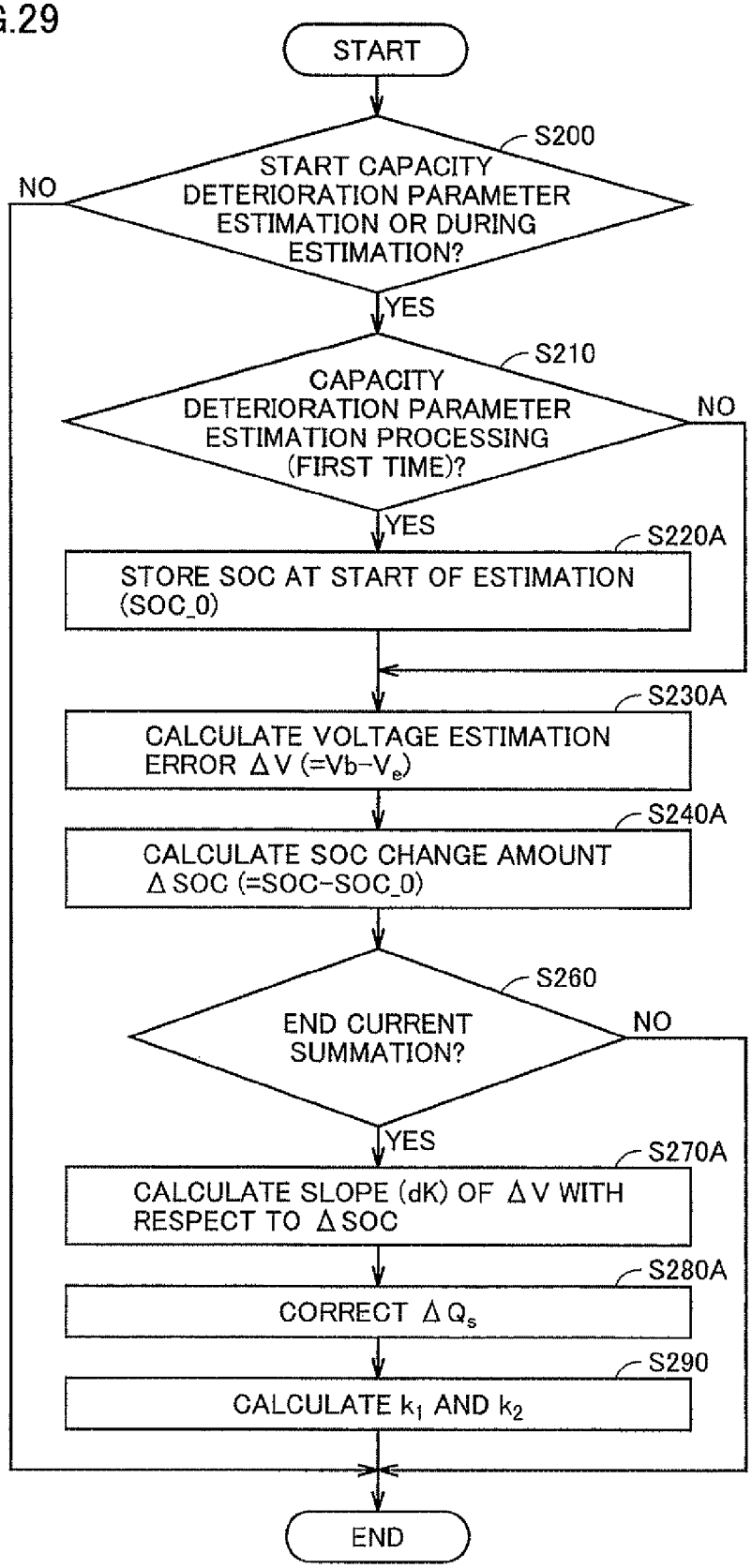
FIG. 29 is a flowchart illustrating processing for estimating the capacity deterioration parameter by a parameter estimating unit 130A.

FIG. 29 is a flowchart illustrating processing for estimating the capacity deterioration parameter by parameter estimating unit 130A. It is to be noted that ECU 100 calls and executes the processing shown in this flowchart in every predetermined arithmetic cycle. The processing in the flowchart in FIG. 29 is different from the processing in the flowchart in FIG. 17 in that processing in steps S220A to S240A is executed instead of the processing in steps S220 to S250 and in that processing in steps S270A and S280A is executed instead of the processing in steps S270 and S280, respectively. Processing in the remaining steps is similar to the processing in the flowchart in FIG. 17. Therefore, with regard to the flowchart in FIG. 29, differences from the flowchart in FIG. 17 will be mainly described and a detailed description of similarities to the flowchart in FIG. 17 will not be repeated hereinafter.

Referring to FIG. 29, in step S200, parameter estimating unit 130A determines start of estimation of the capacity deterioration parameter. A condition for this determination is satisfied if the vehicle has traveled the predetermined distance after the previous estimation processing ended and if the estimated SOC value falls within predetermined SOC range A1, or if the predetermined time has elapsed since the previous estimation processing ended and if the estimated SOC value falls within SOC range A1 described above. However, determination as to whether or not the secondary battery is in a relaxed state may be added to the condition.

In step S210, parameter estimating unit 130A determines whether or not the present processing is executed at the start of the processing for estimating the capacity deterioration parameter. If the present processing is executed at the start of the estimation processing (YES in step S210), parameter estimating unit 130A determines whether or not the present processing is the first estimation processing after initialization of the battery model. If the present estimation processing is the first processing (YES in step S210), parameter estimating unit 130A stores an estimated SOC value (SOC_0) at the start of estimation in step S220A. If the present processing is not executed at the start of the estimation processing (NO in step S210), the processing proceeds to step S230A.

Next, in step S230A, parameter estimating unit 130A calculates voltage estimation error ΔV, which is a difference between estimated battery voltage value $V_e$ and battery voltage Vb measured by voltage sensor 30. Subsequently, in step S240A, parameter estimating unit 130A calculates SOC change amount ΔSOC (=SOC–SOC_0), which is a difference between the present estimated SOC value and the estimated SOC value at the start of estimation.

In step S260, parameter estimating unit 130A determines whether or not current summation for estimating the capacity deterioration parameter ends. If current summation ends (YES in step S260), parameter estimating unit 130A calculates dK, which is a slope of voltage estimation error ΔV with respect to SOC change amount ΔSOC in step S270A. The method of least squares can be applied as well, as the method of calculating this slope dK.

In step S280A, parameter estimating unit 130A corrects positive and negative electrode compositions correspondence offset capacity $\Delta Q_s$ according to the following equation (32) such that slope dK becomes small.

[equation 25]

$$\Delta Q_s(\text{after correction}) = \Delta Q_s(\text{previous value}) + \alpha_v \times dK_v \tag{32}$$

Here, $\alpha_v$ is a correction coefficient and a constant. As in the first embodiment, when the secondary battery is in the initial state (the secondary battery is not deteriorated), correction of positive and negative electrode compositions correspondence offset capacity $\Delta Q_s$ starts, assuming that $\Delta Q_s=0$ (that is, there is no offset of the correspondence between the composition of the positive electrode and the composition of the negative electrode).

Next, in step S290, parameter estimating unit 130A calculates $k_1$ and $k_2$ from $\Delta Q_s$ calculated in step S280A, according to the map or the equations (26) and (27).

As described above, according to the second embodiment, the capacity deterioration parameter can be accurately estimated, and the open-circuit voltage characteristics and the full charge capacity can be accurately estimated as in the first embodiment.

Third Embodiment

It is preferable to estimate the capacity deterioration parameter on a regular basis and reflect the estimated capacity deterioration parameter in the battery model in order to determine the deterioration state of the battery or to maintain the estimation accuracy of the SOC in the deteriorated battery. In addition, it is preferable to make sufficiently large a shift width of the SOC for calculating current summation estimation error $\Delta S_i$ in order to accurately estimate the capacity deterioration parameter described in the first embodiment.

In the hybrid vehicle or the electric vehicle, however, charging and discharging of the secondary battery are repeated, and thus, the SOC of the secondary battery is often controlled to approach a predetermined control center SOC. Therefore, the SOC changes considerably only when the vehicle traveling load is large.

Therefore, even if the state estimating device according to the present embodiment tries to estimate the capacity deterioration parameter while the hybrid vehicle (or may be the electric vehicle) is traveling, an opportunity to satisfy the conditions for estimation may not be obtained. In the third embodiment, control of shifting the SOC is performed to reliably estimate the capacity deterioration parameter.

Figure 30:
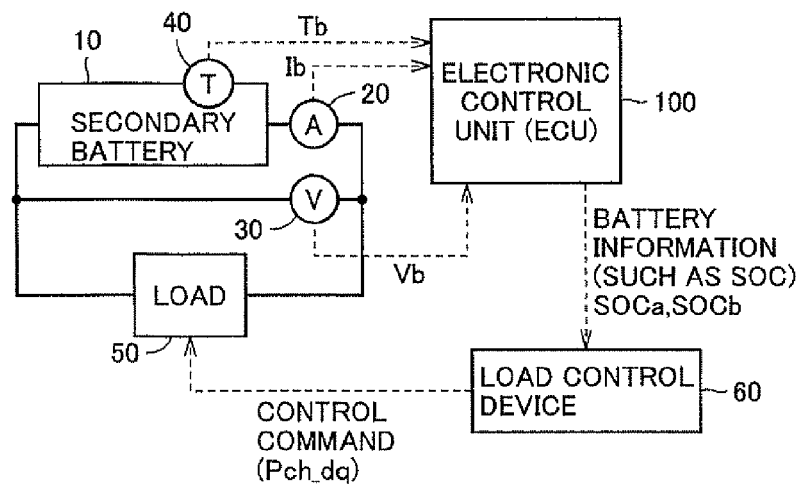
FIG. 30 is a block diagram illustrating SOC shift control in the power supply system shown in FIG. 1.
Figure 31:
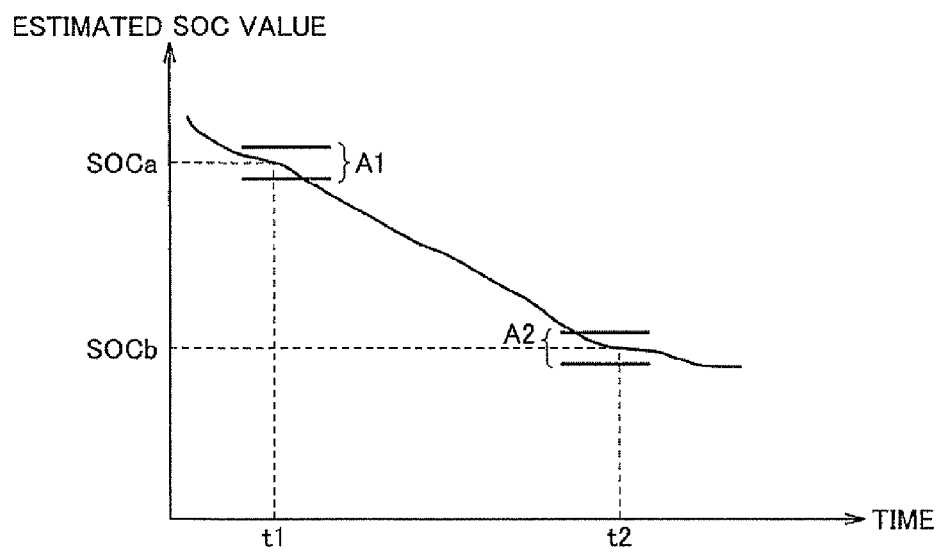
FIG. 31 is a conceptual diagram of the SOC shift control for estimating the capacity deterioration parameter.

FIG. 30 is a block diagram illustrating SOC shift control in the power supply system shown in FIG. 1. FIG. 31 is a conceptual diagram of the SOC shift control for estimating the capacity deterioration parameter. Referring to FIGS. 30 and 31, in this control, ECU 100 first determines whether or not the SOC of secondary battery 10 has reached a predetermined value SOCa.

When the SOC has reached predetermined value SOCa, ECU 100 sets a target value of the SOC to SOCb. Load control device 60 receives the present SOC of the secondary battery (predetermined value SOCa) and target value SOCb from ECU 100. Load control device 60 sets a charge/discharge request amount Pchg_dq of secondary battery 10 such that the SOC of secondary battery 10 approaches target value SOCb from predetermined value SOCa.

If predetermined value SOCa is larger than target value SOCb, a value for discharging the secondary battery is set as charge/discharge request amount Pchg_dq. On the other hand, if target value SOCb is larger than predetermined value SOCa, a value for charging the secondary battery is set as charge/discharge request amount Pchg_dq. For example, when secondary battery 10 is discharged, charge/discharge request amount Pchg_dq is set to a positive value, and when secondary battery 10 is charged, charge/discharge request amount Pchg_dq is set to a negative value.

Load control device 60 controls load 50 to take out electric power satisfying charge/discharge request amount Pchg_dq from secondary battery 10 or supply the electric power to secondary battery 10.

Predetermined value SOCa and target value SOCb are set to fall within SOC range A1 and SOC range A2 described in the first embodiment, respectively. More preferably, as shown in FIG. 31, predetermined value SOCa is set to a value larger than target value SOCb. By setting predetermined value SOCa and target value SOCb in such a manner, the secondary battery is discharged, load 50 is driven, and the SOC changes between SOC range A1 and SOC range A2.

By performing the above SOC shift control when the secondary battery is discharged, the SOC can be shifted while load 50 (electric motor for causing the vehicle to travel) causes the vehicle to travel. That is to say, even if the SOC is shifted, an influence on traveling of the vehicle (changes in behaviors of the vehicle) can be reduced. As a result, worsening of ride quality and fuel economy in the hybrid vehicle can be suppressed and the SOC can be shifted independently of the vehicle traveling conditions.

In addition, when the charging rate is brought close to the target charging rate by charging the secondary battery, there is a problem that it takes time to bring the SOC close to the target value. This is because the secondary battery tends to be discharged in the vehicle traveling conditions such as the conditions for traveling in which the vehicle accelerates many times or traveling in which large vehicle power is required such as climbing a slope, for example. By performing control of bringing the SOC close to the target value by discharging the battery (decreasing the charging rate), such a problem can be avoided.

It is to be noted that various known techniques can be applied as a method of controlling the charge/discharge request amount using feedback control such that the SOC of the battery approaches the predetermined control center SOC in an electric vehicle such as the hybrid vehicle, and thus, a detailed description thereof will not be repeated here.

Finally, ECU 100 determines whether or not the SOC of secondary battery 10 has reached target value SOCb. When the SOC has reached target value SOCb, this control processing ends.

Figure 32:
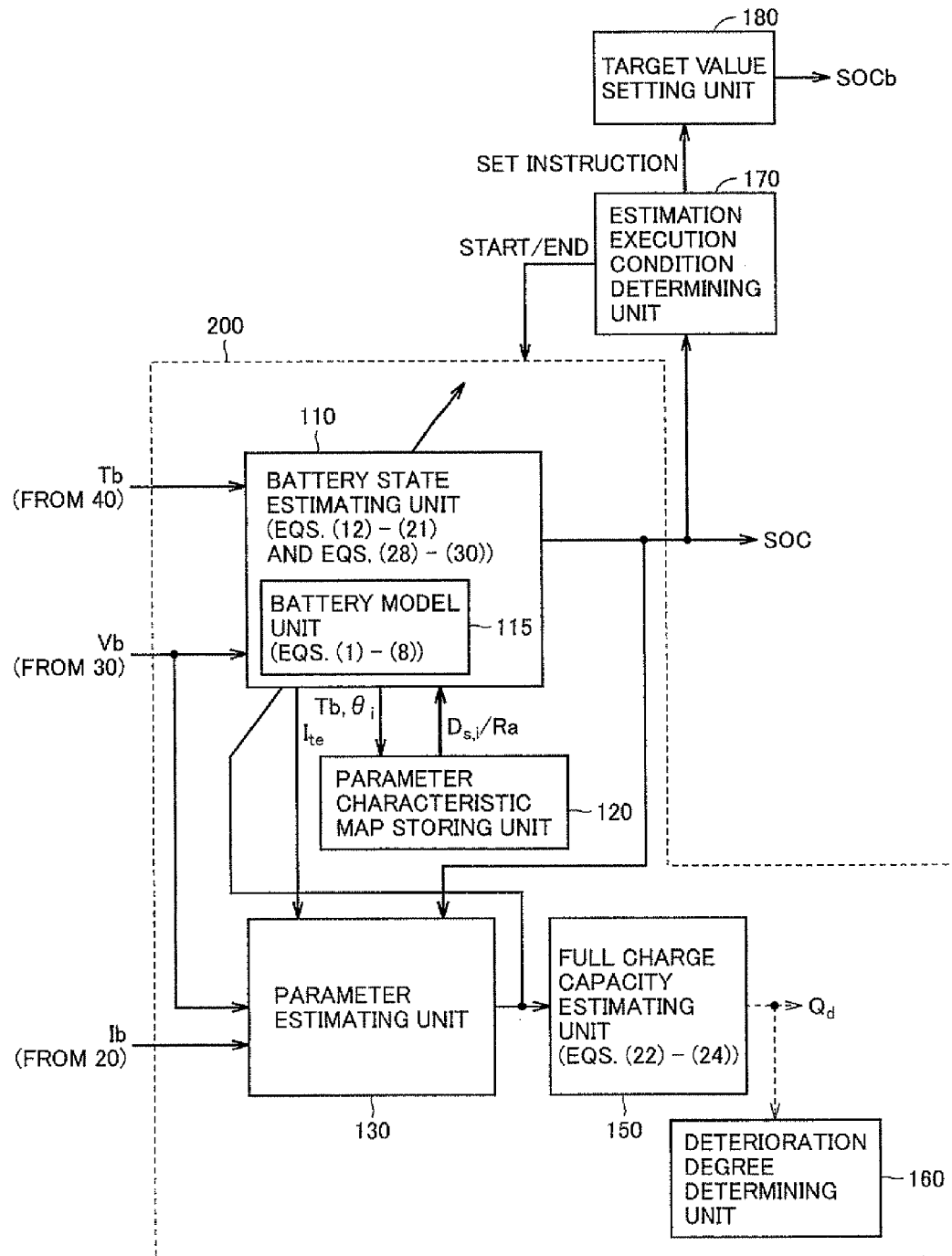
FIG. 32 is a block diagram illustrating estimation of the capacity deterioration parameter and the SOC shift control according to a third embodiment.

FIG. 32 is a block diagram illustrating estimation of the capacity deterioration parameter and the SOC shift control according to the third embodiment.

Referring to FIGS. 32 and 12, a structure related to estimation of the capacity deterioration parameter in the third embodiment is similar to the structure in the first embodiment. This portion is expressed as "capacity deterioration estimating unit 200" in FIG. 32. The third embodiment is different from the first embodiment in that an estimation execution condition determining unit 170 and a target value setting unit 180 are further added for the SOC shift control.

Estimation execution condition determining unit 170 receives the estimated SOC value from capacity deterioration estimating unit 200, and determines whether or not the estimated value is predetermined value SOCa. If the estimated SOC value is predetermined value SOCa, estimation execution condition determining unit 170 provides an instruction to start estimation to capacity deterioration estimating unit 200 (specifically, battery state estimating unit 110). In this case, battery state estimating unit 110 starts to calculate current summation estimation error $\Delta S_i$, which is an estimation error, that is, a difference between a summed value of an actual current value and a summed value of an estimated current.

Estimation execution condition determining unit 170 further sends an instruction to set a target value to target value setting unit 180. Target value setting unit 180 outputs target value SOCb of the SOC in response to the set instruction from estimation execution condition determining unit 170.

After estimation execution condition determining unit 170 provides the instruction to start estimation to capacity deterioration estimating unit 200, estimation execution condition determining unit 170 obtains the estimated SOC value from capacity deterioration estimating unit 200 in a predetermined cycle. When the estimated SOC value has reached target value SOCb, estimation execution condition determining unit 170 provides an instruction to end calculation of current summation estimation error $\Delta S_i$ to capacity deterioration estimating unit 200 (specifically, battery state estimating unit 110).

Capacity deterioration estimating unit 200 estimates the capacity deterioration parameter, the charging rate, the open-circuit voltage, the battery current (or the battery voltage and the like). Estimation of these will be simply referred to as "estimation of the state of the secondary battery" hereinafter.

Battery state estimating unit 110 starts processing shown in the flowchart in FIG. 17 in response to the start instruction from estimation execution condition determining unit 170. Further, in step S260 in FIG. 17, battery state estimating unit 110 determines that current summation ends, in response to the end instruction from estimation execution condition determining unit 170.

As described above, according to the third embodiment, by performing control of changing the SOC positively, the capacity deterioration parameter can be reliably estimated. As a result, an opportunity to accurately estimate the open-circuit voltage characteristics and the full charge capacity can be created.

It is to be noted that a structure for implementing the SOC shift control is not limited to the structure shown in FIG. 32. Modifications of the SOC shift control according to the third embodiment will be described hereinafter with reference to FIGS. 33 to 36.

Figure 33:
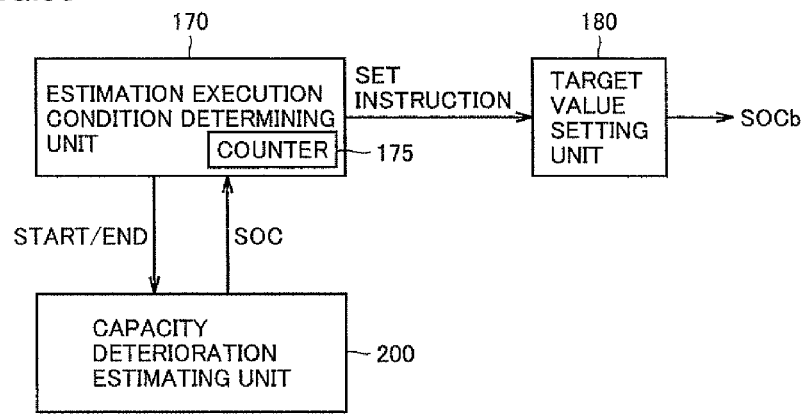
FIG. 33 is a block diagram showing a first modification of the SOC shift control according to the third embodiment.

Referring to FIG. 33, estimation execution condition determining unit 170 includes a counter 175 for measuring a time that has elapsed since the previous estimation was executed. If the time that has elapsed since the previous estimation was executed, which is measured by counter 175, is equal to or longer than a predetermined time, estimation execution condition determining unit 170 provides the start instruction to capacity deterioration estimating unit 200, and sends an instruction to start estimation of the state of the secondary battery to capacity deterioration estimating unit 200.

Figure 34:
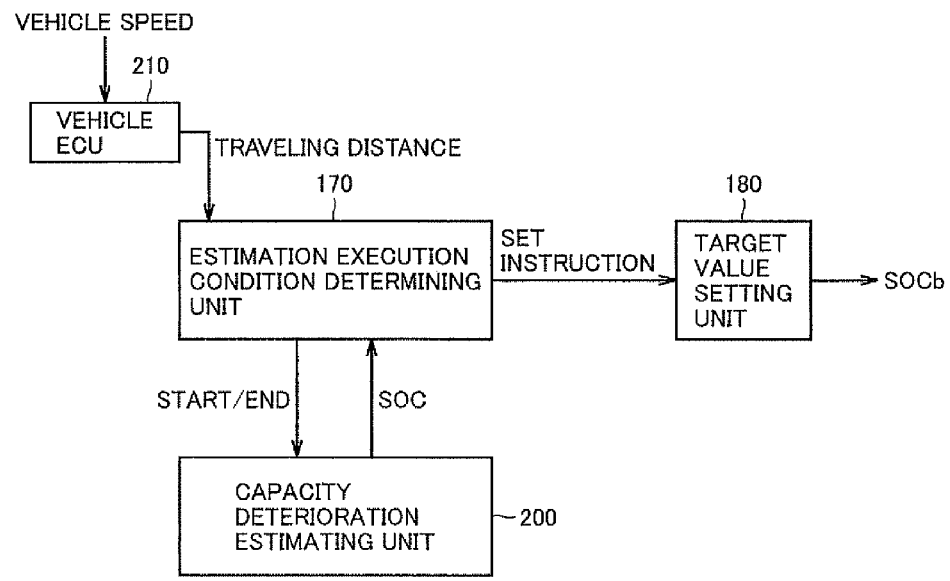
FIG. 34 is a block diagram showing a second modification of the SOC shift control according to the third embodiment.

Referring to FIG. 34, estimation execution condition determining unit 170 obtains information of a distance traveled by the hybrid vehicle from a vehicle ECU 210 for controlling the entire operation of the hybrid vehicle. For example, vehicle ECU 210 calculates the traveling distance of the hybrid vehicle (the distance traveled by the hybrid vehicle by driving of the electric motor for causing the vehicle to travel) from the vehicle speed and the time. If the traveling distance of the hybrid vehicle after the previous estimation was executed is equal to or longer than a predetermined distance, estimation execution condition determining unit 170 sends the instruction to start estimation of the state of the secondary battery to capacity deterioration estimating unit 200.

By setting the conditions for starting estimation based on the traveling time and the traveling distance of the hybrid vehicle in such a manner, the charging rate can be controlled on a regular basis. As a result, the open-circuit voltage characteristics and the full charge capacity that have changed due to capacity deterioration can be reliably estimated. In addition, calculation of the speed of a reduction in full charge capacity due to deterioration of the secondary battery is facilitated.

Figure 35:
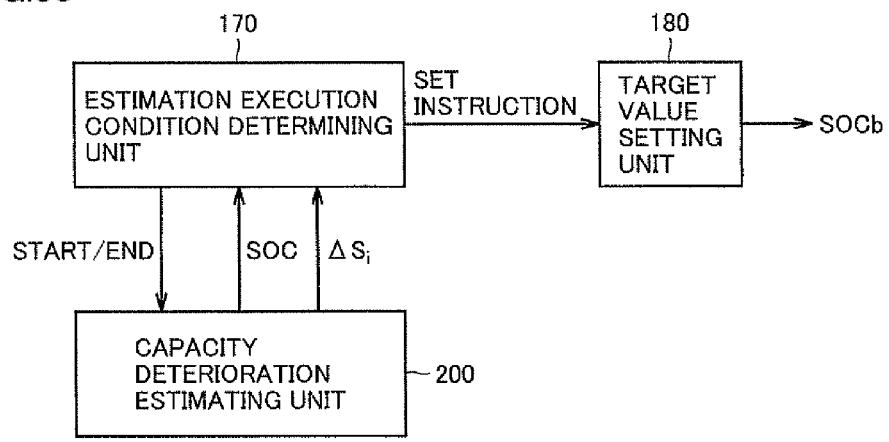
FIG. 35 is a block diagram showing a third modification of the SOC shift control according to the third embodiment.

Referring to FIG. 35, estimation execution condition determining unit 170 obtains, from capacity deterioration estimating unit 200, the estimated SOC value and current summation estimation error $\Delta S_i$, which is a difference between a summed value of an actual current value measured by the current sensor and a summed value of an estimated current estimated by the battery model. If current summation estimation error $\Delta S_i$ during a change in estimated SOC value by a predetermined amount is equal to or larger than a predetermined amount, estimation execution condition determining unit 170 sends the instruction to start estimation of the state of the secondary battery to capacity deterioration estimating unit 200. By setting the conditions for starting estimation in such a manner, estimation of the capacity deterioration parameter when capacity deterioration proceeds can be reliably executed. When the battery capacity is reduced and the open-circuit voltage characteristics change due to deterioration, the current summation estimation error during changes in charging rate by a predetermined amount also becomes large. Therefore, in such a case, the open-circuit voltage characteristics and the full charge capacity can be estimated, and thus, deterioration of the battery capacity can be reliably grasped and the state of the secondary battery can be estimated.

Figure 36:
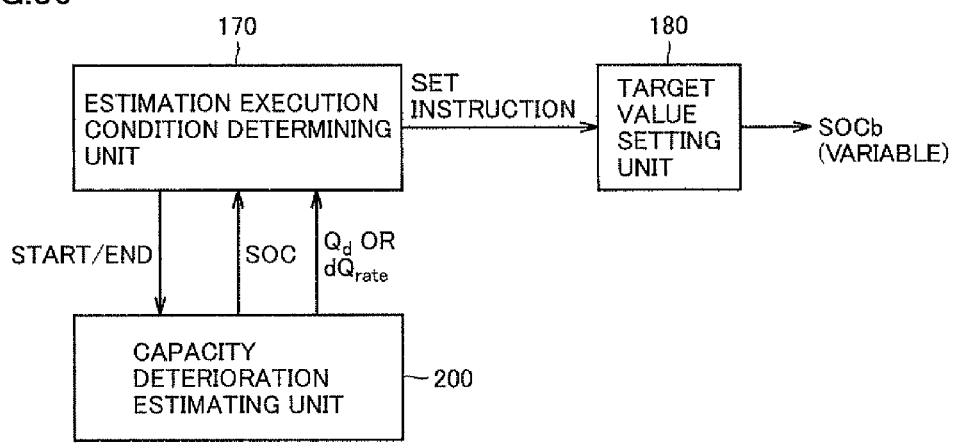
FIG. 36 is a block diagram showing a fourth modification of the SOC shift control according to the third embodiment.

Referring to FIG. 36, if full charge capacity $Q_d$ of the secondary battery is equal to or smaller than a reference value or if the estimated value of full charge capacity maintenance rate $dQ_{rate}$ is equal to or smaller than a reference value, estimation execution condition determining unit 170 makes the amount of change in charging rate large by making target value SOCb smaller. In other words, in the present modification, target value SOCb is a variable amount. By making the amount of change in charging rate large, a certain level of current summation estimation error $\Delta S_i$ can be ensured even in the secondary battery whose capacity has decreased significantly, and thus, slope dK can be accurately calculated. As a result, the capacity deterioration parameter can be accurately estimated.

It is preferable to perform the SOC shift control when the secondary battery is discharged in all of the structures shown in FIGS. 34 to 36. Reasons for this is as described above, and thus, a description thereof will not be repeated here. In addition, the structure shown in FIG. 36 can be combined with the structures shown in FIGS. 33 to 35. In other words, in the structures shown in FIGS. 33 to 35, if full charge capacity $Q_d$ of the secondary battery is equal to or smaller than the reference value or if the estimated value of full charge capacity maintenance rate $dQ_{rate}$ is equal to or smaller than the reference value, estimation execution condition determining unit 170 may set target value SOCb to a smaller value.

In addition, in the structures shown in FIGS. 33 to 36, if charge/discharge electric power of the secondary battery exceeds a certain reference value, estimation execution condition determining unit 170 ends estimation of the capacity deterioration parameter by capacity deterioration estimating unit 200. If shift control of the charging rate continues when the battery load is large, reliable shift of the charging rate to the target value may become difficult. In such a case, by discontinuing the charging rate control, the above problem can be avoided.

Figure 37:
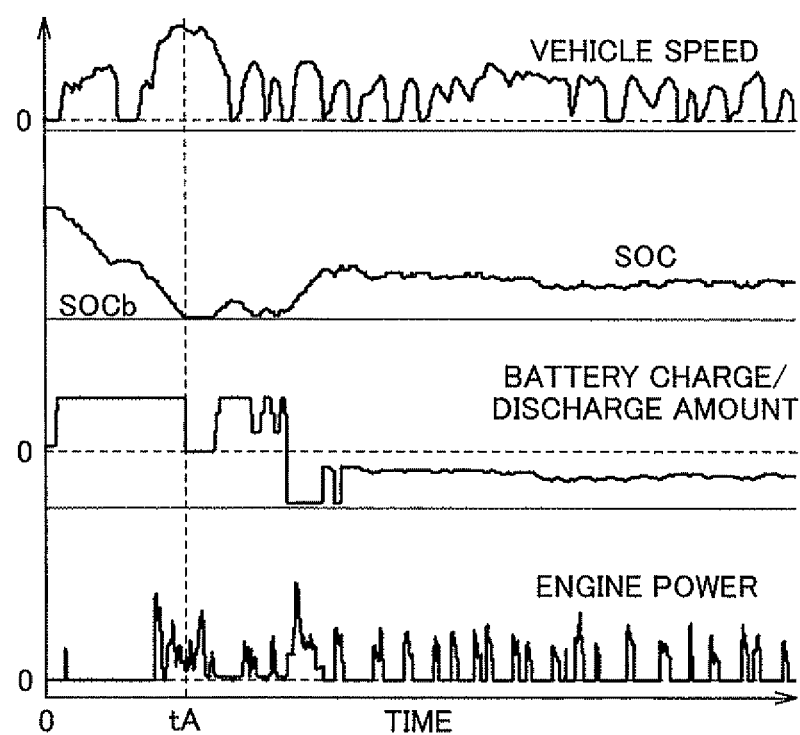
FIG. 37 is a diagram showing an example of experimental data of the SOC shift control for estimating the capacity deterioration parameter according to the present embodiment.

FIG. 37 is a diagram showing an example of experimental data of the SOC shift control for estimating the capacity deterioration parameter according to the present embodiment. FIG. 37 shows temporal transition of the vehicle speed, the SOC, the battery charge/discharge amount, and the engine power from a point in time when an experiment starts. It can be seen that the SOC shifts from an initial value to target value SOCb between the point in time when the experiment starts (indicated with "0" in the horizontal axis) and time to by controlling the battery charge/discharge amount. By shifting the SOC to target value SOCb in such a manner, an opportunity to estimate the capacity deterioration parameter can be reliably obtained. Therefore, the estimation accuracy of the SOC can be maintained even in the deteriorated battery. In addition, since changes in full charge capacity can be estimated, the deterioration state of the battery can be reliably determined.

Although the structure of capacity deterioration estimating unit 200 is similar to the structure shown in FIG. 12 in the above description, the structure of capacity deterioration estimating unit 200 may be similar to the structure shown in FIG. 26 (the second embodiment). In this case, in the structure in FIG. 35, for example, current summation estimation error $\Delta S$ may be replaced with difference $\Delta V$ between estimated battery voltage value $V_e$ and measured battery voltage value Vb.

Fourth Embodiment

In a fourth embodiment, a method of estimating the full charge capacity and a method of modeling the open-circuit voltage characteristics when the battery is deteriorated are similar to the methods shown in the first embodiment. The fourth embodiment is different from the first embodiment in terms of the method of calculating the capacity deterioration parameter (that is, positive and negative electrode compositions correspondence offset capacity $\Delta Q_s$, positive electrode capacity maintenance rate $k_1$ and negative electrode capacity maintenance rate $k_2$).

Figure 38:
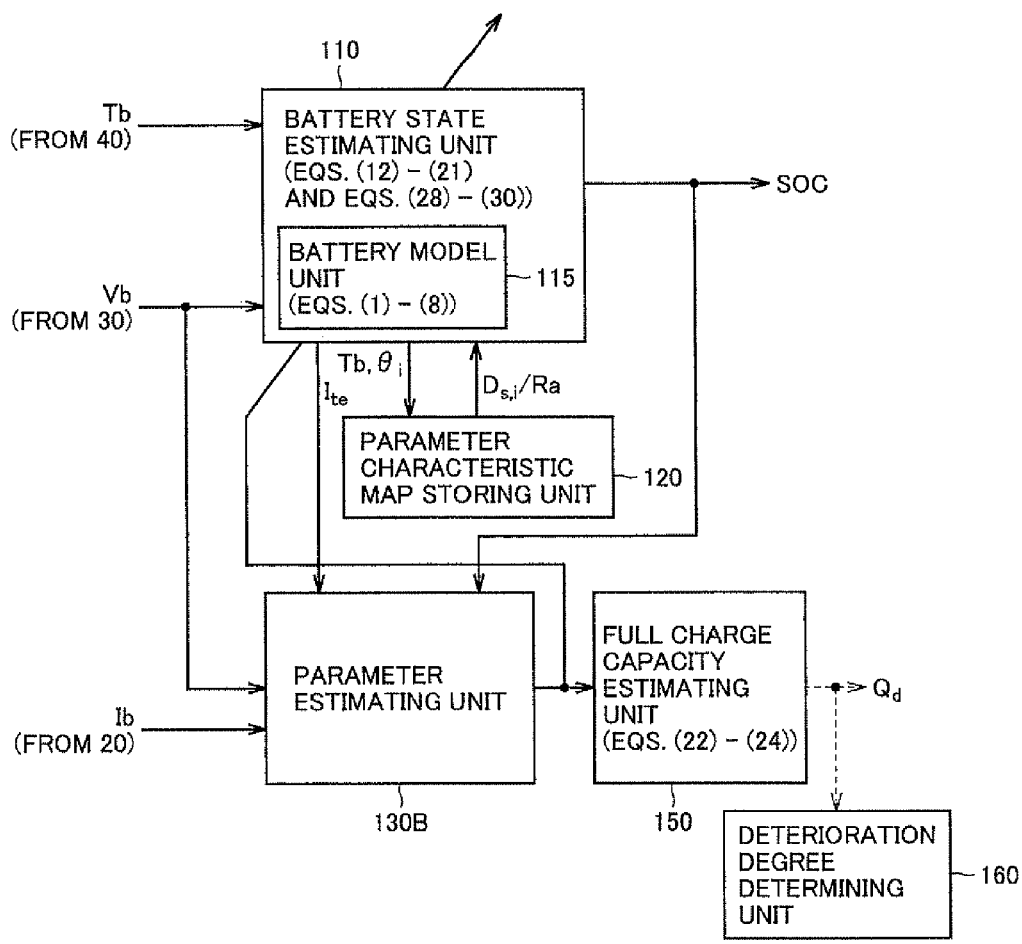
FIG. 38 is a block diagram showing a structure for estimating deterioration of the battery capacity according to a fourth embodiment.

FIG. 38 is a block diagram showing a structure for estimating deterioration of the battery capacity according to the fourth embodiment. Referring to FIG. 38, a battery state estimating unit 130B estimates the capacity deterioration parameter by executing search processing described below. The structure of the remaining portions shown in FIG. 38 is similar to the structure of the corresponding portions in FIG. 12, and thus, a description thereof will not be repeated in the following.

Figure 39:
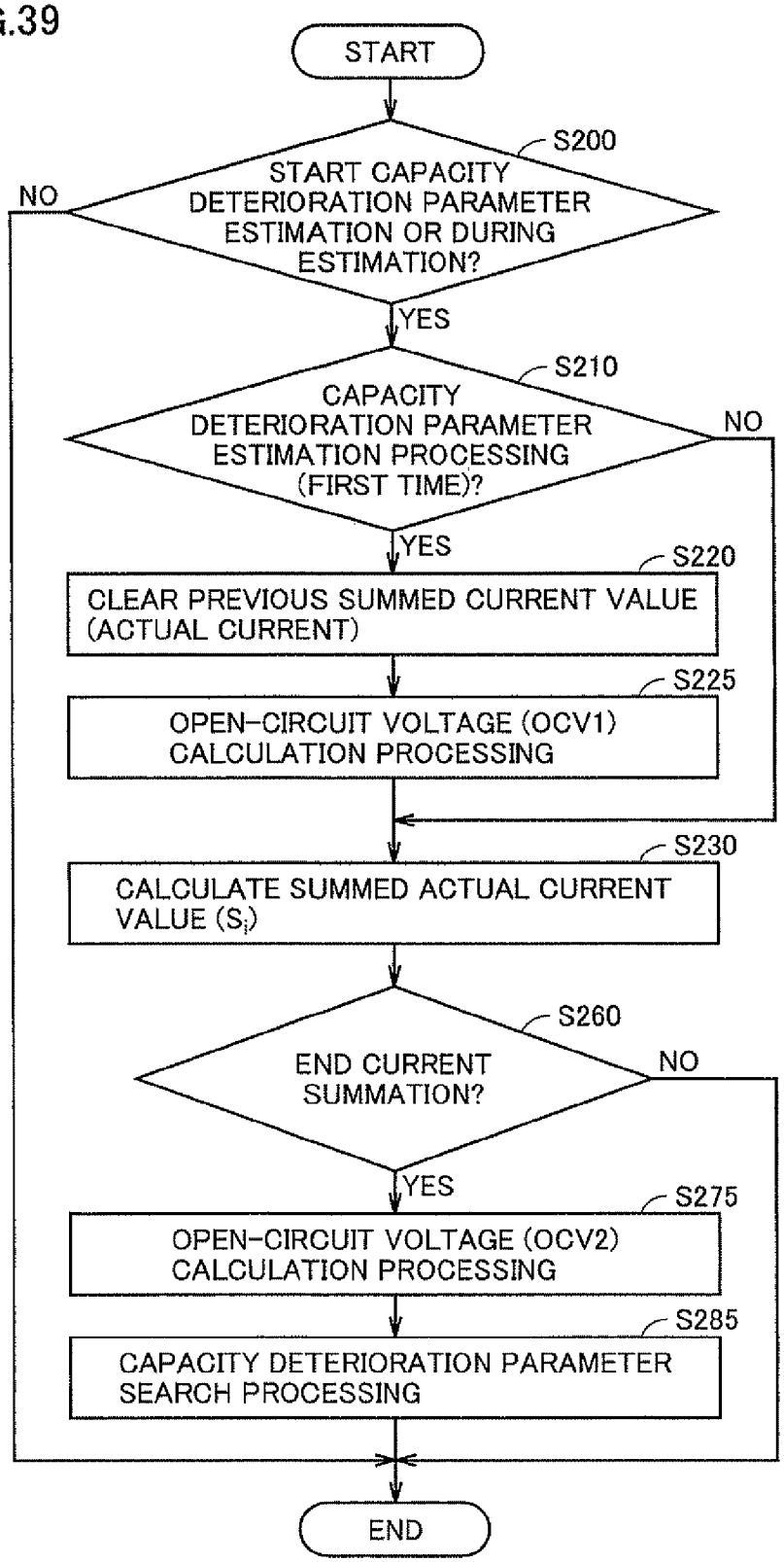
FIG. 39 is a flowchart illustrating processing for estimating the capacity deterioration parameter by a parameter estimating unit 130B.

FIG. 39 is a flowchart illustrating processing for estimating the capacity deterioration parameter by parameter estimating unit 130B. It is to be noted that ECU 100 shown in FIG. 1 calls and executes the processing shown in this flowchart in every predetermined arithmetic cycle. Although the flowchart in FIG. 39 is substantially similar to the flowchart in FIG. 17, the flowchart in FIG. 39 is different from the flowchart in FIG. 17 in that processing in step S225 is executed after the processing in step S220, the processing in steps S240 and S250 is not executed, processing in step S275 is executed instead of the processing in step S270, and processing in step S285 is executed instead of the processing in steps S280 and S290. With regard to the flowchart in FIG. 39, differences from the flowchart in FIG. 17 will be mainly described and a detailed description of similarities to the flowchart in FIG. 17 will not be repeated hereinafter.

Referring to FIGS. 39 and 38, in step S200, parameter estimating unit 130B determines start of estimation of the capacity deterioration parameter. Specifically, if the vehicle has traveled the predetermined distance or the predetermined time has elapsed since the previous estimation processing ended, and if the estimated SOC value is within the predetermined range (within SOC range A1 shown in FIG. 14), and if the secondary battery is in a relaxed state, parameter estimating unit 130B starts estimation. Here, conditions for determining that the battery is relaxed include, for example, a condition that a maximum concentration difference of the lithium ion concentration in the active material in the battery model is equal to or smaller than a predetermined concentration difference and an absolute value of the battery current is equal to or smaller than a predetermined value.

In step S210, parameter estimating unit 130B determines whether or not the present processing is executed at the start of the processing for estimating the capacity deterioration parameter. If the present processing is executed at the start of the estimation processing (YES in step S210), parameter estimating unit 130 clears a previous summed current value (summed actual current value $S_i$) in step S220. In this case, the processing proceeds to step S225. On the other hand, if the present processing is not executed at the start of the estimation processing (NO in step S210), the processing proceeds to step S230.

In step S225, parameter estimating unit 130B estimates an open-circuit voltage OCV1. Parameter estimating unit 130B calculates open-circuit voltage OCV1 according to the following equation (33):

[equation 26]

$$OCV = V + R_a(\theta_1, \theta_2, T) \times I \tag{33}$$

Here, V represents the measured battery voltage value, I represents the estimated battery current value, and $R_a$ represents the DC resistance. Estimated battery current value I and DC resistance R, are values obtained by the battery model for estimating the charging rate based on the battery voltage and the battery temperature.

Next, in step S230, parameter estimating unit 130B calculates summed actual current value $S_i$ using battery current Ib measured by current sensor 20. In step S260, parameter estimating unit 130 determines whether or not current summation for estimating the capacity deterioration parameter ends. Specifically, if the estimated SOC value is within the range different from the SOC range when current summation starts (within SOC range A2 shown in FIG. 14) and if the secondary battery is relaxed, parameter estimating unit 130B ends current summation. If current summation ends (YES in step S260), parameter estimating unit 130B calculates an open-circuit voltage OCV2 by substituting the measured battery voltage value, the estimated battery current value and the DC resistance value into the equation (33) in step S275.

Subsequently, in step S285, parameter estimating unit 130B executes search processing for calculating an optimum solution of the capacity deterioration parameter (positive and negative electrode compositions correspondence offset capacity $\Delta Q_s$, positive electrode capacity maintenance rate $k_1$ and negative electrode capacity maintenance rate $k_2$) based on calculated open-circuit voltages OCV1, OCV2 and calculated summed actual current value $S_i$. This search processing will be detailed hereinafter.

Figure 40:
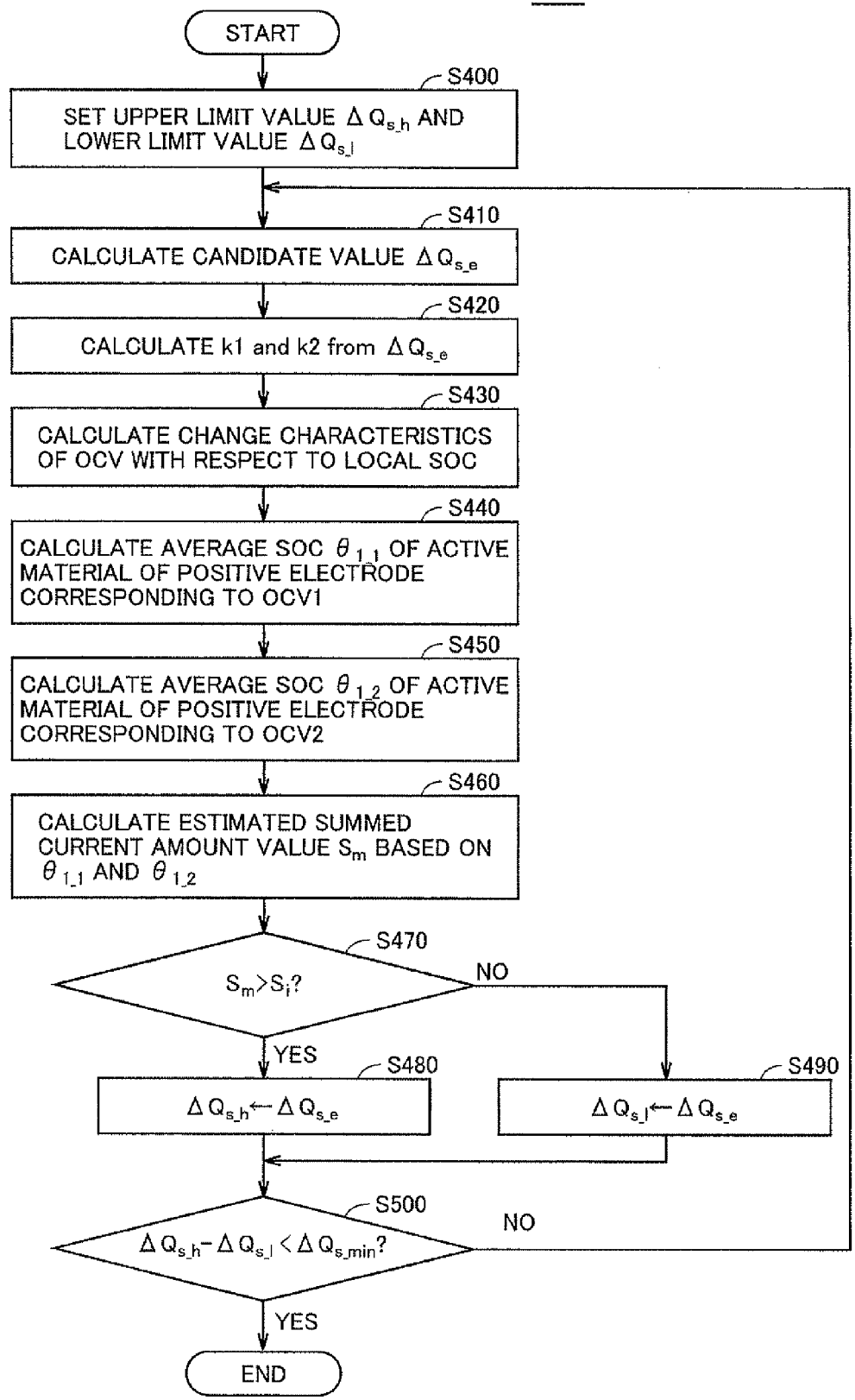
FIG. 40 is a flowchart illustrating in detail search processing in step S285 shown in FIG. 39.

FIG. 40 is a flowchart illustrating in detail the search processing in step S285 shown in FIG. 39. Referring to FIG. 40, in step S400, parameter estimating unit 130B sets an upper limit value $\Delta Q_{s\_h}$ and a lower limit value $\Delta Q_{s\_1}$ of positive and negative electrode compositions correspondence offset capacity $\Delta Q_{s\_1}$ for calculating optimum positive and negative electrode compositions correspondence offset capacity $\Delta Q_s$. At the first processing for searching positive and negative electrode compositions correspondence offset capacity $\Delta Q_s$, upper limit value $\Delta Q_{s\_h}$ and lower limit value $\Delta Q_{s\_1}$ are predetermined values.

In step S410, parameter estimating unit 130B calculates a candidate value $\Delta Q_{s\_e}$ of positive and negative electrode compositions correspondence offset capacity $\Delta Q_s$ that is within the range between upper limit value $\Delta Q_{s\_h}$ and lower limit value $\Delta Q_{s\_1}$. For example, parameter estimating unit 130B calculates, as the candidate value, an intermediate value between upper limit value $\Delta Q_{s\_h}$ and lower limit value $\Delta Q_{s\_1}$.

In step S420, parameter estimating unit 130B calculates positive electrode capacity maintenance rate $k_1$ and negative electrode capacity maintenance rate $k_2$ from present candidate value $\Delta Q_{s\_e}$ of positive and negative electrode compositions correspondence offset capacity $\Delta Q_s$. This processing is similar to the processing in step S290 in FIG. 17. Parameter estimating unit 130B may calculate $k_1$ and $k_2$ from $\Delta Q_s$ using the map or may calculate $k_1$ and $k_2$ from $\Delta Q_s$ according to the equations (26) and (27).

Figure 18:
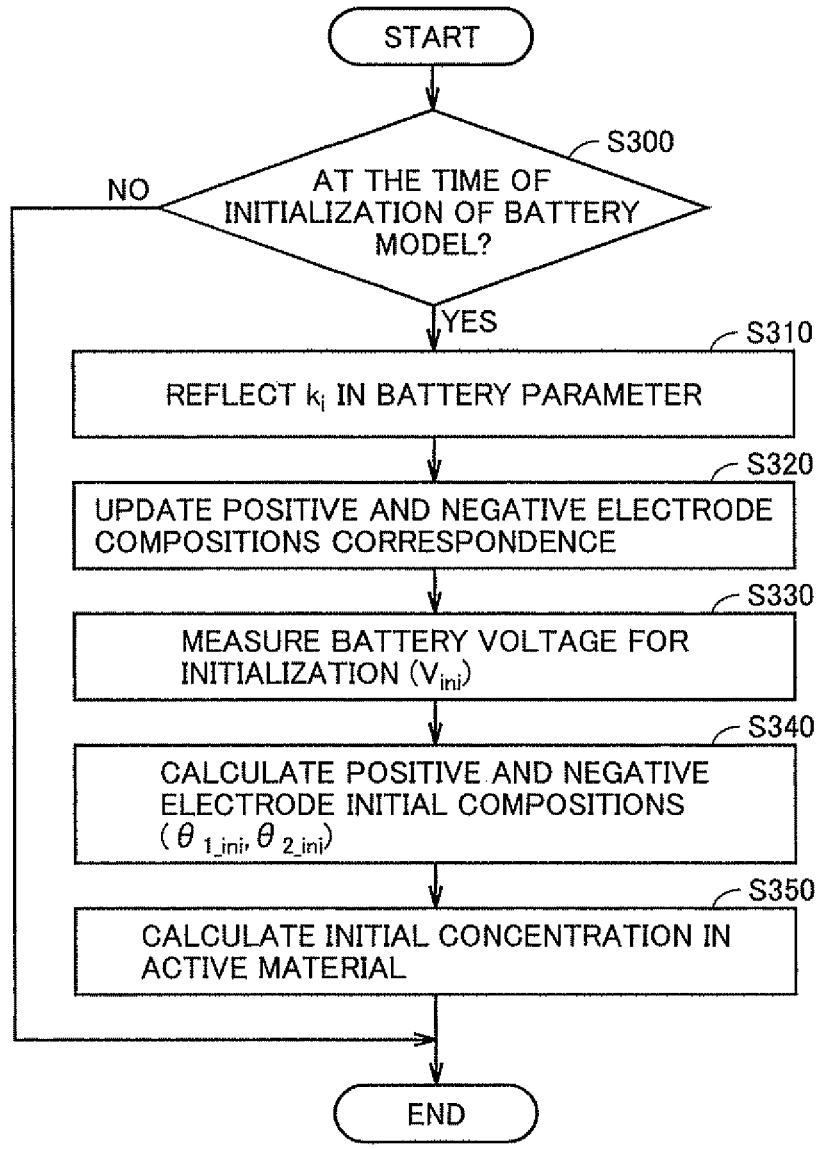
FIG. 18 is a flowchart illustrating processing for reflecting the capacity deterioration parameter in the battery model, which is executed by a battery state estimating unit 110 at the time of initialization of the battery model.

In step S430, parameter estimating unit 130B executes processing in accordance with the flowchart in FIG. 18, based on $\Delta Q_s$, $k_1$ and $k_2$ calculated by the processing in the above steps S400 to S420. As a result, the change characteristics of the open-circuit voltage with respect to local SOC $\theta_i$ are calculated.

In step S440, parameter estimating unit 130B calculates the average charging rate (average SOC $\theta_{1\_1}$) in the active material of the positive electrode corresponding to open-circuit voltage OCV1, based on the change characteristics of the open-circuit voltage (calculated in step S430) and open-circuit voltage OCV1 calculated at the start of current summation. Similarly, in step S450, parameter estimating unit 130B calculates the average charging rate (average SOC $\theta_{1\_2}$) in the active material of the positive electrode corresponding to open-circuit voltage OCV2, based on the change characteristics of the open-circuit voltage (calculated in step S430) and open-circuit voltage OCV2 calculated at the end of current summation.

In step S460, parameter estimating unit 130B estimates, on the battery model, the summed value of the battery current that must flow in order that the open-circuit voltage changes from OCV1 to OCV2, based on calculated average SOCs $\theta_{1\_1}$ and $\theta_{1\_2}$. Parameter estimating unit 130B calculates an estimated summed current amount value $S_m$ using the following equation (34). In the equation (34), S represents the plate area.

[equation 27]

$$S_m = (\theta_{1\_2} - \theta_{1\_1}) c_{s,1,max} L_1 \epsilon_{s,1} FS \tag{34}$$

In step S470, parameter estimating unit 130B compares estimated summed current amount value $S_m$ and summed actual current value $S_i$ (see step S230 in FIG. 39). If estimated summed current amount value $S_m$ is larger than summed actual current value $S_i$ (YES in step S470), parameter estimating unit 130B replaces upper limit value $\Delta Q_{s\_h}$ in the next calculation of positive and negative electrode compositions correspondence offset capacity $\Delta Q_s$ with present candidate value $\Delta Q_{s\_e}$ of the positive and negative electrode compositions correspondence offset capacity in step S480. That is to say, parameter estimating unit 130B narrows the search range of candidate value $\Delta Q_{s\_e}$ in the next search processing to the range from $\Delta Q_{s\_l}$ to $\Delta Q_{s\_e}$.

On the other hand, if estimated summed current amount value $S_m$ is smaller than summed actual current value $S_i$ (NO in step S470), parameter estimating unit 130B replaces lower limit value $\Delta Q_{s\_l}$ in the next calculation of positive and negative electrode compositions correspondence offset capacity $\Delta Q_s$ with present candidate value $\Delta Q_{s\_e}$ of the positive and negative electrode compositions correspondence offset capacity in step S490. That is to say, parameter estimating unit 130B narrows the search range of candidate value $\Delta Q_{s\_e}$ in the next search processing to the range from $\Delta Q_{s\_e}$ to $\Delta Q_{s\_h}$.

When the processing in step S480 or S490 ends, parameter estimating unit 130B determines whether or not a difference $(\Delta Q_{s\_h} - \Delta Q_{s\_l})$ between upper limit value $\Delta Q_{s\_h}$ and lower limit value $\Delta Q_{s\_l}$ is smaller than a predetermined value $\Delta Q_{s\_min}$ in step S500. If the value of $(\Delta Q_{s\_h} - \Delta Q_{s\_l})$ is smaller than predetermined value $\Delta Q_{s\_min}$ (YES in step S500), the overall processing ends. Therefore, the processing in step S285 ends. Returning to FIG. 39, when the processing in step S285 ends, the overall processing ends. On the other hand, if the value of $(\Delta Q_{s\_h} - \Delta Q_{s\_l})$ is equal to or larger than predetermined value $\Delta Q_{s\_min}$ (NO in step S500), the overall processing returns to step S410. Therefore, in this case, search for the capacity deterioration parameter is repeated according to a bisection method.

As described above, according to the fourth embodiment, the processing for narrowing the search range of the positive and negative electrode compositions correspondence offset capacity in accordance with the estimated summed current amount value, the processing for obtaining the candidate value of the positive and negative electrode compositions correspondence offset capacity in the narrowed search range, the processing for obtaining the change characteristics of the open-circuit voltage with respect to the local SOC based on the calculated candidate value, and the processing for estimating the summed amount of the battery current required to shift the open-circuit voltage, based on the change characteristics of the open-circuit voltage are repeated in this order. As a result, positive and negative electrode compositions correspondence offset capacity $\Delta Q_s$ is estimated such that the difference (estimation error) between estimated summed current amount value $S_m$ and summed actual current value $S_i$ is minimized. In other words, in the fourth embodiment, positive and negative electrode compositions correspondence offset capacity $\Delta Q_s$, which is the capacity deterioration parameter, is estimated such that the estimation error (difference between estimated summed current amount value $S_m$ and summed actual current value $S_i$) with respect to a change in open-circuit voltage (change from open-circuit voltage 'CV' to open-circuit voltage OCV2) is minimized (for example, zero). As a result, the optimum capacity deterioration parameter (positive and negative electrode compositions correspondence offset capacity $\Delta Q_s$, positive electrode capacity maintenance rate $k_1$ and negative electrode capacity maintenance rate $k_2$) can be calculated with respect to calculated open-circuit voltages OCV1, OCV2 and measured summed current value $S_i$.

Since the processing for obtaining the change characteristics of the open-circuit voltage with respect to the local SOC based on the candidate value of positive and negative electrode compositions correspondence offset capacity $\Delta Q_s$, that is, a method of reflecting the capacity deterioration parameter in the battery model for estimating the internal state of the battery is similar to the method according to the first embodiment, a description thereof will not be repeated in the following. According to the fourth embodiment, by repeating estimation and update of the capacity deterioration parameter as well as reflection of the capacity deterioration parameter in the battery model, changes in open-circuit voltage due to capacity deterioration can be applied to the battery model as in the first embodiment. Therefore, according to the fourth embodiment, the internal state such as the charging rate and the battery current can be accurately estimated in the secondary battery under capacity deterioration, as in the first embodiment.

Further, according to the fourth embodiment, the current summation estimation error with respect to the estimated SOC value when the capacity deterioration parameter is estimated gradually decreases, and the estimated full charge capacity value of the deteriorated battery per unit plate area, which is indicated by the equation (22), also gradually approaches the full charge capacity value of the actual battery. Therefore, the rate of change in full charge capacity can be calculated by the equation (24), and thus, the deterioration state of the battery can be determined using these values.

Further, according to the fourth embodiment, the following problems that may arise in the method of estimating the capacity according to the first embodiment can be solved. Therefore, the estimation accuracy of the open-circuit voltage and the capacity when the secondary battery is deteriorated can be further enhanced as compared with the estimation accuracy in the first embodiment.

Figure 41:
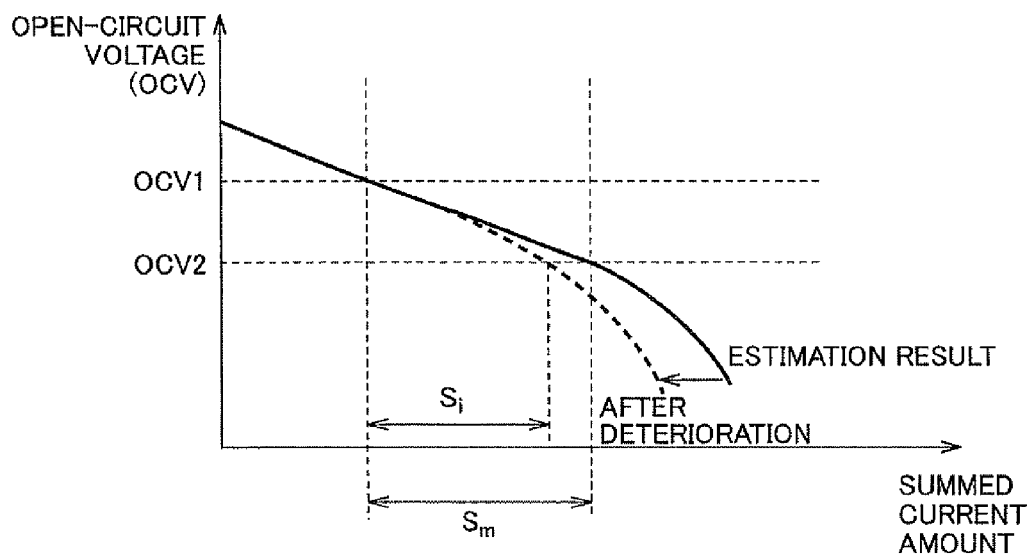
FIG. 41 is a diagram showing calculated open-circuit voltage characteristics and actual open-circuit characteristics of the deteriorated secondary battery, as the open-circuit voltage when the open-circuit voltage changes from OCV1 to OCV2.

First, in the first embodiment, positive and negative electrode compositions correspondence offset capacity $\Delta Q_s$ is corrected such that the summed battery current value estimated by the battery model approaches the summed actual current value. Further, in the first embodiment, the battery model is calculated based on the measured battery voltage. When the calculated open-circuit voltage characteristics are different from the actual open-circuit voltage characteristics of the secondary battery, the battery state estimating unit calculates the estimated battery current value to be slightly larger (or smaller) in order to correct an offset of the open-circuit voltage characteristics. As a result, as shown in FIG. 41, as the characteristics when the open-circuit voltage changes from OCV1 to OCV2, the open-circuit voltage characteristics calculated according to the battery model approach little by little the actual open-circuit voltage characteristics (open-circuit voltage characteristics after the secondary battery is deteriorated).

However, even assuming that the actual open-circuit voltage of the secondary battery remains at OCV2, the open-circuit voltage calculated according to the battery model can only approach OCV2 little by little. Therefore, in the first embodiment, summation of the estimated current and the actual current may continue for a long time.

In the first embodiment, when the estimated SOC value becomes stable (that is, the rate of change in local SOC $\theta_i$ becomes small) and when the estimated SOC value falls within predetermined SOC range A2, summation of the estimated current and the actual current ends. In order to accurately estimate the open-circuit voltage and the capacity, it is preferable to execute summation of the estimated current and the actual current until the open-circuit voltage obtained by the battery model catches up with actual open-circuit voltage OCV2. By executing summation of the actual current for a long time, however, a detection error of current sensor 20 is summed for a long time. Therefore, current summation estimation error $\Delta S_i$ is amplified.

In addition, a current flowing through the battery model constantly to correct an offset of the open-circuit voltage has a small value. Therefore, when summation of the current value ends by determining that the estimated SOC value (or local SOC) has been stabilized, summation of the current value may end with a difference between the calculated open-circuit voltage and the actual open-circuit voltage of the secondary battery being relatively large. This may affect the estimation accuracy of the open-circuit voltage characteristics.

In contrast to this, in the fourth embodiment, by directly measuring the battery voltage, the actual open-circuit voltage at that point in time is calculated. In other words, in the fourth embodiment, the estimated current is not used to estimate the open-circuit voltage characteristics and the capacity. Since the estimated current is not used, determination as to whether or not the open-circuit voltage of the battery model has caught up with the actual open-circuit voltage is not required. In other words, according to the fourth embodiment, it is not necessary to continue summation of the current value until the open-circuit voltage obtained by the battery model catches up with the actual open-circuit voltage, and summation of the current value can end if the secondary battery is relaxed. Therefore, the estimation error caused by summation of the detection error of the current sensor does not occur easily, and thus, the estimation accuracy can be further enhanced as compared with the estimation accuracy in the first embodiment.

In addition, according to the first embodiment, the estimated current is calculated from the measured battery voltage using the battery model equation. Therefore, when estimation of DC resistance $R_a$ is insufficient, a false battery current may be estimated. Since the estimated current is not used to estimate the open-circuit voltage characteristics and the capacity according to the fourth embodiment as described above, interference between estimation of the DC resistance and estimation of the summed battery current value can be avoided. Therefore, since a possibility of estimating a false summed battery current value can be reduced, the open-circuit voltage and the capacity can be estimated more accurately.

Further, according to the fourth embodiment, the range of positive and negative electrode compositions correspondence offset capacity $\Delta Q_s$ when the capacity is deteriorated can be predicted in advance by, for example, an experiment. Therefore, upper limit value $\Delta Q_{s\_h}$ and lower limit value $\Delta Q_{s\_l}$ can be set within the assumed range of positive and negative electrode compositions correspondence offset capacity $\Delta Q_s$. Further, in the range from OCV1 to OCV2, which is the range of the open-circuit voltage for estimating the capacity, the estimated value of the summed current amount calculated from the positive electrode open-circuit potential and the negative electrode open-circuit potential according to the battery model decreases monotonously with respect to a decrease in positive and negative electrode compositions correspondence offset capacity $\Delta Q_s$. Therefore, an optimum value of positive and negative electrode compositions correspondence offset capacity $\Delta Q_s$ can be obtained according to the bisection method. As a result, the capacity can be obtained by one estimation.

It is to be noted that control of shifting the SOC as described in the third embodiment may also be performed in the fourth embodiment. As a result, the capacity deterioration parameter can be estimated on a regular basis. In addition, since the shift width of the SOC can be made sufficiently large, the capacity deterioration parameter can be accurately estimated.

Although in the embodiments already described, the secondary battery has been described as the lithium-ion battery, the state estimating device for a secondary battery according to the present invention can be applied to secondary batteries other than the lithium-ion battery without specifically limiting the type of the load. For example, in the nickel hydride battery, a concentration distribution of protons serving as a reaction-participating material in the active material is calculated from the diffusion equation, and the open-circuit voltage is defined as a function of the protons at the surface of the active material. Thereby, the method of the present invention can likewise be employed. For other kinds of secondary batteries, the device may be configured to estimate a rate of change in predetermined parameter in a similar battery model equation from a parameter value in the initial state, and this structure can achieve similar effects.

It should be understood that the embodiments disclosed herein are illustrative and not imitative in any respect. The scope of the present invention is defined by the terms of the claims, rather than the description above, and is intended to include any modifications within the scope and meaning equivalent to the terms of the claims.

DESCRIPTION OF THE REFERENCE SIGNS 10 secondary battery; 12 negative electrode; 13, 16 current collector; 14 separator; 15 positive electrode; 18 active material; 20 current sensor; 30 voltage sensor; 40 temperature sensor; 50 load; 60 load control device; 100 ECU; 110, 110A battery state estimating unit; 115 battery model unit; 120 parameter characteristic map storing unit; 130, 130A, 130B parameter estimating unit; 150 full charge capacity estimating unit; 160 deterioration determining unit; 170 estimation execution condition determining unit; 175 counter; 180 target value setting unit; 200 capacity deterioration estimating unit; 210 vehicle ECU

The invention claimed is:

1. A state estimating device for a secondary battery (10), comprising:

a detecting unit for detecting a battery voltage, a battery current and a battery temperature of said secondary battery;

a battery state estimating unit configured to successively estimate, based on a detected value of said battery temperature and a detected value of a first state quantity which is one of said battery voltage and said battery current, a charging rate of said secondary battery, an open-circuit voltage of said secondary battery and a second state quantity which is the other of said battery voltage and said battery current, in accordance with a battery model equation; and a parameter estimating unit configured to calculate an estimation error indicating a difference between a detected value and an estimated value of said second state quantity, based on the detected value and the estimated value of said second state quantity, and to estimate a predetermined parameter changing in accordance with a change in a state of said secondary battery, of a parameter group used for said battery model equation, based on said estimation error and one of said charging rate and said open-circuit voltage, wherein said battery state estimating unit corrects a positive electrode open-circuit potential and a negative electrode open-circuit potential by reflecting an estimation result of said predetermined parameter estimated by said parameter estimating unit in said battery model equation, and estimates said open-circuit voltage based on the corrected positive electrode open-circuit potential and the corrected negative electrode open-circuit potential.

2. The state estimating device for a secondary battery according to claim 1, wherein
said parameter estimating unit estimates said predetermined parameter such that a rate of change in said estimation error with respect to said charging rate is minimized.

3. The state estimating device for a secondary battery according to claim 1, wherein
said first state quantity and said second state quantity are said battery voltage and said battery current, respectively, and
said estimation error is a difference between a summation result of the detected value of said battery current and a summation result of the estimated value of said battery current.

4. The state estimating device for a secondary battery according to claim 1, wherein
said first state quantity and said second state quantity are said battery current and said battery voltage, respectively, and
said estimation error is a difference between the detected value of said battery voltage and the estimated value of said battery voltage.

5. The state estimating device for a secondary battery according to claim 1, wherein
said parameter estimating unit estimates said predetermined parameter such that said estimation error with respect to said open-circuit voltage is minimized.

6. The state estimating device for a secondary battery according to claim 5, wherein
said estimation error is a difference between an estimation result of a summed value of said battery current necessary for said open-circuit voltage to change from a first open-circuit voltage to a second open-circuit voltage and a summation result of the detected value of said battery current when said open-circuit voltage changes from said first open-circuit voltage to said second open-circuit voltage.

7. The state estimating device for a secondary battery according to claim 6, wherein
said parameter estimating unit starts summation of the detected value of said battery current when an estimated value of said charging rate is within a predetermined first range and said secondary battery is in a relaxed state, and ends the summation of the detected value of said battery current when the estimated value of said charging rate is within a predetermined second range and said battery is in the relaxed state.

8. The state estimating device for a secondary battery according to claim 5, wherein
said parameter estimating unit estimates said predetermined parameter using a bisection method.

9. The state estimating device for a secondary battery according to claim 1, further comprising
a full charge capacity estimating unit configured to estimate a full charge capacity per unit plate area during a period over which said open-circuit voltage estimated by said battery state estimating unit changes from a first voltage corresponding to a complete discharge state of said secondary battery to a second voltage corresponding to a full charge state of said secondary battery, and to estimate a full charge capacity of said secondary battery by multiplying the estimated full charge capacity by a plate area of said secondary battery.

10. The state estimating device for a secondary battery according to claim 9, further comprising
a deterioration determining unit configured to determine deterioration of a battery capacity of said secondary battery based on a difference between a full charge capacity of said secondary battery when said secondary battery is in an initial state and the estimated full charge capacity of said secondary battery.

11. The state estimating device for a secondary battery according to claim 9, further comprising
a deterioration determining unit configured to determine deterioration of a battery capacity of said secondary battery based on a ratio between a full charge capacity of said secondary battery when said secondary battery is in an initial state and the estimated full charge capacity of said secondary battery.

12. The state estimating device for a secondary battery according to claim 1, wherein
said predetermined parameter includes
a maintenance rate of a single electrode capacity at a positive electrode,
a maintenance rate of a single electrode capacity at a negative electrode, and
a variation amount of a battery capacity of said secondary battery due to a change in a correspondence relationship between an average charging rate in an active material of said positive electrode and an average charging rate in an active material of said negative electrode, from an initial state.

13. The state estimating device for a secondary battery according to claim 12, further comprising
a storing unit configured to store open-circuit potential characteristic data that defines a relationship between a local charging rate at a surface of the active material of said positive electrode and said positive electrode open-circuit potential as well as a relationship between a local charging rate at a surface of the active material of said negative electrode and said negative electrode open-circuit potential, wherein
said battery state estimating unit corrects the local charging rates of said positive electrode and said negative electrode based on said estimation result of said predetermined parameter estimated by said parameter estimating unit, and corrects said positive electrode open-circuit potential and said negative electrode open-circuit potential based on the corrected local charging rates and said open-circuit potential characteristic data.

14. The state estimating device for a secondary battery according to claim 12, wherein
the average charging rate in the active material of said positive electrode is expressed by a ratio of an average concentration of a reaction-participating material in the active material of said positive electrode to a maximum possible concentration of said reaction-participating material in the active material of said positive electrode, and
the average charging rate in the active material of said negative electrode is expressed by a ratio of an average concentration of said reaction-participating material in the active material of said negative electrode to a maximum possible concentration of said reaction-participating material in the active material of said negative electrode.

15. The state estimating device for a secondary battery according to claim 1, wherein
said battery state estimating unit estimates said open-circuit voltage based on a potential difference between said positive electrode open-circuit potential and said negative electrode open-circuit potential.

16. The state estimating device for a secondary battery according to claim 1, wherein
said battery model equation is an equation representing a battery model per unit plate area.

17. The state estimating device for a secondary battery according to claim 1, wherein
said secondary battery is charged and discharged by a charge/discharge control device controlling an amount of charge/discharge of said secondary battery based on a present value of said charging rate and a target value of said charging rate, such that said charging rate approaches said target value,
said state estimating device further comprising:
an estimation execution determining unit configured to determine whether or not an estimation execution condition for executing estimation of the state of said secondary battery by said battery state estimating unit is satisfied, and to cause said battery state estimating unit to start the estimation of the state of said secondary battery when said estimation execution determining unit determines that said estimation execution condition is satisfied; and
a target charging rate setting unit configured to set said target value when said estimation execution determining unit determines that said estimation execution condition is satisfied.

18. The state estimating device for a secondary battery according to claim 17, wherein
said estimation execution determining unit determines that said estimation execution condition is satisfied, if a time that has elapsed since the estimation of the state of said secondary battery by said battery state estimating unit ended is equal to or longer than a predetermined time period.

19. The state estimating device for a secondary battery according to claim 17, wherein
said charge/discharge control device includes an electric motor for causing a vehicle to travel, and
said estimation execution determining unit determines that said estimation execution condition is satisfied, if a traveling distance of said vehicle after the estimation of the state of said secondary battery by said battery state estimating unit ended is equal to or longer than a predetermined distance.

20. The state estimating device for a secondary battery according to claim 17, wherein
said estimation execution determining unit obtains said charging rate and said estimation error from said battery state estimating unit, and determines that said estimation execution condition is satisfied, if said estimation error when said charging rate changes by a predetermined amount is equal to or larger than a predetermined value.

21. The state estimating device for a secondary battery according to claim 17, wherein
said target charging rate setting unit sets said target value such that said secondary battery is discharged by said charge/discharge control device.

22. The state estimating device for a secondary battery according to claim 17, wherein
if a full charge capacity maintenance rate, which is a ratio of a present full charge capacity to a full charge capacity when said secondary battery is in an initial state, is equal to or smaller than a predetermined value, said target charging rate setting unit sets said target value such that a change width of said charging rate is greater than that in a case where said full charge capacity maintenance rate is larger than said predetermined value.

23. The state estimating device for a secondary battery according to claim 17, wherein
said estimation execution determining unit discontinues the estimation of the state of said secondary battery by said battery state estimating unit when charge/discharge electric power of said secondary battery exceeds a reference value.

* * * * *